United States Patent
Kim et al.

(10) Patent No.: US 10,818,652 B2
(45) Date of Patent: Oct. 27, 2020

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Yongseok Kim, Seoul (KR); Daeho Lee, Seoul (KR); Junhan Lee, Seoul (KR); Youngmin Kim, Asan-si (KR); Haeil Park, Seoul (KR)

(73) Assignee: Samsung Display Co., Ltd. (KR)

( * ) Notice: Subject to any disclaimer, the term of this patent is extended or adjusted under 35 U.S.C. 154(b) by 119 days.

(21) Appl. No.: 15/648,881

(22) Filed: Jul. 13, 2017

(65) Prior Publication Data
US 2018/0019238 A1    Jan. 18, 2018

(30) Foreign Application Priority Data

Jul. 15, 2016   (KR) .................. 10-2016-0090175
Oct. 28, 2016   (KR) .................. 10-2016-0142119

(51) Int. Cl.
*H01L 27/01* (2006.01)
*G02F 1/1335* (2006.01)
(Continued)

(52) U.S. Cl.
CPC ...... *H01L 27/016* (2013.01); *G02F 1/133528* (2013.01); *G02F 1/133536* (2013.01);
(Continued)

(58) Field of Classification Search
CPC ............... H01L 27/016; H01L 51/0002; H01L 51/0512; H01L 27/14621; H01L 51/5293;
(Continued)

(56) References Cited

U.S. PATENT DOCUMENTS 8,947,619 B2    2/2015  Li et al.
2005/0243447 A1*  11/2005  Lee .................. B82Y 30/00
                                                        359/865
(Continued)

FOREIGN PATENT DOCUMENTS

KR    10-2014-0074495 A    6/2014
KR    10-2015-0139132 A    12/2015

OTHER PUBLICATIONS

European Search Report corresponding to EP Application No. EP 17181542.6, dated Nov. 29, 2017, 14 pages.

*Primary Examiner* — Charles S Chang
(74) *Attorney, Agent, or Firm* — Innovation Counsel LLP

(57) ABSTRACT

A display device includes: a display substrate; an opposing substrate opposing the display substrate; and a light amount control layer disposed between the display substrate and the opposing substrate. The display substrate includes: a first substrate; a thin film transistor o disposed n the first substrate; and a pixel electrode connected to the thin film transistor. The opposing substrate includes: a second substrate; a color conversion layer disposed on the second substrate; and a first polarizer disposed on the color conversion layer. The first polarizer includes: a base substrate; and a linear polarizer disposed on one surface of the base substrate. The first polarizer opposes the pixel electrode. The one surface of the base substrate on which the linear polarizer is disposed has a flatness of about 60 nm or less.

37 Claims, 56 Drawing Sheets

(51) Int. Cl.
  *G02F 1/13357* (2006.01)
  *H01L 51/00* (2006.01)
  *H01L 51/05* (2006.01)
  *G02F 1/13363* (2006.01)
  *H01L 27/146* (2006.01)
  *H01L 51/52* (2006.01)

(52) U.S. Cl.
  CPC .... *G02F 1/133617* (2013.01); *H01L 51/0002* (2013.01); *H01L 51/0512* (2013.01); *G02F 1/13363* (2013.01); *G02F 1/133512* (2013.01); *G02F 1/133553* (2013.01); *G02F 2001/133548* (2013.01); *G02F 2001/133638* (2013.01); *G02F 2202/36* (2013.01); *G02F 2413/01* (2013.01); *G02F 2413/02* (2013.01); *G02F 2413/03* (2013.01); *G02F 2413/05* (2013.01); *H01L 27/14621* (2013.01); *H01L 51/5293* (2013.01)

(58) Field of Classification Search
  CPC ......... G02F 1/133528; G02F 1/133536; G02F 1/133617; G02F 1/133553; G02F 2413/02; G02F 2413/03; G02F 2413/05; G02F 1/13363; G02F 2413/01; G02F 2001/133638; G02F 1/133512; G02F 2001/133548; G02F 2202/36
  USPC .................................................. 349/96–98
  See application file for complete search history.

(56) References Cited

U.S. PATENT DOCUMENTS

| | | | |
|---|---|---|---|
| 2007/0200976 A1* | 8/2007 | Kawamoto | G02B 5/3016 349/96 |
| 2008/0218665 A1* | 9/2008 | Zhang | G02B 5/3058 349/96 |
| 2010/0091219 A1 | 4/2010 | Rho et al. | |
| 2010/0283943 A1 | 11/2010 | Kimura et al. | |
| 2012/0202010 A1* | 8/2012 | Uchida | B32B 17/06 428/157 |
| 2012/0231217 A1* | 9/2012 | Sasada | G02B 1/04 428/141 |
| 2014/0090779 A1 | 4/2014 | Hada et al. | |
| 2014/0160408 A1 | 6/2014 | Cho et al. | |
| 2015/0042913 A1* | 2/2015 | You | H01L 27/1214 349/42 |
| 2015/0348481 A1 | 12/2015 | Hong et al. | |
| 2016/0041430 A1 | 2/2016 | Lee et al. | |
| 2016/0091757 A1* | 3/2016 | Miki | G02F 1/133617 349/42 |
| 2016/0155985 A1* | 6/2016 | Son | H01L 51/5246 257/40 |
| 2017/0059928 A1 | 3/2017 | Kim et al. | |

\* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Applications No. 10-2016-0090175, filed on Jul. 15, 2016, and No. 10-2016-0142119, filed on Oct. 28, 2016, in the Korean Intellectual Property Office (KIPO), the disclosures of which are incorporated by reference herein in their entirety.

1. Technical Field

Exemplary embodiments of the present inventive concept relate to a display device and a method of manufacturing the display device, and more particularly, to a display device including a color conversion layer and to a method of manufacturing the display device.

2. Discussion of Related Art

Liquid crystal display ("LCD") devices are a type of flat panel display (FPD) devices, which have found wide recent applications. The LCD device typically includes two substrates respectively including two electrodes formed thereon and a liquid crystal layer interposed therebetween.

Upon applying voltage to the two electrodes in the LCD device, liquid crystal molecules of the liquid crystal layer are rearranged such that an amount of transmitted light may be adjusted. Such an LCD device typically includes a color filter to represent colors.

In recent times, display devices in which the color filter used in conventional LCD devices is substituted with a fluorescent pattern are being researched. Display devices including such a fluorescent pattern is also referred to as a photo-luminescent display ("PLD") device. The PLD device includes a polarizer between a color conversion layer and a light amount control layer.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present inventive concept may be directed to a display device including a polarizer having a small thickness and excellent flatness and to a method of manufacturing the display device.

According to an exemplary embodiment of the present inventive concept, a display device includes: a display substrate; an opposing substrate opposing the display substrate; and a light amount control layer disposed between the display substrate and the opposing substrate. The display substrate includes: a first substrate; a thin film transistor disposed on the first substrate; and a pixel electrode connected to the thin film transistor. The opposing substrate includes: a second substrate; a color conversion layer disposed on the second substrate; and a first polarizer disposed on the color conversion layer. The first polarizer includes: a base substrate; and a linear polarizer disposed on one surface of the base substrate. The first polarizer opposes the pixel electrode. The one surface of the base substrate on which the linear polarizer is disposed has a flatness of about 60 nm or less.

The base substrate may have a thickness ranging from about 0.8 μm to about 50 μm.

The base substrate may be a plastic substrate.

The display device may further include a dichroic reflection layer disposed between the color conversion layer and the base substrate.

The display device may further include an adhesion layer disposed between the second substrate and the color conversion layer.

The display device may further include an adhesion layer disposed between the color conversion layer and the first polarizer.

The linear polarizer may be a wire grid polarizer (WGP).

The linear polarizer may include polyvinyl alcohol (PVA).

The color conversion layer may include a fluorescent element.

The color conversion layer may include quantum dots.

The color conversion layer may include: a red color conversion portion including a red fluorescent element; and a green color conversion portion including a green fluorescent element.

The display device may further include a yellow color filter on the red color conversion portion and the green color conversion portion.

The display device may further include a passivation layer disposed between the base substrate and the linear polarizer.

The display device may further include a second polarizer disposed on the display substrate.

The light amount control layer may be a liquid crystal layer.

The opposing substrate may further include a light blocking layer.

The light blocking layer may be disposed between the base substrate and the second substrate.

The light blocking layer may be disposed between the base substrate and the light amount control layer.

According to an exemplary embodiment of the present inventive concept, a method of manufacturing a display device includes: forming a display substrate; forming a first polarizer; and disposing the first polarizer and the display substrate to oppose each other. The forming a display substrate includes: forming a thin film transistor on a first substrate; and forming a pixel electrode on the first substrate, the pixel electrode connected to the thin film transistor. The forming a first polarizer includes: forming a base substrate on a carrier substrate; and forming a first linear polarizer on the base substrate. The disposing the first polarizer and the display substrate to oppose each other includes removing the carrier substrate from the base substrate.

The base substrate may be a plastic substrate.

The base substrate may have a thickness ranging from about 0.8 μm to about 50 μm.

The method may further include disposing a color conversion layer on the first polarizer before disposing the first polarizer and the display substrate to oppose each other.

The method may further include disposing a color conversion layer on the first polarizer after removing the carrier substrate.

According to an exemplary embodiment of the present inventive concept, a method of manufacturing a display device includes: forming a display substrate; forming a first polarizer on a carrier substrate; forming a color conversion layer on the first polarizer; disposing a second substrate on the color conversion layer; removing the carrier substrate from the first polarizer; forming a common electrode on the first polarizer to form an opposing substrate; and disposing the opposing substrate to oppose the display substrate. The forming a first polarizer includes: forming a base substrate on the carrier substrate; and forming a linear polarizer on the base substrate.

The base substrate may be a plastic substrate.

The base substrate may have a thickness ranging from about 0.8 µm to about 50 µm.

The forming a display substrate may include: disposing a thin film transistor on a first substrate; and forming a pixel electrode on the first substrate, the pixel electrode connected to the thin film transistor.

The method may further include disposing a dichroic reflection layer on the first polarizer before forming the color conversion layer on the first polarizer.

The method may further include disposing a first passivation layer on the first polarizer before forming the dichroic reflection layer on the first polarizer.

The method may further include disposing a dichroic reflection layer on the base substrate before disposing the linear polarizer on the base substrate.

The disposing a second substrate on the color conversion layer may further include disposing an adhesion layer between the color conversion layer and the second substrate.

The forming a the color conversion layer may include forming a red color conversion portion including a red fluorescent element and a green color conversion portion including a green fluorescent element on the first polarizer.

The method may further include forming a yellow color filter on the red color conversion portion and the green color conversion portion.

The forming a color conversion layer may further include forming a light blocking layer.

According to an exemplary embodiment of the present inventive concept, a method of manufacturing a display device includes: forming a display substrate; forming a first polarizer on a carrier substrate; forming a common electrode on the first polarizer; disposing the common electrode to oppose the display substrate; removing the carrier substrate from the first polarizer; and forming a color conversion layer on a second substrate and disposing the color conversion layer on the first polarizer. The forming a first polarizer includes: forming a base substrate on the carrier substrate; and forming a linear polarizer on the base substrate.

The method may further include disposing a compensation film on the first polarizer before forming the common electrode on the first polarizer.

The disposing a color conversion layer on the first polarizer may further include disposing an adhesion layer between the color conversion layer and the first polarizer.

The forming a color conversion layer may further include forming a light blocking layer on the second substrate.

The method may further include forming a dichroic reflection layer on the color conversion layer.

According to an exemplary embodiment of the present inventive concept, a method of manufacturing a display device includes: forming a display substrate; forming a base substrate on a carrier substrate; forming a common electrode on the base substrate; disposing the common electrode to oppose the display substrate; removing the carrier substrate from the base substrate; disposing a linear polarizer on the base substrate, exposed by removing the carrier substrate, to form a first polarizer; and forming a color conversion layer on a second substrate and disposing, on the first polarizer, the color conversion layer formed on the second substrate.

According to an exemplary embodiment of the present inventive concept, a display device includes: a display substrate; an opposing substrate opposing the display substrate; and a liquid crystal layer disposed between the display substrate and the opposing substrate. The display substrate includes: a first substrate; a thin film transistor disposed on the first substrate; and a first electrode connected to the thin film transistor. The opposing substrate includes: a second substrate; a color conversion layer disposed on the second substrate; a first polarizer disposed on the color conversion layer; and a second electrode disposed on the first polarizer. The color conversion layer includes: a color conversion portion; and a buffer layer overlapping the color conversion portion.

The color conversion portion may include: a red color conversion portion; and a green color conversion portion.

The color conversion portion may include quantum dots.

The color conversion portion may further include a transmissive portion.

The display device may further include a light blocking layer disposed between the red color conversion portion and the green color conversion portion in a plan view.

The light blocking layer may be disposed between the second substrate and the buffer layer.

The light blocking layer may be disposed between the buffer layer and the first polarizer.

The display device may further include a planarization layer disposed between the second electrode and the first polarizer.

The light blocking layer may be disposed between the first polarizer and the planarization layer.

The display device may further include a yellow color filter between the second substrate and the buffer layer.

The yellow color filter may overlap the red color conversion portion and the green color conversion portion.

The color conversion portion may be disposed between the second substrate and the buffer layer.

The color conversion portion may be disposed between the buffer layer and the first polarizer.

The display device may further include an adhesion layer disposed between the buffer layer and the first polarizer.

According to an exemplary embodiment of the present inventive concept, a display device includes: a display substrate; an opposing substrate opposing the display substrate; and a liquid crystal layer disposed between the display substrate and the opposing substrate. The display substrate includes: a first substrate; a thin film transistor on the first substrate; and a first electrode connected to the thin film transistor. The opposing substrate includes: a second substrate; a color conversion layer disposed on the second substrate; a first polarizer disposed on the color conversion layer; and a second electrode disposed on the first polarizer. The opposing substrate includes at least one planarization layer disposed between the second substrate and the color conversion layer and/or between the first polarizer and the second electrode.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1:
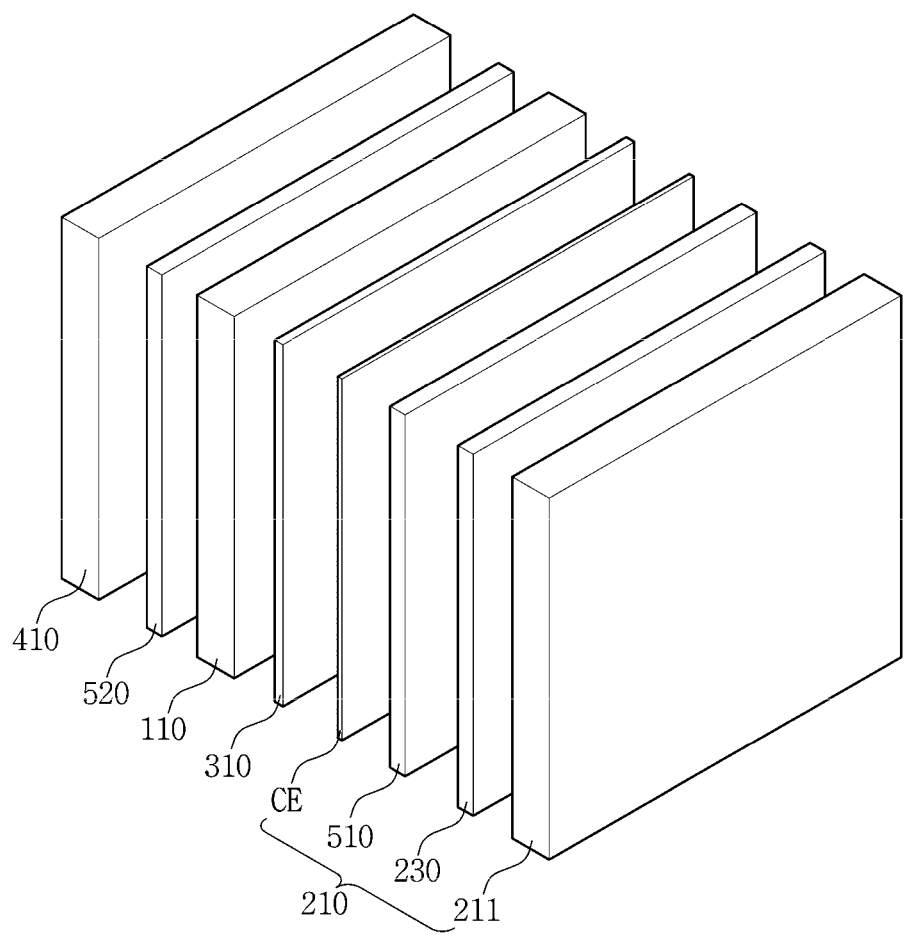
FIG. 1 is an exploded perspective view illustrating a display device according to a first exemplary embodiment.

Advantages and features of the inventive concept and methods for achieving them will be made clear from exemplary embodiments described below in detail with reference to the accompanying drawings. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. The inventive concept is merely defined by the scope of the claims. Therefore, well-known constituent elements, operations and techniques are not described in detail in the exemplary embodiments in order to prevent the inventive concept from being obscurely interpreted. Like reference numerals refer to like elements throughout the specification.

In the drawings, certain elements or shapes may be illustrated in an enlarged manner or in a simplified manner to better illustrate the inventive concept, and other elements present in an actual product may also be omitted. Thus, the drawings are intended to facilitate the understanding of the present inventive concept.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first exemplary embodiment will be described in detail with reference to FIGS. 1, 2, and 3.

FIG. 1 is an exploded perspective view illustrating a display device according to the first exemplary embodiment.

Referring to FIG. 1, the display device according to the first exemplary embodiment includes a backlight unit 410, a second polarizer 520, a display substrate 110, a light amount control layer 310, and an opposing substrate 210 that are sequentially disposed. The opposing substrate 210 includes a common electrode CE, a first polarizer 510, a color conversion layer 230, and a second substrate 211.

The backlight unit 410 may emit ultraviolet light, rear ultraviolet light, or the like. For example, the backlight unit 410 may emit white light or blue light to the display substrate 110. Hereinbelow, the first exemplary embodiment will be described with respect to a display device including the backlight unit 410 emitting blue light.

Figure 2:
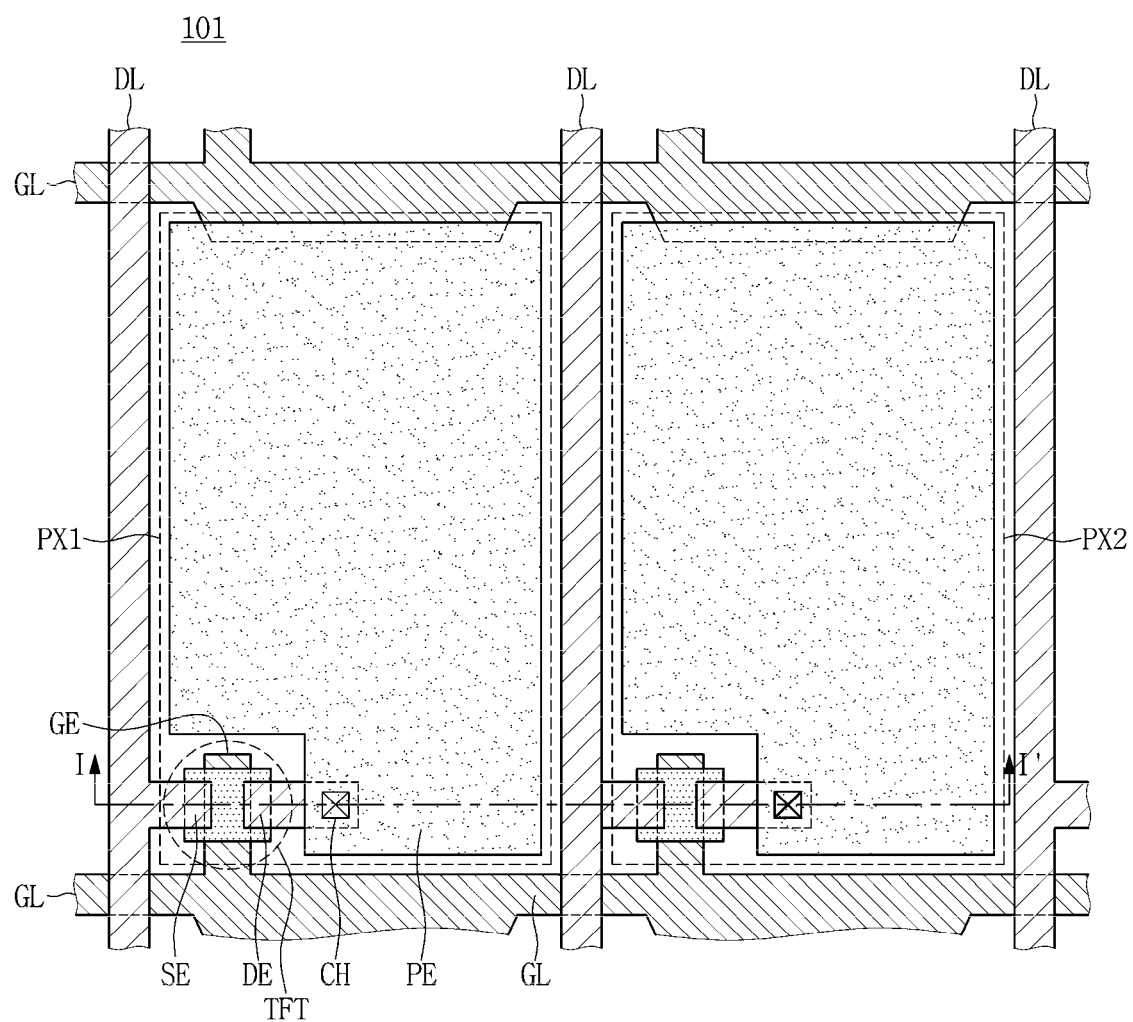
FIG. 2 is a plan view illustrating a pixel of the display device of FIG. 1.
Figure 3:
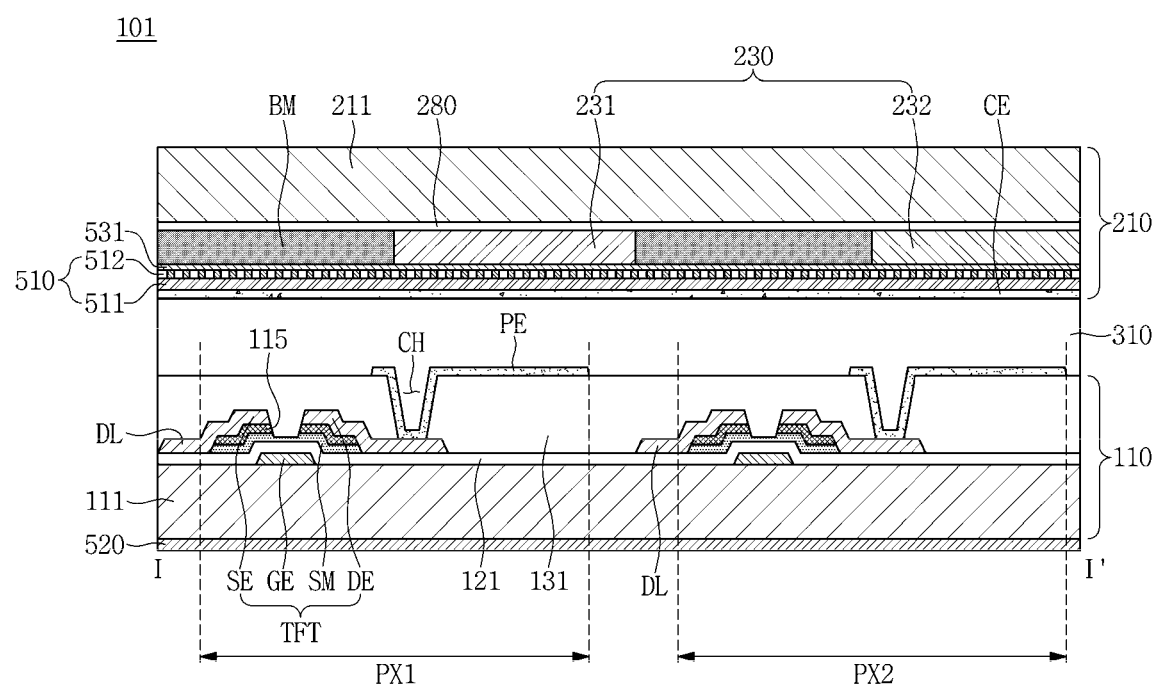
FIG. 3 is a cross-sectional view taken along line I-I' of FIG. 2.

FIG. 2 is a plan view illustrating a pixel of the display device of FIG. 1, and FIG. 3 is a cross-sectional view taken along line I-I' of FIG. 2.

As illustrated in FIGS. 2 and 3, the display device 101 according to the first exemplary embodiment includes the display substrate 110, the opposing substrate 210 opposing the display substrate 110, and the light amount control layer 310 disposed between the display substrate 110 and the opposing substrate 210.

Any light amount control layer that may control transmittance of light provided from the backlight unit 410 may be used as the light amount control layer 310. For example, the light amount control layer 310 may be one of a liquid crystal layer, an electro-wetting layer and an electrophoretic layer. Hereinbelow, the light amount control layer 310 refers to a liquid crystal layer, by way of example. In such an exemplary embodiment, the display device 101 according to the first exemplary embodiment may be referred to as a liquid crystal display ("LCD") device.

The display substrate 110 includes a first substrate 111, a thin film transistor TFT, a pixel electrode PE, a gate insulating layer 121, and a protection layer 131. The thin film transistor TFT includes a semiconductor layer SM, an ohmic contact layer 115, a gate electrode GE, a source electrode SE, and a drain electrode DE.

The first substrate 111 includes transparent materials such as glass or plastic.

A plurality of gate lines GL and the gate electrode GE are disposed on the first substrate 111. The gate line GL and the gate electrode GE are unitary. The gate line GL and the gate electrode GE are formed of a same material and are formed in one piece. The gate line GL and the gate electrode GE may include or be formed of one of: aluminum (Al) or alloys thereof, silver (Ag) or alloys thereof, copper (Cu) or alloys thereof, and/or molybdenum (Mo) or alloys thereof, chromium (Cr), tantalum (Ta), and titanium (Ti). At least one of the gate line GL and the gate electrode GE may have a multilayer structure including at least two conductive layers that have different physical properties.

The gate insulating layer 121 is disposed over an entire surface of the first substrate 111 including the gate line GL and the gate electrode GE. The gate insulating layer 121 may include silicon nitride ($SiN_x$) or silicon oxide ($SiO_x$). In addition, the gate insulating layer 121 may have a multilayer structure including at least two insulating layers that have different physical properties.

The semiconductor layer SM is disposed on the gate insulating layer 121. In such an exemplary embodiment, the semiconductor layer SM overlaps the gate electrode GE which is disposed below the gate insulating layer 121. The semiconductor layer SM may include or be formed of amorphous silicon, polycrystalline silicon, or the like. The semiconductor layer SM may include an oxide semiconductor material.

The ohmic contact layer 115 is disposed on the semiconductor layer SM. For example, the ohmic contact layer 115 is disposed on a portion of the semiconductor layer SM aside from a channel area of the semiconductor layer SM.

In addition, a plurality of data lines DL are disposed on the gate insulating layer 121. The data line DL intersects the gate line GL. The source electrode SE and the data line DL are unitary. The source electrode SE and the data line DL are formed of a same material and are formed in one piece. The source electrode SE is disposed on the ohmic contact layer 115. The drain electrode DE is disposed on the ohmic contact layer 115 and is connected to the pixel electrode PE.

At least one of the data line DL, the source electrode SE, and the drain electrode DE may include or be formed of a refractory metal, such as molybdenum, chromium, tantalum, and titanium, or an alloy thereof, and may have a multilayer structure including a refractory metal layer and a low-resistance conductive layer.

The protection layer 131 is disposed over an entire surface of the first substrate 111 including the semiconductor layer SM, the data line DL, the source electrode SE, and the drain electrode DE. The protection layer 131 may include an insulating inorganic material such as silicon nitride (SiNx) or silicon oxide (SiOx). In an alternative exemplary embodiment, the protection layer 131 may include an organic layer. In another alternative exemplary embodiment, the protection layer 131 may have a double-layer structure including a lower inorganic layer and an upper organic layer.

The pixel electrode PE is disposed on the protection layer 131. In such an exemplary embodiment, the pixel electrode PE is connected to the drain electrode DE through a contact hole CH of the protection layer 131. The pixel electrode PE may include a transparent conductive material such as indium tin oxide (ITO) or indium zinc oxide (IZO).

The second polarizer 520 is disposed on the display substrate 110. For example, the second polarizer 520 may be disposed on a rear surface of the first substrate 110.

The opposing substrate 210 includes the second substrate 211, the color conversion layer 230, and the first polarizer 510. According to the first exemplary embodiment, the opposing substrate 210 may further include a light blocking layer BM and a common electrode CE.

The second substrate 211 includes transparent materials such as glass or plastic.

The light blocking layer BM is disposed on the second substrate 211. The light blocking layer BM has a plurality of apertures. The aperture is defined corresponding to each of pixel electrodes PE in first and second pixels PX1 and PX2. The light blocking layer BM blocks light in a portion other than the apertures. For example, the light blocking layer BM is disposed on the thin film transistors TFT, the gate line GL, and the data line DL, thus blocking light transmitted through the thin film transistors TFT, the gate line GL, and the data line DL from being emitted outwards.

The color conversion layer 230 is disposed on regions corresponding to the first and second pixels PX1 and PX2. For example, the color conversion layer 230 may be disposed in the aperture of the light blocking layer BM corresponding to the pixel electrode PE. In such an exemplary embodiment, an edge portion of the color conversion layer 230 may be disposed on the light blocking layer BM to overlap the light blocking layer BM.

The color conversion layer 230 converts a wavelength of light incident from the backlight unit 410 and emits light having a predetermined wavelength.

The color conversion layer 230 includes a plurality of color conversion portions 231 and 232. The color conversion portions 231 and 232 include a fluorescent element (e.g., a phosphor) that absorbs light having a wavelength other than the predetermined wavelength and emits light having the predetermined wavelength. The color conversion portions 231 and 232 may be separated by the light blocking layer BM. The light blocking layer BM may be omitted.

For example, the color conversion portions 231 and 232 include a first color conversion portion 231 and a second color conversion portion 232. For example, the first color conversion portion 231 may correspond to a red pixel, and the second color conversion portion 232 may correspond to a green pixel. Although not illustrated, the color conversion layer 230 may further include a third color conversion portion. The third color conversion portion may correspond to a blue pixel. The first color conversion portion 231 may include a red phosphor, the second color conversion portion 232 may include a green phosphor, and the third color conversion portion (not illustrated) may include a blue phosphor.

In addition, the color conversion portion 231 may include a transmissive portion. A light passing through the transmissive portion does not experience wavelength change. For example, when the backlight unit 410 emits blue light to the display substrate 110, the transmissive portion may correspond to the blue pixel.

The color conversion layer 230 may include a resin including a fluorescent element. The color conversion layer 230 may further include a reflective element. The fluorescent element is a material that emits fluorescent light upon irradiated with light, radiant light, or the like, and emits light having an intrinsic color of the corresponding fluorescent element. In addition, the fluorescent element emits light in all directions regardless of a propagation direction of the light emitted thereto. The reflective element may include $TiO_2$, for example. The reflective element may have a particle shape, and may be dispersed in the resin including the fluorescent element.

An example of the fluorescent element included in the color conversion layer 230 may include quantum dots. The quantum dot absorbs light incident to the quantum dot and emits light having a different wavelength from a wavelength of the incident light. That is, the quantum dot is a wavelength conversion particle that may convert a wavelength of light incident to the quantum dot. A wavelength range of light emitted from a quantum dot may vary based on the size of the quantum dot. For example, by adjusting a diameter of the quantum dot, the quantum dot may emit a light of a desired color.

The quantum dot has a high extinction coefficient and a high quantum yield, as compared to those of other fluorescent dyes, thus emitting significantly intense fluorescent light. In particular, the quantum dot may absorb light having a short wavelength and then may emit light having a longer wavelength.

The quantum dot may have a structure including a core nanocrystal and a shell nanocrystal surrounding the core nanocrystal. In addition, the quantum dot may include an organic ligand bonded to the shell nanocrystal and may include an organic coating layer surrounding the shell nanocrystal.

The shell nanocrystal may have two or more layers. The shell nanocrystal is disposed on a surface of the core nanocrystal.

The quantum dot may include at least one substance of group II compound semiconductors, group III compound semiconductors, group V compound semiconductors, and group VI compound semiconductors. For example, the core nanocrystal forming the quantum dot may include at least one of: PbSe, InAs, PbS, CdSe, InGaP, CdTe, CdS, ZnSe, ZnTe, ZnS, HgTe or HgS. Further, the shell nanocrystal may include at least one of: CuZnS, CdSe, CdTe, CdS, ZnSe, ZnTe, ZnS, HgTe and HgS.

For example, in a case where a core nanocrystal includes CdSe, blue light may be emitted when a diameter of a quantum dot is in a range of about 1 nm to about 3 nm, green light may be emitted when the diameter of the quantum dot is in a range of about 3 nm to about 5 nm, and red light may be emitted when the diameter of the quantum dot is in a range of about 7 nm to about 10 nm.

The quantum dot may be formed by a wet-chemical method. The wet-chemical method refers to a method whereby a precursor material is put into an organic solvent such that a particle may grow.

The color conversion layer 230 may include a quantum rod in lieu of the quantum dot particle.

With respect to the second substrate 211, the first polarizer 510 is disposed on the color conversion layer 230. The first polarizer 510 is disposed adjacent to the light amount control layer 310 than the color conversion layer 230. That is, referring to FIG. 3, the first polarizer 510 is disposed below the color conversion layer 230. A transmission axis of the first polarizer 510 and a transmission axis of the second polarizer 520 may be orthogonal to each other, and one of the transmission axes is parallel to the gate line GL.

With respect to the second substrate 211, the common electrode CE is disposed on the first polarizer 510. For example, the common electrode CE may be disposed over an entire surface of the second substrate 211 including the first polarizer 510. The common electrode CE may include a transparent conductive material such as ITO or IZO.

The common electrode CE, along with the pixel electrodes PE, applies an electric field over the light amount control layer 310. Accordingly, an electric field is generated over a liquid crystal layer between the common electrode CE and the pixel electrode PE.

Figure 4A:
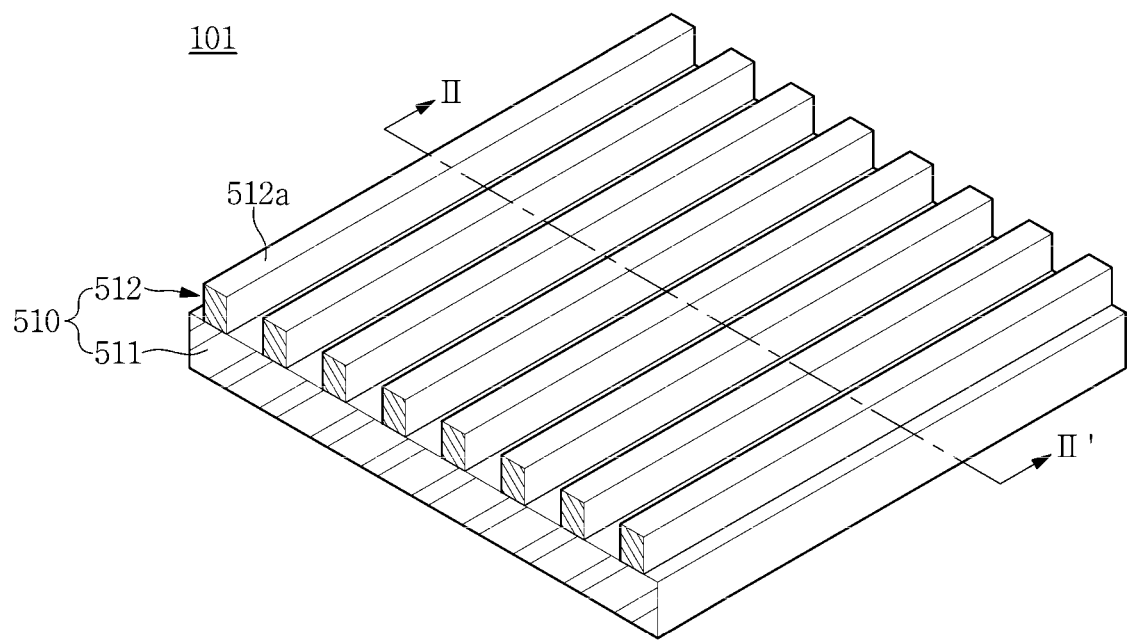
FIG. 4A is a perspective view illustrating a first polarizer according to the first exemplary embodiment.
Figure 4B:
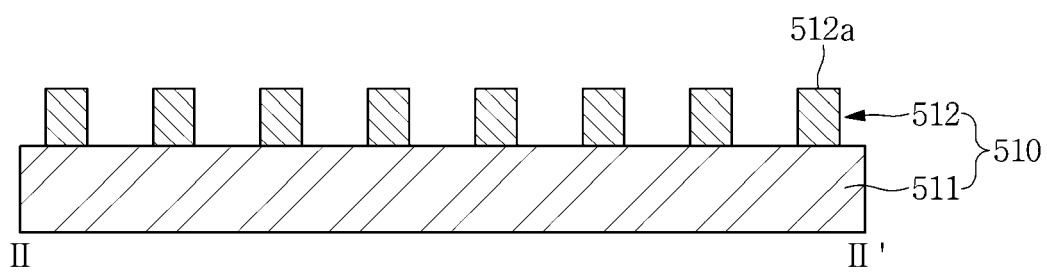
FIG. 4B is a cross-sectional view taken along line of FIG. 4A.

FIG. 4A is a perspective view illustrating the first polarizer 510 of the display device 101 according to the first exemplary embodiment and FIG. 4B is a cross-sectional view taken along line of FIG. 4A.

The first polarizer 510 includes a base substrate 511 and a linear polarizer 512 on the base substrate 511.

The base substrate 511 may include a material having excellent transmittance, thermal resistance, and chemical resistance. For example, the base substrate 511 may include a plastic substrate including one of polyamide, polyimide, polyethylene naphthalate, polyethylene terephthalate and polyacryl which have excellent light transmittance.

Although not illustrated, a buffer layer may be disposed on the base substrate 511. The buffer layer is configured to prevent permeation of undesirable materials or unnecessary substances into the linear polarizer 512 and to planarize a surface therebelow. The buffer layer may include at least one layer selected from various organic layers and inorganic layers. For example, the buffer layer may include one inorganic layer or one organic layer, or may have a structure in which an organic layer and an inorganic layer are stacked. However, the buffer may be omitted.

The linear polarizer 512 includes a plurality of linear patterns 512a disposed the base substrate 511 and parallel to each other. The linear patterns 512a each have a straight-line shape extending in one direction, each have a predetermined width, and are spaced apart from another at a predetermined distance.

The linear pattern 512a may include a metal. A linear polarizer 512 including a plurality of linear patterns 512a that include metal may be referred to as a wire grid polarizer ("WGP"). The linear polarizer 512 according to the first exemplary embodiment is a WGP.

The linear pattern 512a may include at least one of: aluminum (Al), gold (Au), silver (Ag), copper (Cu), chromium (Cr), iron (Fe), and/or nickel (Ni).

The linear polarizer 512 may be formed by an imprinting method using a mold, and a photolithography method, but the first exemplary embodiment is not limited thereto. The linear polarizer 512 may be formed using a block copolymer.

Because the linear pattern 512a is significantly thin and uniform, the linear polarizer 512 may have excellent polarization efficiency when disposed on the base substrate 511 having excellent flatness.

Figure 5A:
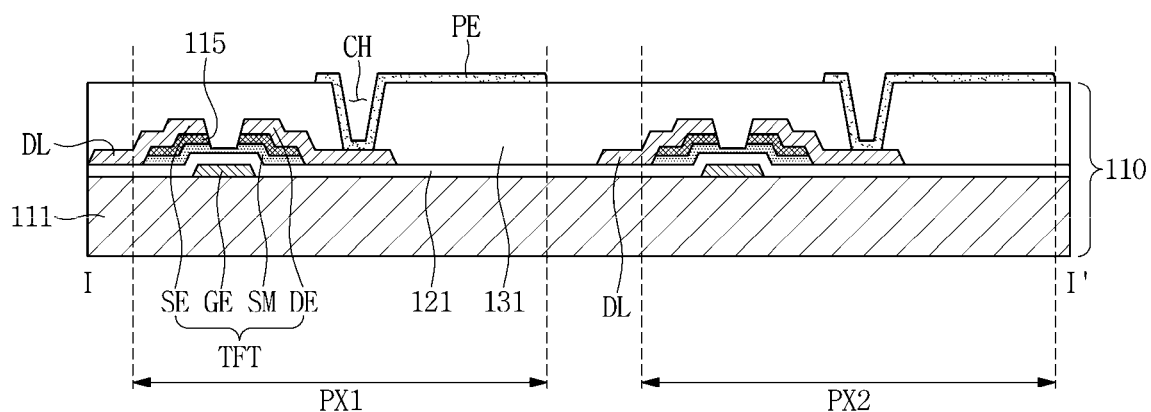
FIGS. 5A, 5B, 5C, 5D, 5E, 5F, and 5G are cross-sectional views illustrating a process of manufacturing the display device according to the first exemplary embodiment.
Figure 5B:
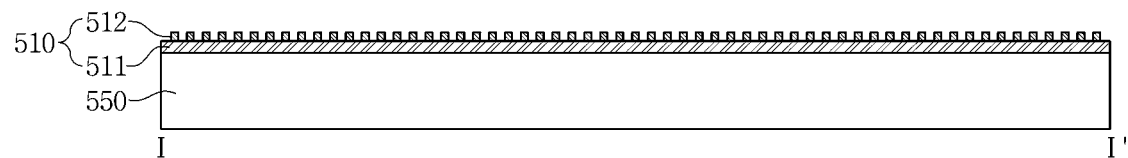

According to the first exemplary embodiment, the linear polarizer 512 may be formed on a carrier substrate 550 (refer to FIG. 5B). In such an exemplary embodiment, as the base substrate 511 is supported by the carrier substrate 550, the base substrate 511 may have excellent flatness.

According to the first exemplary embodiment, the base substrate 511 may have a flatness of about 60 nm or less. That is, a height of a non-uniform portion of the base substrate 511 may be about 60 nm or less. For example, the base substrate 511 may have a flatness ranging from about 10 nm to about 60 nm. Accordingly, the first polarizer 510 according to the first exemplary embodiment may have excellent polarization efficiency.

In addition, according to the first exemplary embodiment, as the carrier substrate 550 supports the base substrate 511 in a process of manufacturing the linear polarizer 512, the linear polarizer 512 may be disposed on the base substrate 511 that has a relatively small thickness.

For example, according to the first exemplary embodiment, the base substrate 511 may have a thickness ranging from about 0.8 µm to about 50 µm.

As such, because the base substrate 511 has a small thickness, the pixel electrode PE and the color conversion layer 230 may maintain a small distance therebetween. Accordingly, color mixture that may occur due to a big distance between the pixel electrode PE and the color conversion layer 230 may be prevented. Accordingly, the display device 101 according to the first exemplary embodiment may have excellent display properties.

According to the first exemplary embodiment, a first passivation layer 531 may be disposed on the first polarizer 510, the color conversion layer 230 may then be formed on the first passivation layer 531, and then the second substrate 211 may be attached to the color conversion layer 230. In such an exemplary embodiment, an adhesion layer 280 may be disposed between the color conversion layer 230 and the second substrate 211. The adhesion layer 280 may be an optically clear adhesive (OCA) having light transmittance.

Hereinafter, a method of manufacturing the display device 101 according to the first exemplary embodiment will be described with reference to FIGS. 5A, 5B, 5C, 5D, 5E, 5F, and 5G. FIGS. 5A, 5B, 5C, 5D, 5E, 5F, and 5G are cross-sectional views illustrating a process of manufacturing the display device 101 according to the first exemplary embodiment.

First, as illustrated in FIG. 5A, the display substrate 110 is manufactured.

In order to form the display substrate 110, the gate electrode GE and the gate line GL are formed on the first substrate 111, and the gate insulating layer 121 is disposed thereon.

Subsequently, the semiconductor layer SM is disposed on the gate insulating layer 121, and the ohmic contact layer 115 is disposed on the semiconductor layer SM.

In addition, the data line DL, the source electrode SE, and the drain electrode DE are disposed on the gate insulating layer 121.

The protection layer 131 is disposed over an entire surface of the first substrate 111 including the semiconductor layer SM, the data line DL, the source electrode SE, and the drain electrode DE. The pixel electrode PE is disposed on the protection layer 131. The pixel electrode PE is connected to the drain electrode DE through the contact hole CH of the protection layer 131.

Referring to FIG. 5B, the first polarizer 510 is formed on the carrier substrate 550.

In order to form the first polarizer 510, the base substrate 511 is disposed on the carrier substrate 550.

For example, a high molecular weight resin may be coated over the carrier substrate 550 and then cured such that the base substrate 511 may be formed.

In an alternative exemplary embodiment, a base substrate 511 including a plastic substrate may be disposed on the carrier substrate 550. The plastic substrate may be a transparent substrate including one of polyamide, polyimide, polyethylene naphthalate, polyethylene terephthalate, and polyacryl. In such an exemplary embodiment, an adhesive (not shown) may be used to fix the base substrate 511 to the carrier substrate 550.

According to the first exemplary embodiment, because the base substrate 511 is supported by the carrier substrate 550, the base substrate 511 may have excellent flatness. For example, the base substrate 511 may have a flatness of about 60 nm or less.

As supported by the carrier substrate 550, the base substrate 511 having a small thickness may have sufficient strength. Accordingly, a base substrate having a small thickness ranging from about 0.8 µm to about 50 µm may be used.

The linear polarizer 512 is formed on the base substrate 511 having a small thickness. The linear polarizer 512 may include at least one of: aluminum (Al), gold (Au), silver (Ag), copper (Cu), chromium (Cr), iron (Fe), and/or nickel (Ni). In order to form the linear polarizer 512, methods such as imprinting and photolithography may be employed.

Figure 5C:
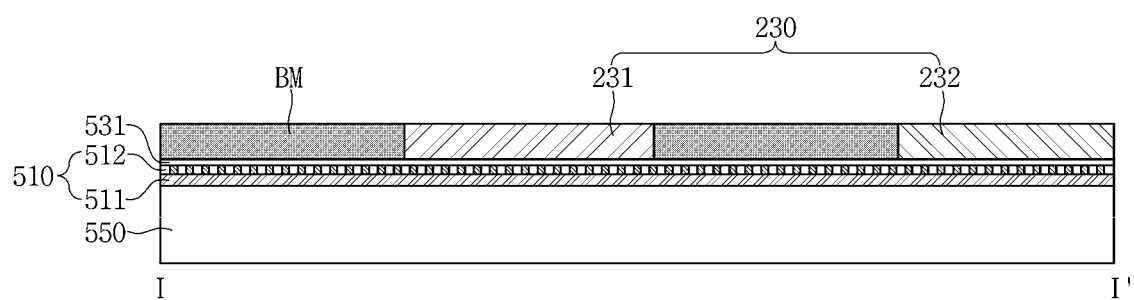

Referring to FIG. 5C, the first passivation layer 531 is disposed on the linear polarizer 512, and the light blocking layer BM and the color conversion layer 230 are disposed on the first passivation layer 531.

The first passivation layer 531 protects the linear polarizer 512 and prevents permeation of undesirable materials into the linear polarizer 512.

The color conversion layer 230 includes the first color conversion portion 231 and the second color conversion portion 232. Each of the first color conversion portion 231 and the second color conversion portion 232 may be one of a red color conversion portion and a green color conversion portion.

Although not illustrated, when the backlight unit 410 emits blue light to the display substrate 110, the color conversion layer 230 may include a third color conversion portion, the blue color conversion portion, including a transmissive portion.

Figure 5D:
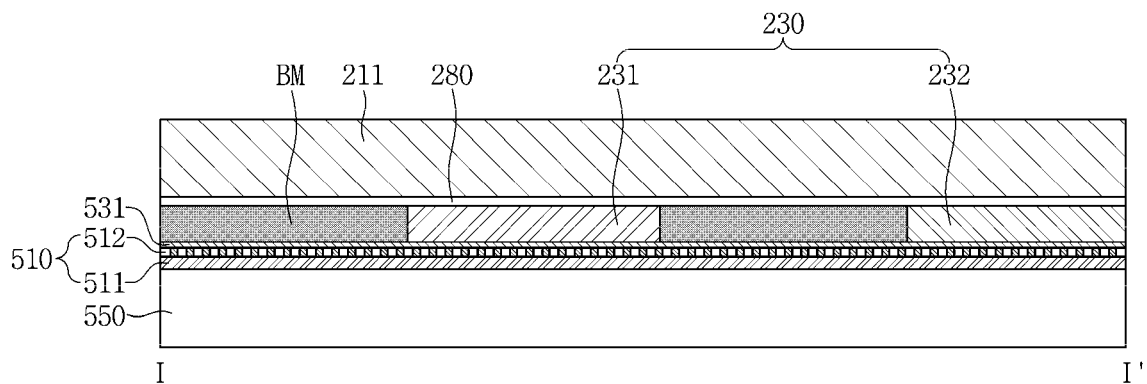

Referring to FIG. 5D, the second substrate 211 is disposed on the color conversion layer 230. In order to attach the second substrate 211 to the color conversion layer 230, the adhesion layer 280 is disposed between the second substrate 211 and the color conversion layer 230. The adhesion layer 280 may be an optically clear adhesive (OCA) having light transmittance.

Figure 5E:
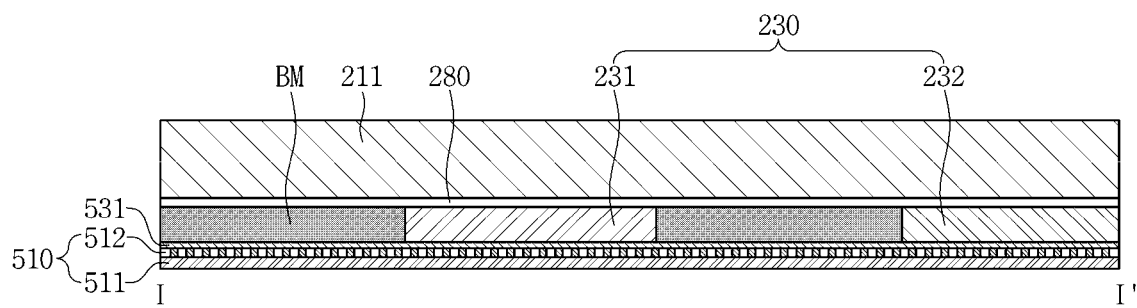

Referring to FIG. 5E, the carrier substrate 550 is removed. The carrier substrate 550 to be removed is detached from the base substrate 511 of the first polarizer 510.

In order to detach the carrier substrate 550 from the base substrate 511, laser may be irradiated thereto. Through laser irradiation, adhesion between the base substrate 511 and the carrier substrate 550 is degraded such that the carrier substrate 550 may be detached from the base substrate 511.

Figure 5F:
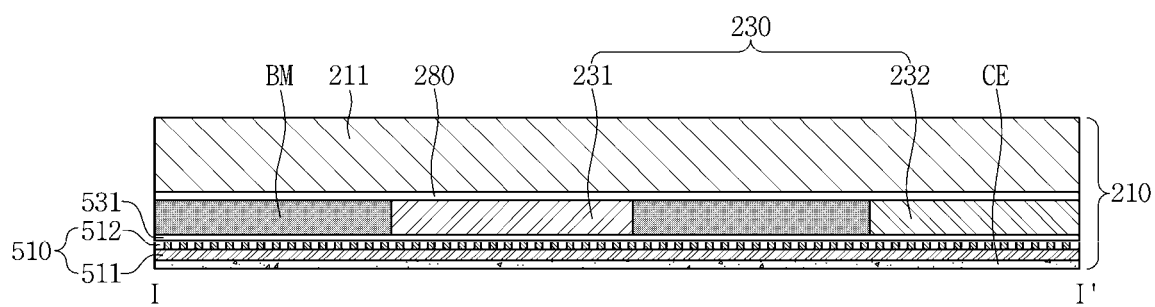

Referring to FIG. 5F, the common electrode CE is disposed on the base substrate 511 of the first polarizer 510. Although not illustrated, in order to maintain flatness of the base substrate 511, after a planarization layer is disposed on the base substrate 511, the common electrode CE may be disposed thereon. The planarization layer may include, for example, an organic layer and may have a thickness of about 50 µm or less. In such an exemplary embodiment, the planarization layer may be disposed over an entire surface of the base substrate 511.

The common electrode CE may be formed through methods known in the pertinent art. Accordingly, the opposing substrate 210 may be provided.

Figure 5G:
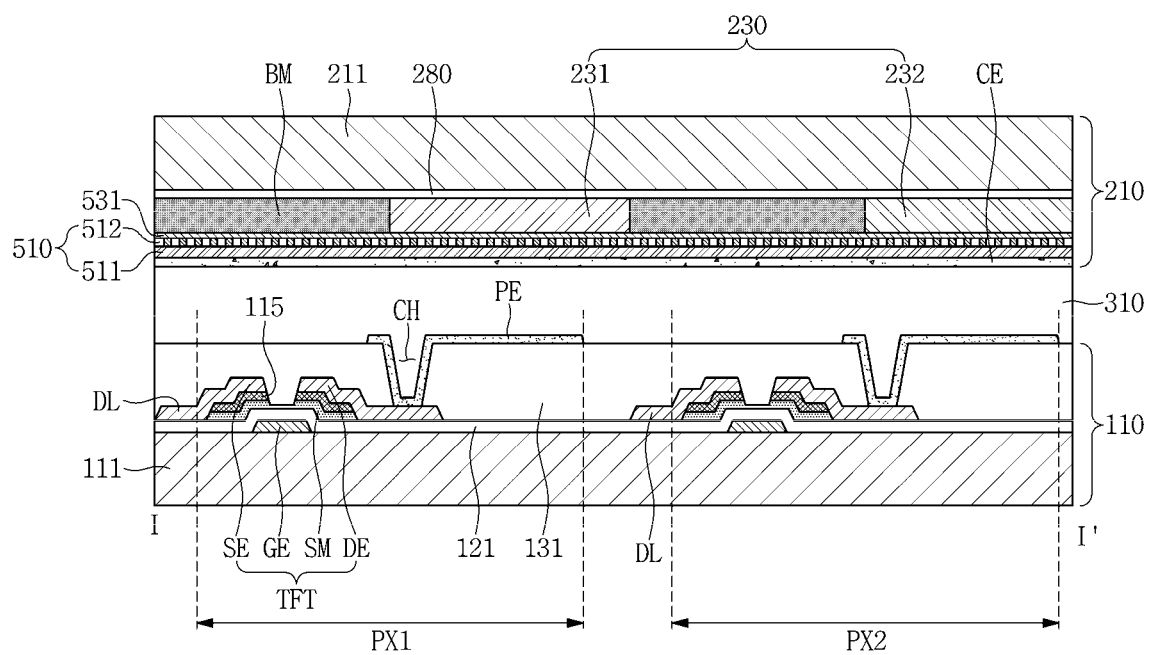

Referring to FIG. 5G, the opposing substrate 210 manufactured in a process illustrated in FIG. 5F is disposed to oppose the display substrate 110, and a liquid crystal layer which is the light amount control layer 310 is disposed between the opposing substrate 210 and the display substrate 110. In an exemplary embodiment, the liquid crystal layer which is the light amount control layer 310 may be disposed on the display substrate 110, and then the opposing substrate 210 may be disposed thereon.

Subsequently, the second polarizer 520 is disposed on the display substrate 110. For example, the second polarizer 520 may be disposed on a rear surface of the first substrate 111. The second polarizer 520 may be a linear polarizer including polyvinyl alcohol (PVA), for example. In addition, although not illustrated, a compensation film may be disposed on the second polarizer 520. The compensation film may be a viewing angle compensation film or a retardation film, for example. The retardation film may be at least one of a quarter-wave plate or a half-wave plate.

Hereinafter, a second exemplary embodiment will be described with reference to FIGS. 6A and 6B. Hereinafter, to avoid repetition, descriptions pertaining to configurations described hereinabove will be omitted.

Figure 6A:
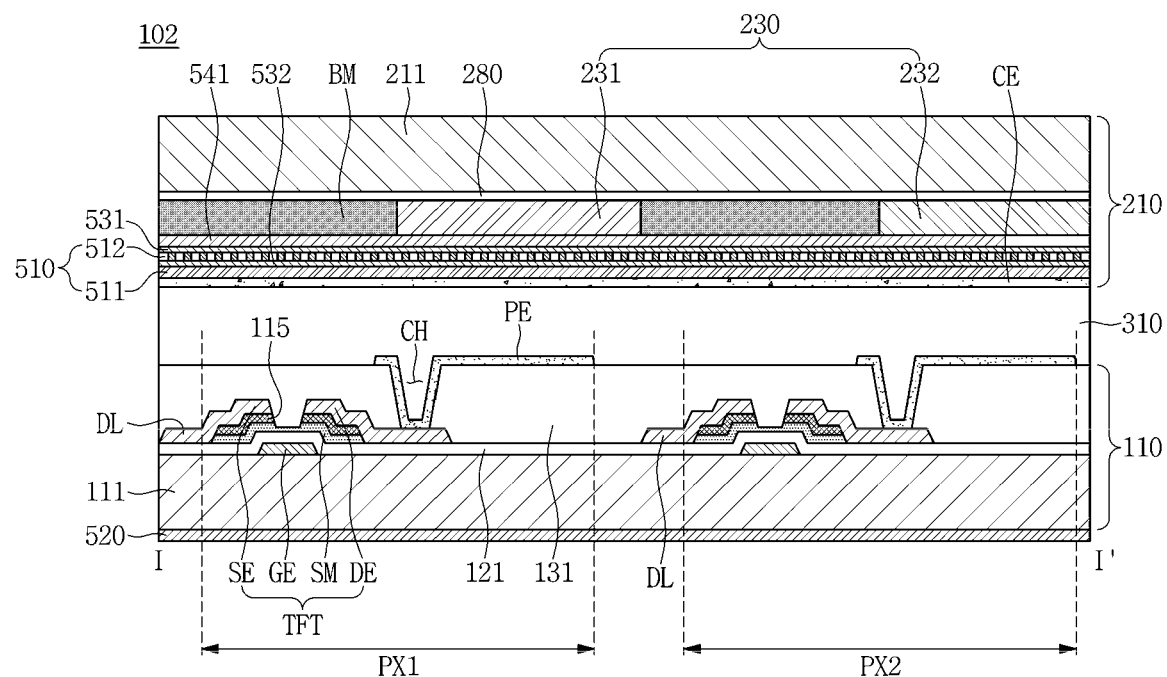
FIG. 6A is a cross-sectional view illustrating a display device according to a second exemplary embodiment.
Figure 6B:
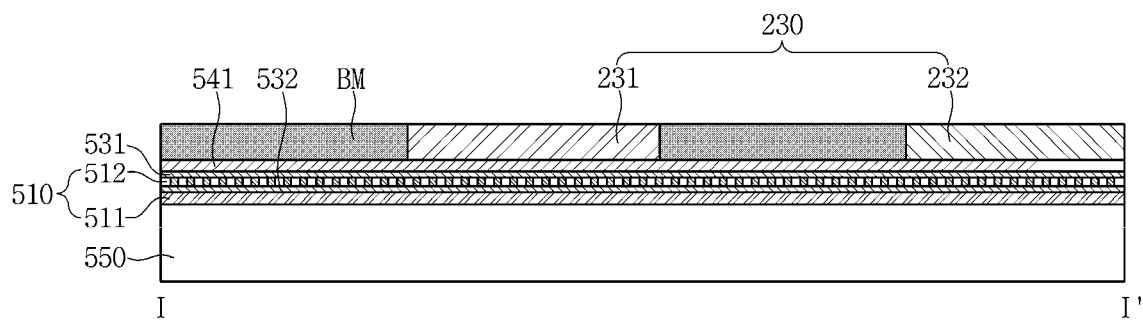
FIG. 6B is a cross-sectional view illustrating a partial process of manufacturing the display device of FIG. 6A.

FIG. 6A is a cross-sectional view illustrating a display device 102 according to the second exemplary embodiment, and FIG. 6B is a cross-sectional view illustrating a partial process of manufacturing the display device 102 of FIG. 6A.

The display device 102 according to the second exemplary embodiment 102 has substantially a same structure as that of the display device 101 according to the first exemplary embodiment except that a dichroic reflection layer 541 is provided between a first polarizer 510 and a color conversion layer 230.

Referring to FIG. 6B, after disposing a first passivation layer 531 on a linear polarizer 512 and before disposing a light blocking layer BM and the color conversion layer 230 thereon, the dichroic reflection layer 541 may be disposed on the first passivation layer 531, and then the light blocking layer BM and the color conversion layer 230 may be disposed on the dichroic reflection layer 541 such that the display device 102 according to the second exemplary embodiment may be provided.

In addition, referring to FIGS. 6A and 6B, a second passivation layer 532 is disposed between a base substrate 511 and the linear polarizer 512. The second passivation layer 532, similar to a buffer layer, is configured to prevent permeation of undesirable materials or unnecessary substances into the linear polarizer 512 and to planarize a surface of the base substrate 511. The second passivation layer 532 may include at least one layer selected from various organic layers and inorganic layers. However, the second passivation layer 532 may be omitted.

The dichroic reflection layer 541 includes a dichroic filter. The dichroic filter is a filter that transmits light having a predetermined wavelength among incident light and reflects light having another wavelength.

In a case where light incident from the backlight unit 410 is blue light, the dichroic reflection layer 541 may be utilized to transmit the blue light and reflect light other than the blue light. In such an exemplary embodiment, light incident from the backlight unit 410 is transmitted through the dichroic reflection layer 541. However, red light and green light that have been converted, by the color conversion layer 230, in terms of wavelength are reflected from the dichroic reflection layer 541. Accordingly, the dichroic reflection layer 541 is also referred to as a yellow color filter YRF.

For example, as red light and green light which are emitted toward the light amount control layer from the color conversion layer 230 are reflected from the dichroic reflection layer 541 toward the second substrate 211, light efficiency of the display device 102 according to the second exemplary embodiment may be improved.

The dichroic reflection layer 541 includes a plurality of high refractive index layers and a plurality of low refractive index layers that are alternately stacked. Due to a multilayer interference phenomenon arising from interfaces between the plurality of high refractive index layers and the plurality of low refractive index layers, the dichroic reflection layer 541 may achieve selective light transmittance. The low refractive index layer may include at least one of $MgF_2$ and $SiO_2$, and the high refractive index layer may include at least one of Ag, $TiO_2$, $Ti_2O_3$, and $Ta_2O_3$, but exemplary embodiments are not limited thereto. A thickness of each layer may be designed in a range of about ⅛ to about ½ of a wavelength of transmitted light.

Based on a structure of each layer included in the dichroic reflection layer 541, a wavelength of the transmitted light and a wavelength of the reflected light may be adjusted.

Hereinafter, a third exemplary embodiment will be described with reference to FIG. 7.

Figure 7:
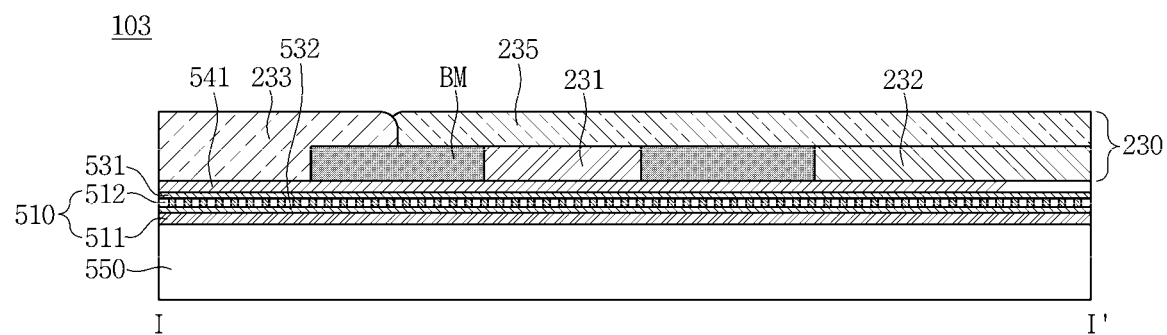
FIG. 7 is a cross-sectional view illustrating a partial process of manufacturing a display device according to a third exemplary embodiment.

FIG. 7 is a cross-sectional view illustrating a partial process of manufacturing a display device according to a third exemplary embodiment. In detail, FIG. 7 illustrates a color conversion substrate 103 including a first polarizer 510 and a color conversion layer 230 formed on a carrier substrate 550.

According to the third exemplary embodiment, the color conversion layer 230 includes a first color conversion portion 231 which is a red color conversion portion, a second color conversion portion 232 which is a green color conversion portion, and a transmissive portion 233 which transmits blue light. In addition, the color conversion layer 230 includes a yellow color filter 235 on the first color conversion portion 231 and the second color conversion portion 232. The yellow color filter 235 absorbs blue light and transmits red light and green light.

According to the third exemplary embodiment, blue light emitted from a backlight unit 410 is incident to the color conversion layer 230. Among blue light incident to the first color conversion portion 231, light that has been converted into red light is transmitted through the yellow color filter 235, and blue light that is not converted into red light is absorbed by the yellow color filter 235. In addition, among blue light incident to the second color conversion portion 232, light that has been converted into green light is transmitted through the yellow color filter 235, and blue light that is not converted into green light is absorbed by the yellow color filter 235. Accordingly, distinct colors of red and green may be realized in a red pixel and a green pixel, respectively, such that display quality of the display device may be improved.

Hereinafter, a fourth exemplary embodiment will be described with reference to FIGS. 8, 9A, 9B, 9C, 9D, 9E, 9F, and 9G.

Figure 8:
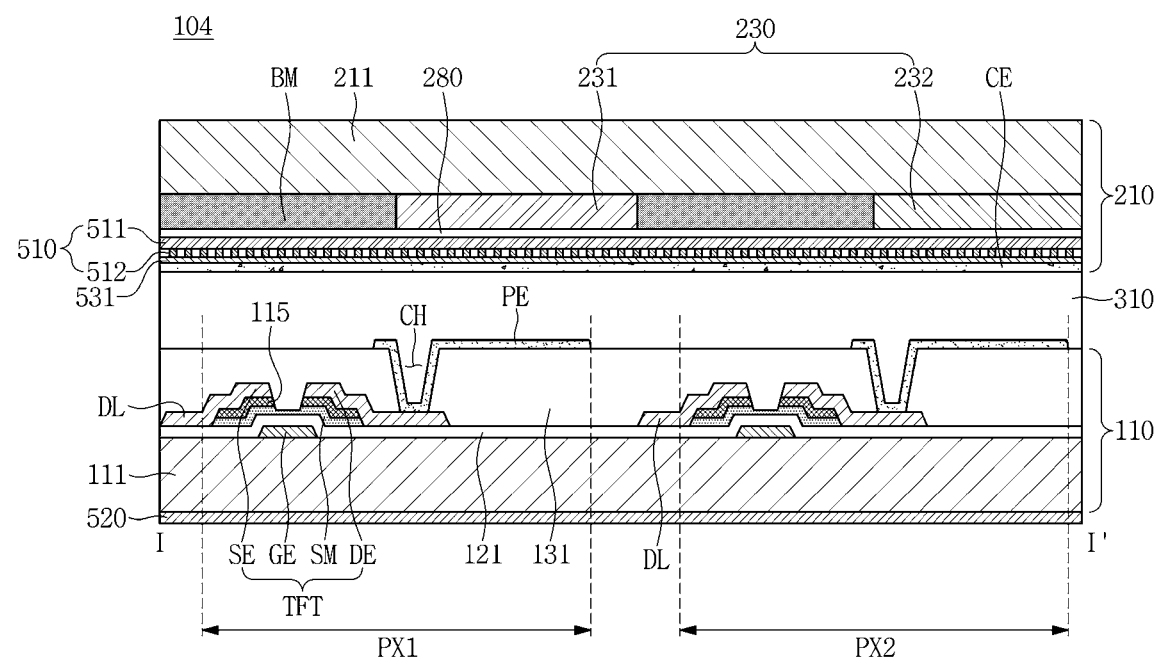
FIG. 8 is a cross-sectional view illustrating a display device according to a fourth exemplary embodiment.

FIG. 8 is a cross-sectional view illustrating a display device 104 according to the fourth exemplary embodiment.

The display device 104 according to the fourth exemplary embodiment includes an adhesion layer 280 between a first polarizer 510 and a color conversion layer 230.

In addition, according to the fourth exemplary embodiment, a common electrode CE is disposed on a linear polarizer 512 of the first polarizer 510. In such an exemplary embodiment, a first passivation layer 531 is disposed between the linear polarizer 512 and the common electrode CE.

Hereinafter, a method of manufacturing the display device 104 according to the fourth exemplary embodiment will be described with reference to FIGS. 9A, 9B, 9C, 9D, 9E, 9F, and 9G. FIGS. 9A, 9B, 9C, 9D, 9E, 9F, and 9G are cross-sectional views illustrating a process of manufacturing the display device 104 according to the fourth exemplary embodiment.

Figure 9A:
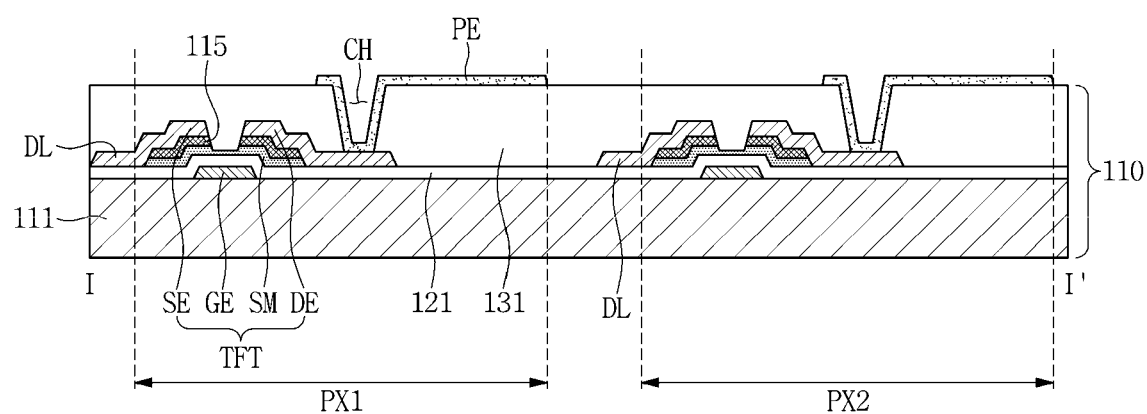
FIGS. 9A, 9B, 9C, 9D, 9E, 9F, and 9G are cross-sectional views illustrating a process of manufacturing the display device according to the fourth exemplary embodiment.

First, as illustrated in FIG. 9A, a display substrate 110 is manufactured.

Figure 9B:
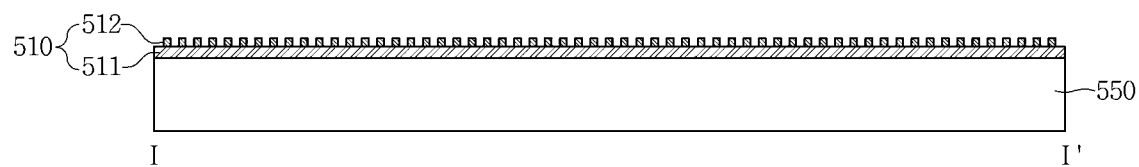

Subsequently, referring to FIG. 9B, the first polarizer 510 is formed on a carrier substrate 550. In order to form the first polarizer 510, a base substrate 511 is disposed on the carrier substrate 550, and the linear polarizer 512 is disposed thereon. The linear polarizer 512 according to the fourth exemplary embodiment is a WGP.

Figure 9C:
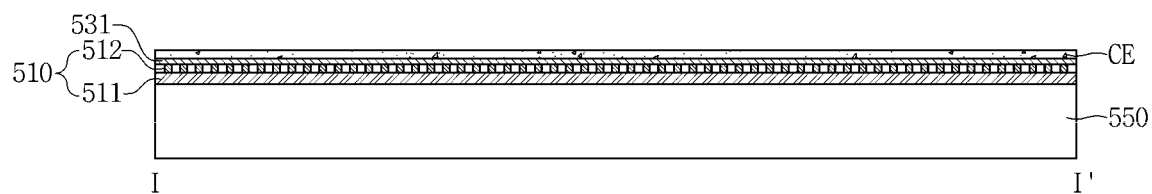

Referring to FIG. 9C, the first passivation layer 531 is disposed on the linear polarizer 512, and the common electrode CE is disposed on the first passivation layer 531. The first passivation layer 531 protects the linear polarizer 512 and prevents permeation of undesirable materials into the linear polarizer 512.

Figure 9D:
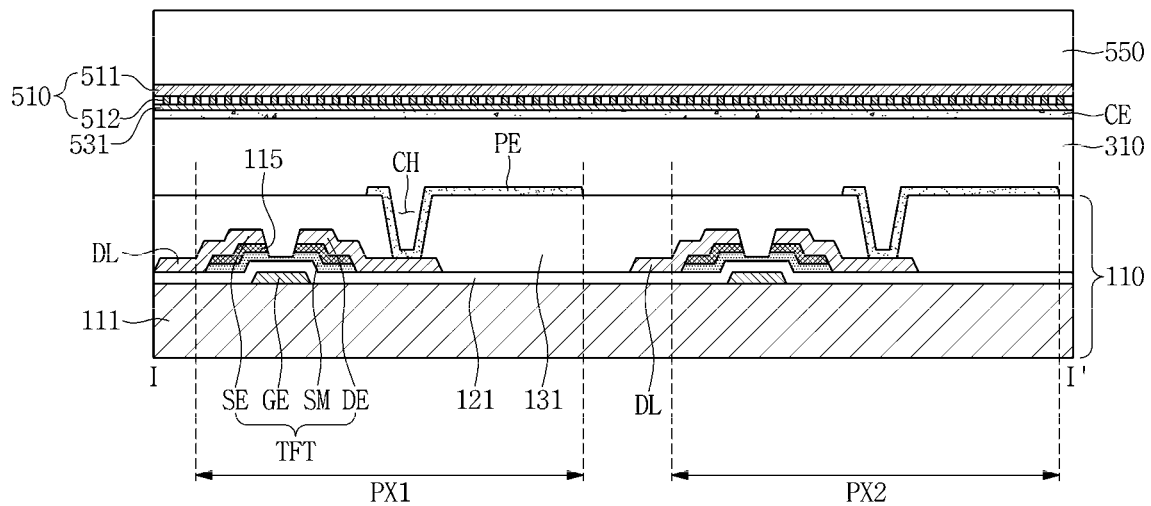

Referring to FIG. 9D, the common electrode CE on the first polarizer 510 is disposed to oppose the display substrate 110, and a liquid crystal layer which is a light amount control layer 310 is disposed between the common electrode CE and the display substrate 110.

Figure 9E:
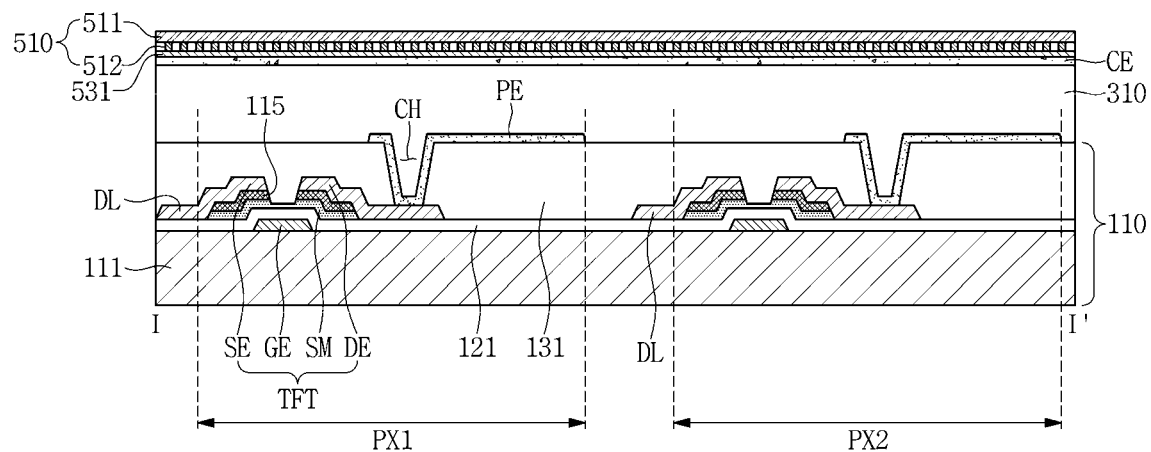

Referring to FIG. 9E, the carrier substrate 550 is removed. The carrier substrate 550 to be removed is detached from the base substrate 511 of the first polarizer 510.

Figure 9F:
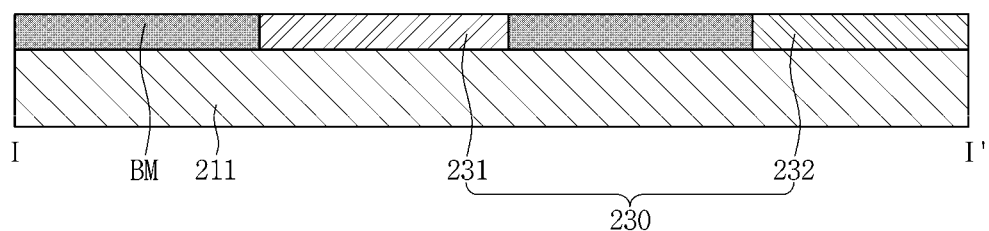

Referring to FIG. 9F, a light blocking layer BM and the color conversion layer 230 are formed on a second substrate 211. The color conversion layer 230 includes a first color conversion portion 231 and a second color conversion portion 232. Each of the first color conversion portion 231 and the second color conversion portion 232 may be one of a red color conversion portion, a green color conversion portion, and a blue color conversion portion.

Figure 9G:
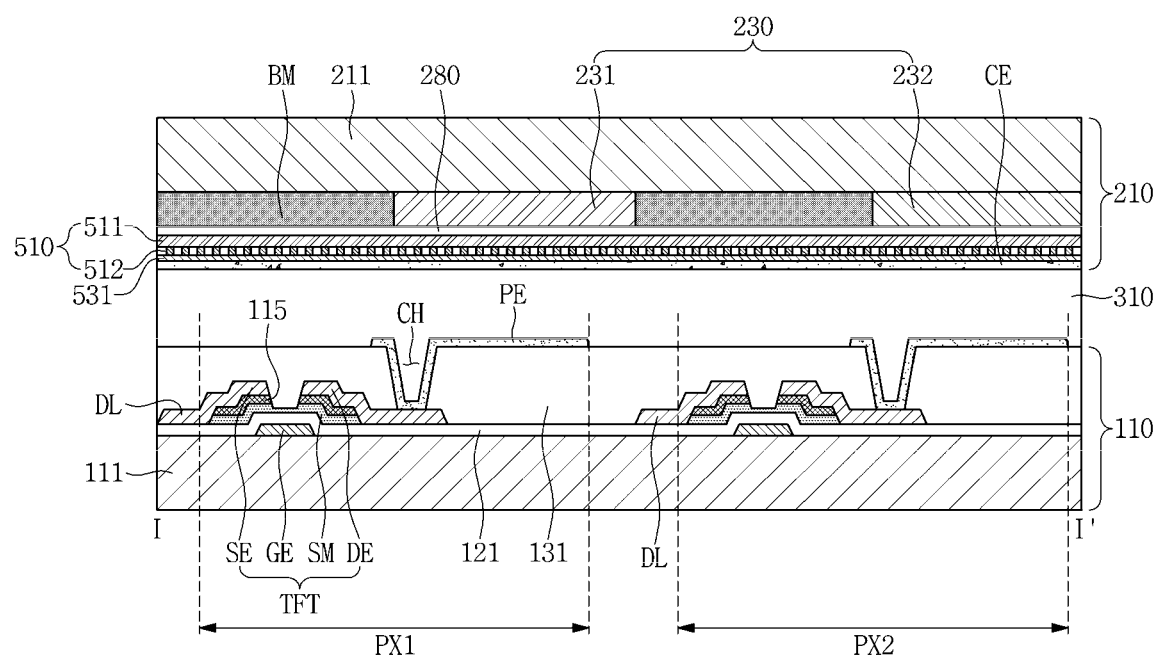

Referring to FIG. 9G, the color conversion layer 230, along with the second substrate 211, is disposed on the first polarizer 510. In order to attach the color conversion layer 230 to the first polarizer 510, an adhesion layer 280 is disposed between the first polarizer 510 and the color conversion layer 230. The adhesion layer 280 may be an optically clear adhesive (OCA) having light transmittance.

Subsequently, a second polarizer 520 is disposed on the display substrate 110 such that the display device 104 according to the fourth exemplary embodiment may be provided.

Hereinafter, a fifth exemplary embodiment will be described with reference to FIGS. 10A and 10B.

Figure 10A:
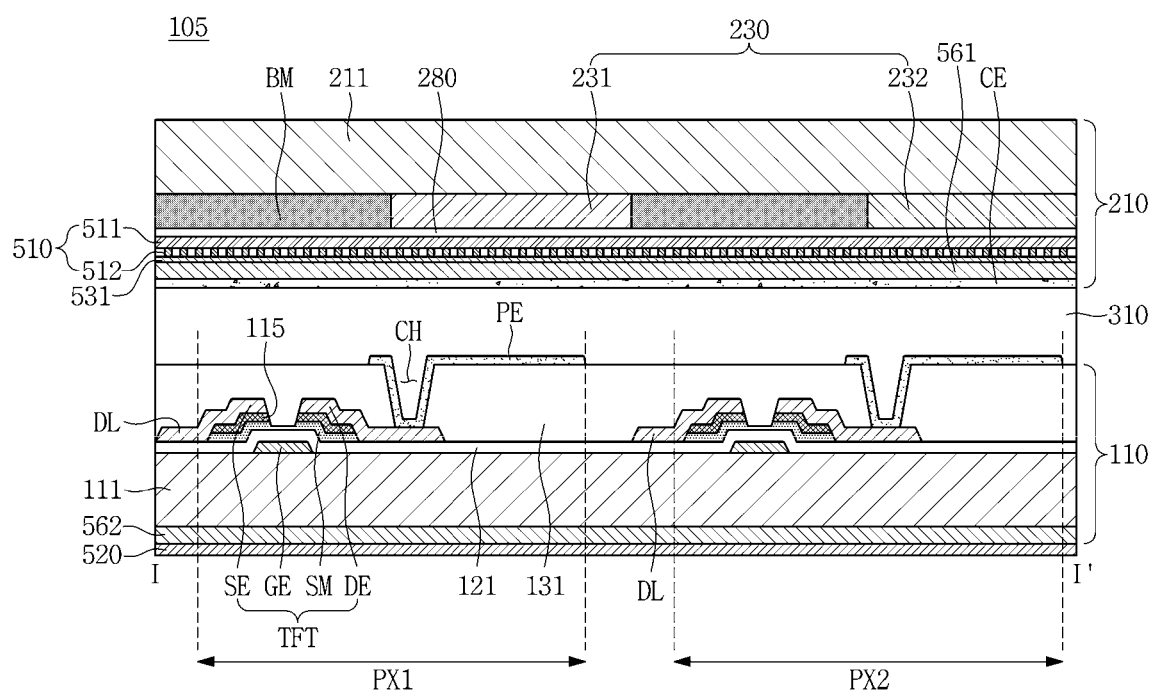
FIG. 10A is a cross-sectional view illustrating a display device according to a fifth exemplary embodiment.
Figure 10B:
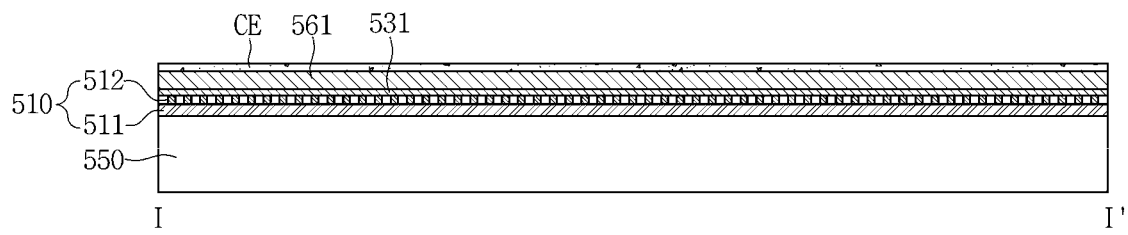
FIG. 10B is a cross-sectional view illustrating a partial process of manufacturing the display device of FIG. 10A.

FIG. 10A is a cross-sectional view illustrating a display device 105 according to the fifth exemplary embodiment, and FIG. 10B is a cross-sectional view illustrating a partial process of manufacturing the display device 105 of FIG. 10A.

The display device 105 according to the fifth exemplary embodiment has substantially a same structure as that of the display device 104 according to the fourth exemplary embodiment except that a first compensation film 561 is provided between a first polarizer 510 and a common electrode CE and a second compensation film 562 is provided between a second polarizer 520 and a first substrate 111.

Referring to FIG. 10B, after disposing a first passivation layer 531 on the first polarizer 510 (refer to FIG. 9C) and before disposing the common electrode CE thereon, the first compensation film 561 may be disposed on between the first passivation layer 531 and the common electrode CE. In addition, before disposing the second polarizer 520 on another surface of the first substrate 111, the second compensation film 562 may be disposed between the first substrate 111 and the second polarizer 520.

One of the first compensation film 561 and the second compensation film 562 may be omitted.

Each of the first compensation film 561 and the second compensation film 562 may be a viewing angle compensation film or a retardation film, for example. The first compensation film 561 and the second compensation film 562 may be substantially the same as or different from each other.

Hereinafter, a sixth exemplary embodiment will be described with reference to FIGS. 11, 12A, 12B, 12C, 12D, 12E, 12F, and 12G.

Figure 11:
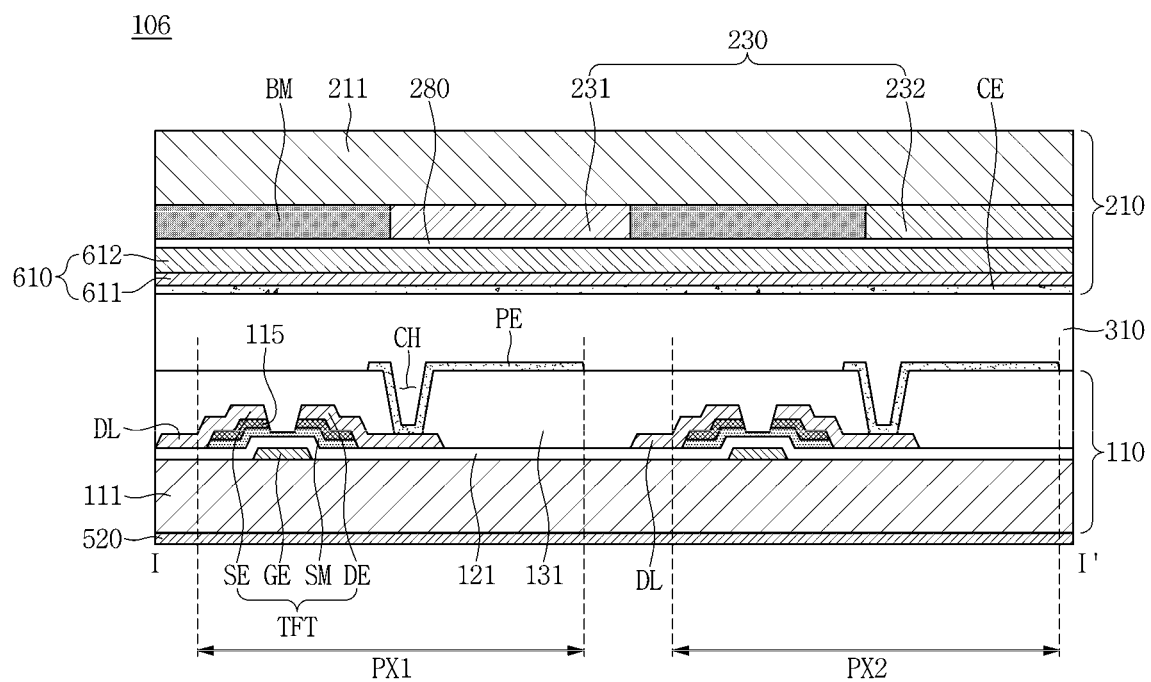
FIG. 11 is a cross-sectional view illustrating a display device according to a sixth exemplary embodiment.

FIG. 11 is a cross-sectional view illustrating a display device 106 according to the sixth exemplary embodiment.

According to the sixth exemplary embodiment, a first polarizer 610 includes a base substrate 611 including a plastic substrate and a linear polarizer 612 having a film shape. For example, according to the sixth exemplary embodiment, the linear polarizer 612 may include polyvinyl alcohol (PVA). For example, the linear polarizer 612 may be formed by elongation or dyeing of polyvinyl alcohol (PVA).

In addition, according to the sixth exemplary embodiment, an adhesion layer 280 is disposed between the first polarizer 610 and a color conversion layer 230, and a common electrode CE is disposed on the base substrate 611 of the first polarizer 610.

Hereinafter, a method of manufacturing the display device 106 according to the sixth exemplary embodiment will be described with reference to FIGS. 12A, 12B, 12C, 12D, 12E, 12F, and 12G. FIGS. 12A, 12B, 12C, 12D, 12E, 12F, and 12G are cross-sectional views illustrating a process of manufacturing the display device 106 according to the sixth exemplary embodiment.

Figure 12A:
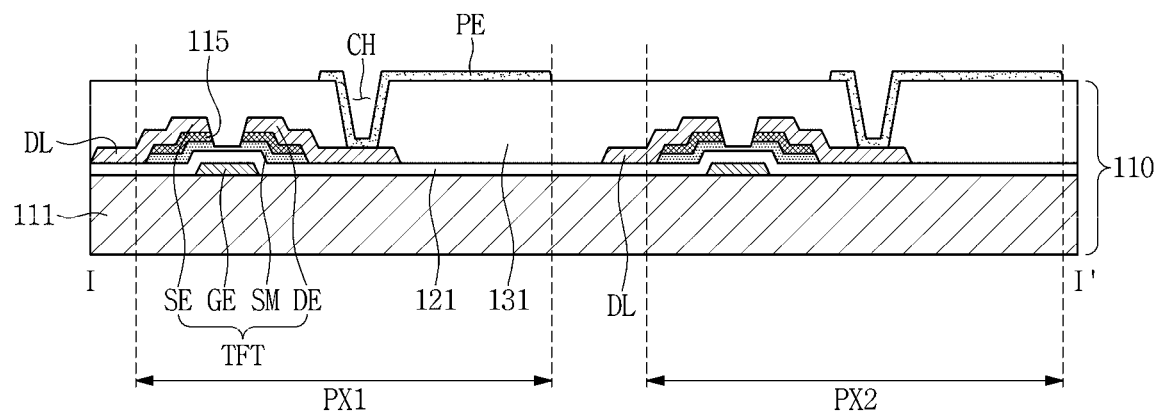
FIGS. 12A, 12B, 12C, 12D, 12E, 12F, and 12G are cross-sectional views illustrating a process of manufacturing the display device according to the sixth exemplary embodiment.

First, as illustrated in FIG. 12A, a display substrate 110 is manufactured.

Figure 12B:
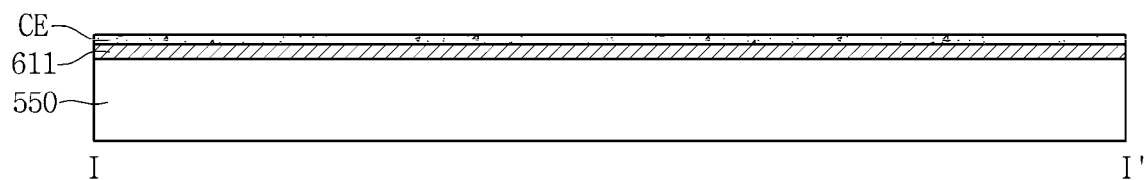

Subsequently, referring to FIG. 12B, the base substrate 611 of the first polarizer 610 is disposed on a carrier substrate 550 and the common electrode CE is disposed thereon.

Figure 12C:
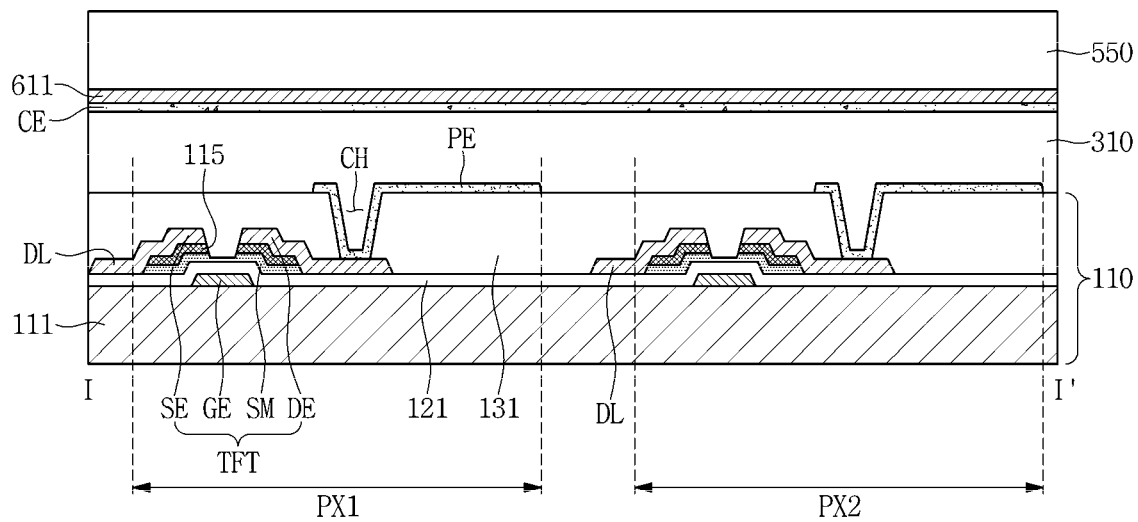

Referring to FIG. 12C, the common electrode CE is disposed to oppose the display substrate 110, and a liquid crystal layer which is a light amount control layer 310 is disposed between the common electrode CE and the display substrate 110.

Figure 12D:
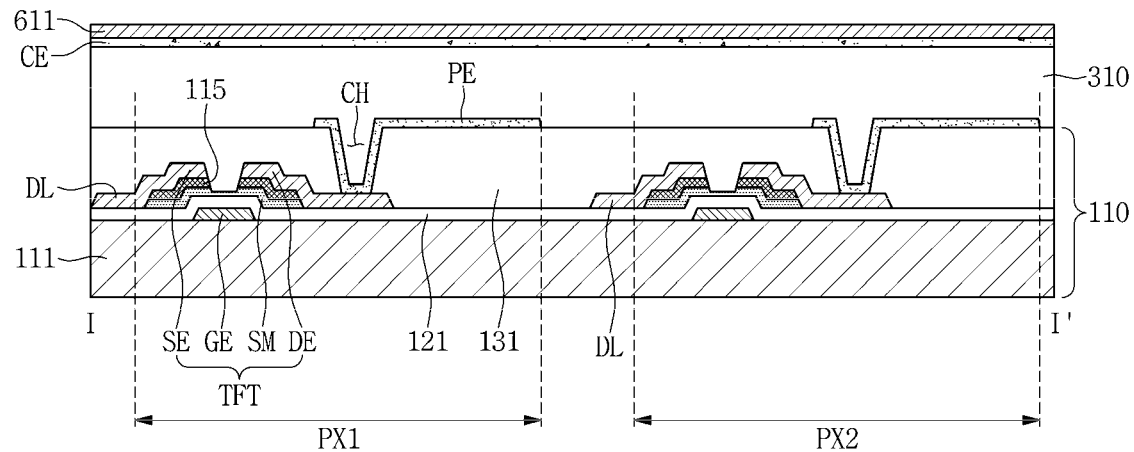

Referring to FIG. 12D, the carrier substrate 550 is removed. The carrier substrate 550 to be removed is detached from the base substrate 611.

Figure 12E:
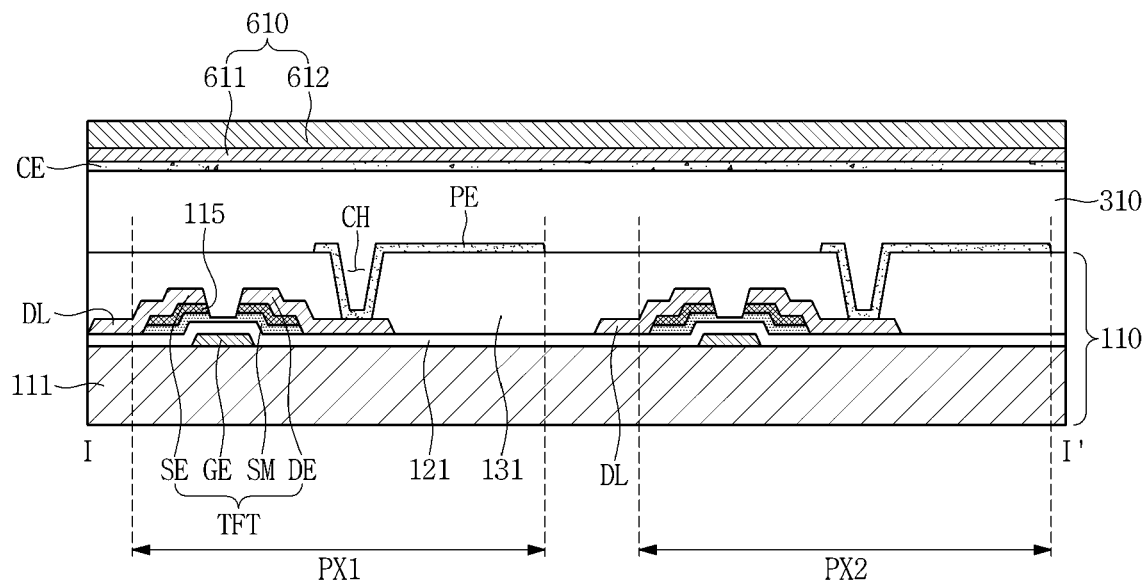

Referring to FIG. 12E, the linear polarizer 612 is disposed on the base substrate 611. The linear polarizer 612 may be a linear polarizer, having a film shape, which includes polyvinyl alcohol (PVA).

Figure 12F:
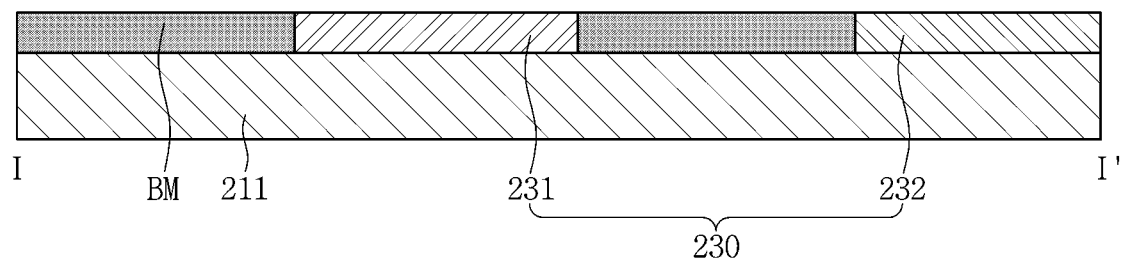

Referring to FIG. 12F, a light blocking layer BM and the color conversion layer 230 are formed on a second substrate 211. The color conversion layer 230 includes a first color conversion portion 231 and a second color conversion portion 232.

Figure 12G:
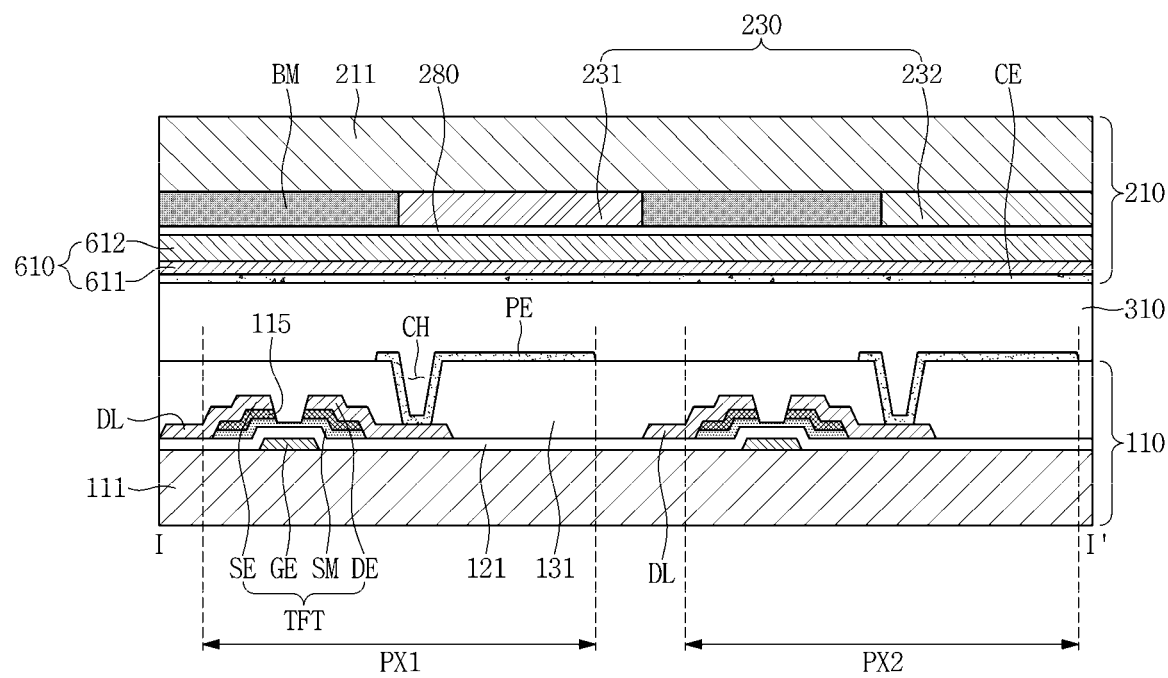

Referring to FIG. 12G, the second substrate 211 including the color conversion layer 230 is disposed on the first polarizer 610. In order to attach the color conversion layer 230 to the first polarizer 610, an adhesion layer 280 is disposed between the first polarizer 610 and the color conversion layer 230. The adhesion layer 280 may be an optically clear adhesive (OCA) having light transmittance.

Subsequently, a second polarizer 520 is disposed on the display substrate 110 such that the display device 106 according to the sixth exemplary embodiment is provided.

Hereinafter, a seventh exemplary embodiment will be described with reference to FIGS. 13A and 13B.

Figure 13A:
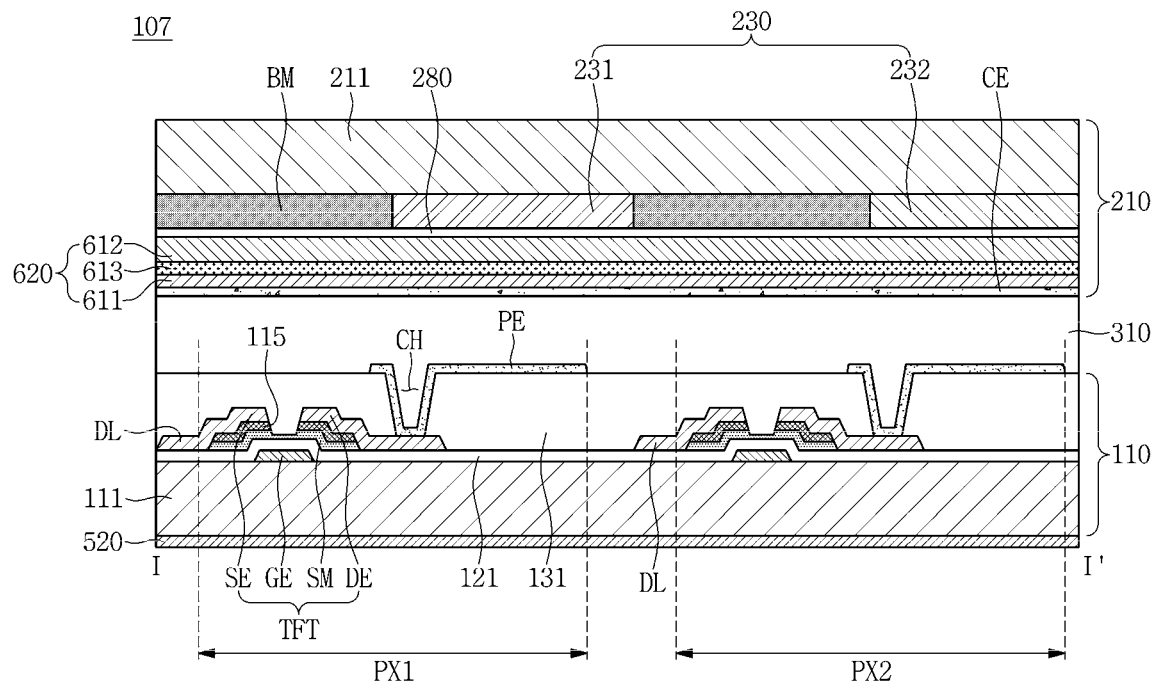
FIG. 13A is a cross-sectional view illustrating a display device according to a seventh exemplary embodiment.
Figure 13B:
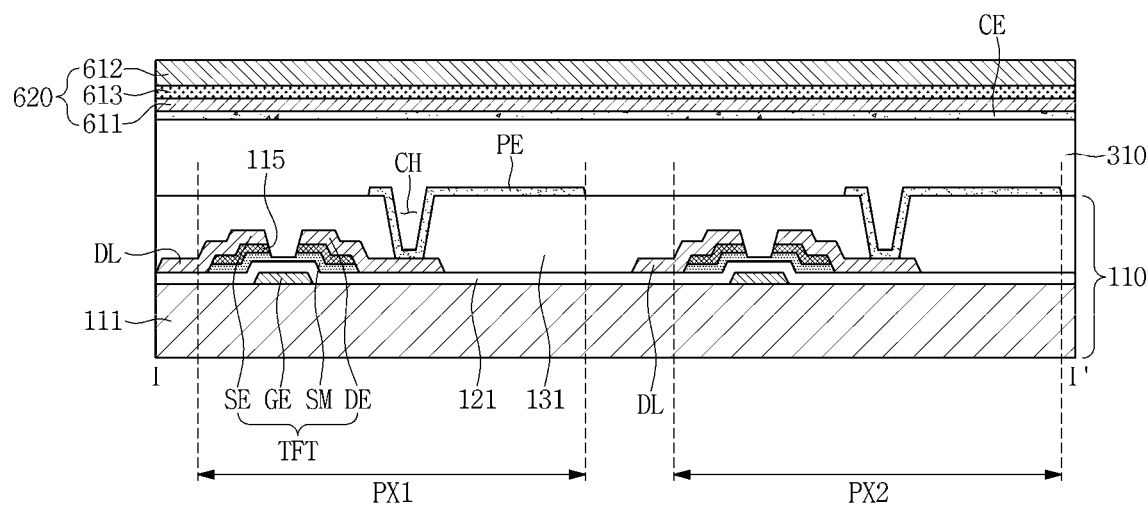
FIG. 13B is a cross-sectional view illustrating a partial process of manufacturing the display device of FIG. 13A.

FIG. 13A is a cross-sectional view illustrating a display device 107 according to the seventh exemplary embodiment, and FIG. 13B is a cross-sectional view illustrating a partial process of manufacturing the display device 107 of FIG. 13A.

The display device 107 according to the seventh exemplary embodiment includes a third compensation film 613 between a base substrate 611 and a linear polarizer 612. The third compensation film 613 may be a viewing angle compensation film or a retardation film, for example.

According to the seventh exemplary embodiment, a stack film in which the base substrate 611, the third compensation film 613, and the linear polarizer 612 are sequentially stacked is referred to as a first polarizer 620.

Referring to FIG. 13B, in the process (refer to FIG. 12E) of disposing the linear polarizer 612 on the base substrate 611, the third compensation film 613 may be disposed on the base substrate 611 and then the linear polarizer 612 may be disposed on the third compensation film 613. Accordingly, the first polarizer 620 including the base substrate 611, the third compensation film 613, and the linear polarizer 612 that are sequentially stacked may be provided.

Hereinafter, an eighth exemplary embodiment will be described with reference to FIGS. 14, 15A, 15B, 15C, 15D, 15E, 15F, and 15G.

Figure 14:
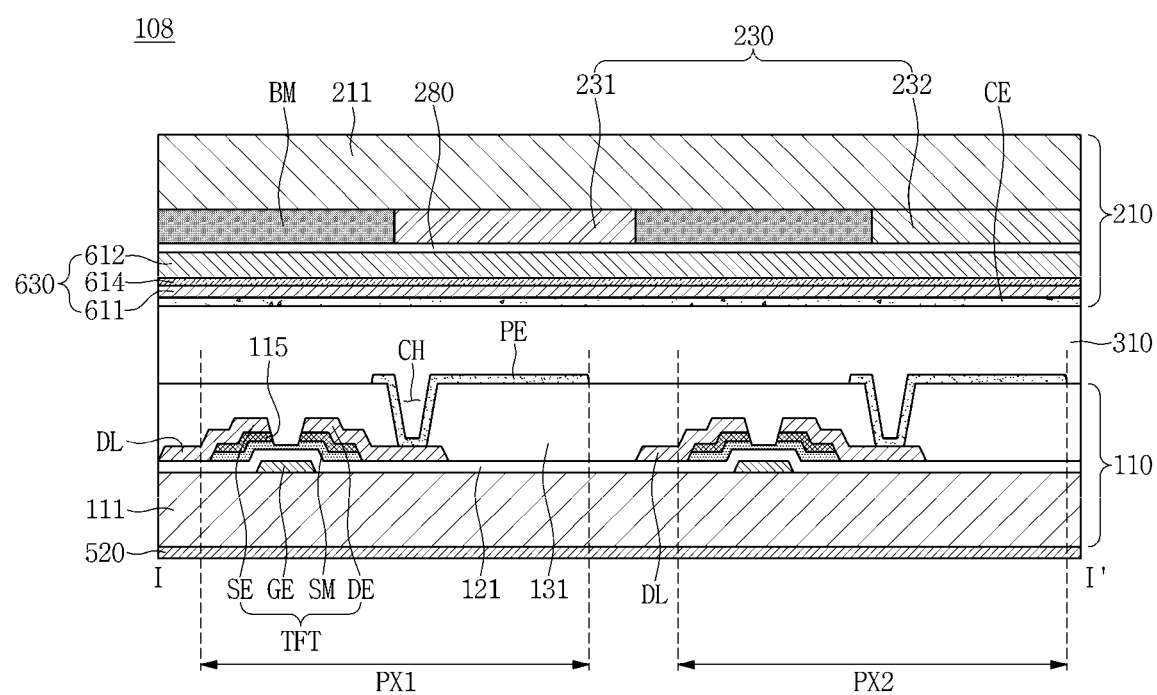
FIG. 14 is a cross-sectional view illustrating a display device according to an eighth exemplary embodiment.

FIG. 14 is a cross-sectional view illustrating a display device 108 according to an eighth exemplary embodiment. According to the eighth exemplary embodiment, a dichroic reflection layer 614 is disposed between a base substrate 611 and a linear polarizer 612. According to the eighth exemplary embodiment, a stack film including the base substrate 611, the dichroic reflection layer 614, and the linear polarizer 612 that are sequentially stacked is referred to as a first polarizer 630.

Hereinafter, a method of manufacturing the display device 108 according to the eighth exemplary embodiment will be described with reference to FIGS. 15A, 15B, 15C, 15D, 15E, 15F, and 15G. FIGS. 15A, 15B, 15C, 15D, 15E, 15F, and 15G are cross-sectional views illustrating a process of manufacturing the display device 108 according to the eighth exemplary embodiment.

Figure 15A:
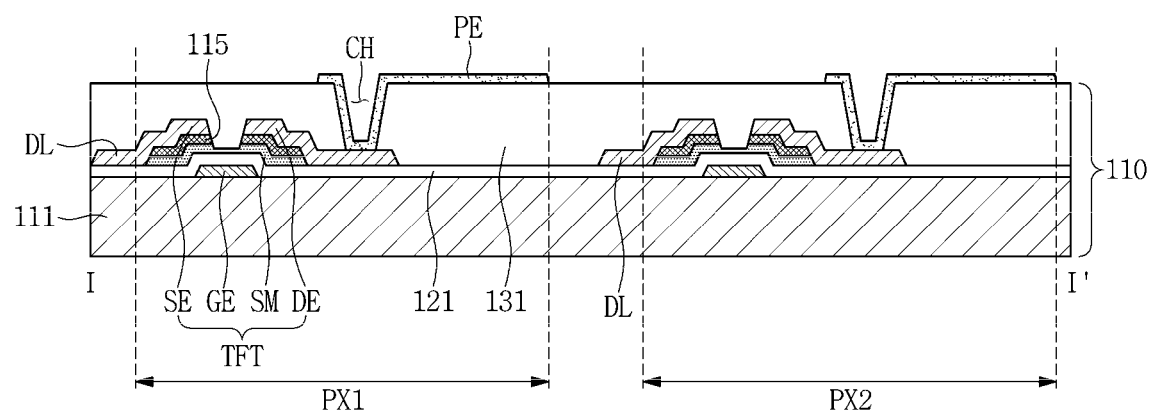
FIGS. 15A, 15B, 15C, 15D, 15E, 15F, and 15G are cross-sectional views illustrating a process of manufacturing the display device according to the eighth exemplary embodiment.

First, as illustrated in FIG. 15A, a display substrate 110 is manufactured.

Figure 15B:
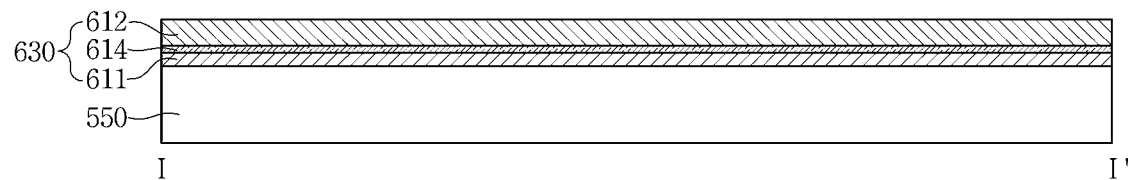

Subsequently, referring to FIG. 15B, the base substrate 611 is disposed on a carrier substrate 550, the dichroic reflection layer 614 is disposed on the base substrate 611, and the linear polarizer 612 is disposed on the dichroic reflection layer 614, such that the first polarizer 630 is provided.

Figure 15C:
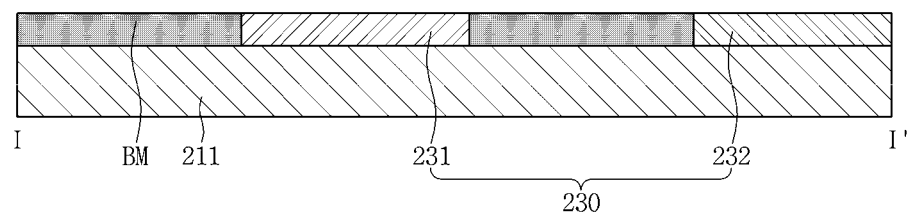

Referring to FIG. 15C, a light blocking layer BM and a color conversion layer 230 are formed on a second substrate 211. The color conversion layer 230 includes a first color conversion portion 231 and a second color conversion portion 232.

Figure 15D:
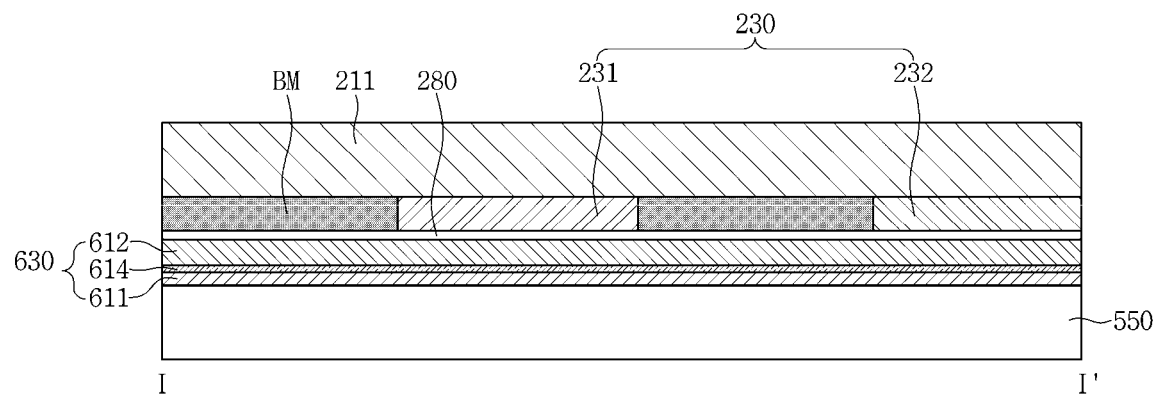

Referring to FIG. 15D, the second substrate 211 including the color conversion layer 230 is disposed on the first polarizer 630. In order to attach the color conversion layer 230 to the first polarizer 630, an adhesion layer 280 is disposed between the first polarizer 630 and the color conversion layer 230. The adhesion layer 280 may be an optically clear adhesive (OCA) having light transmittance.

Figure 15E:
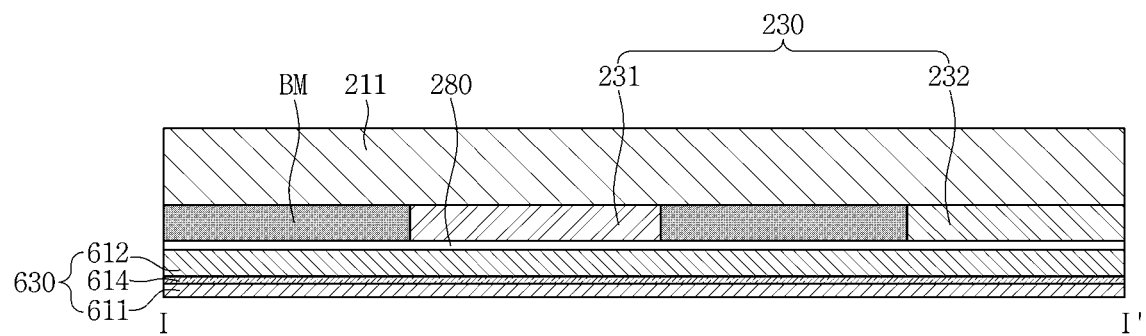

Referring to FIG. 15E, the carrier substrate 550 is removed. The carrier substrate 550 to be removed is detached from the base substrate 611.

Figure 15F:
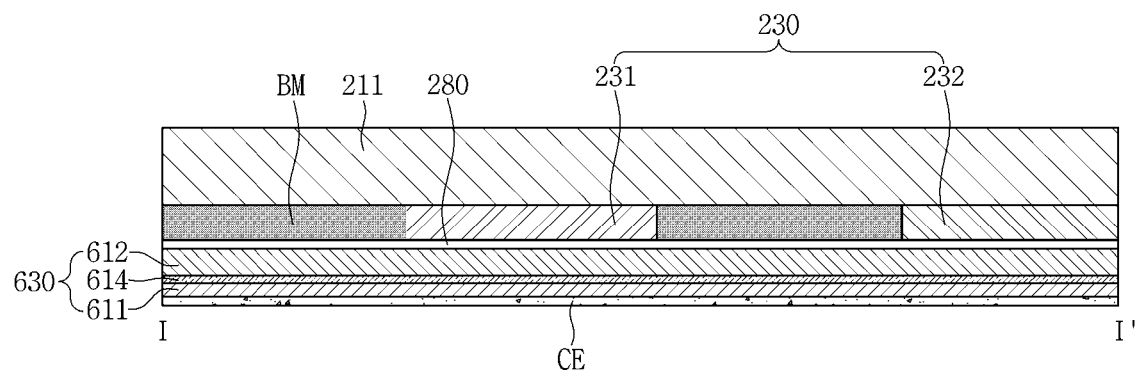

Referring to FIG. 15F, a common electrode CE is formed on the base substrate 611.

Although not illustrated, a buffer layer may be disposed on the base substrate 611. The buffer layer serves to prevent permeation of undesirable materials or unnecessary substances and to planarize a surface of the base substrate 611. The buffer layer may include at least one layer selected from various organic layers and inorganic layers. In such an exemplary embodiment, the common electrode CE may be formed on the buffer layer.

Figure 15G:
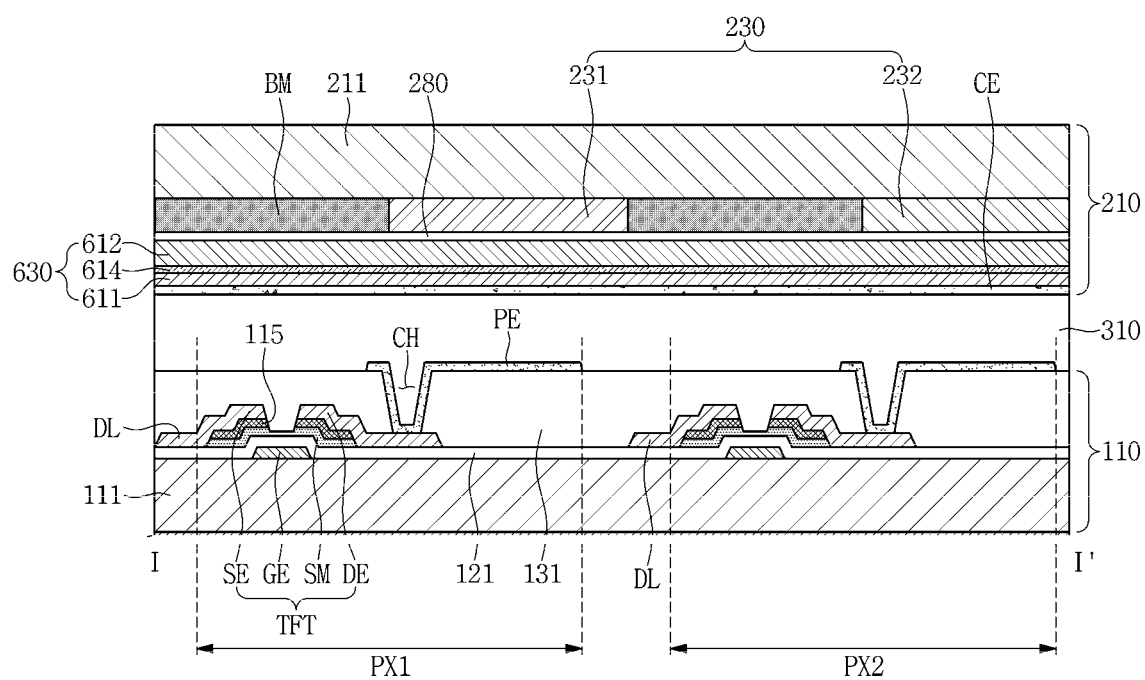

Referring to FIG. 15G, an opposing substrate 210 manufactured in the process of FIG. 15F is disposed to oppose the display substrate 110, and a liquid crystal layer which is a light amount control layer 310 is disposed between the opposing substrate 210 and the display substrate 110.

Subsequently, a second polarizer 520 is disposed on the display substrate 110 such that the display device 108 of FIG. 14 is provided.

Hereinafter, a ninth exemplary embodiment will be described with reference to FIGS. 16A and 16B.

Figure 16A:
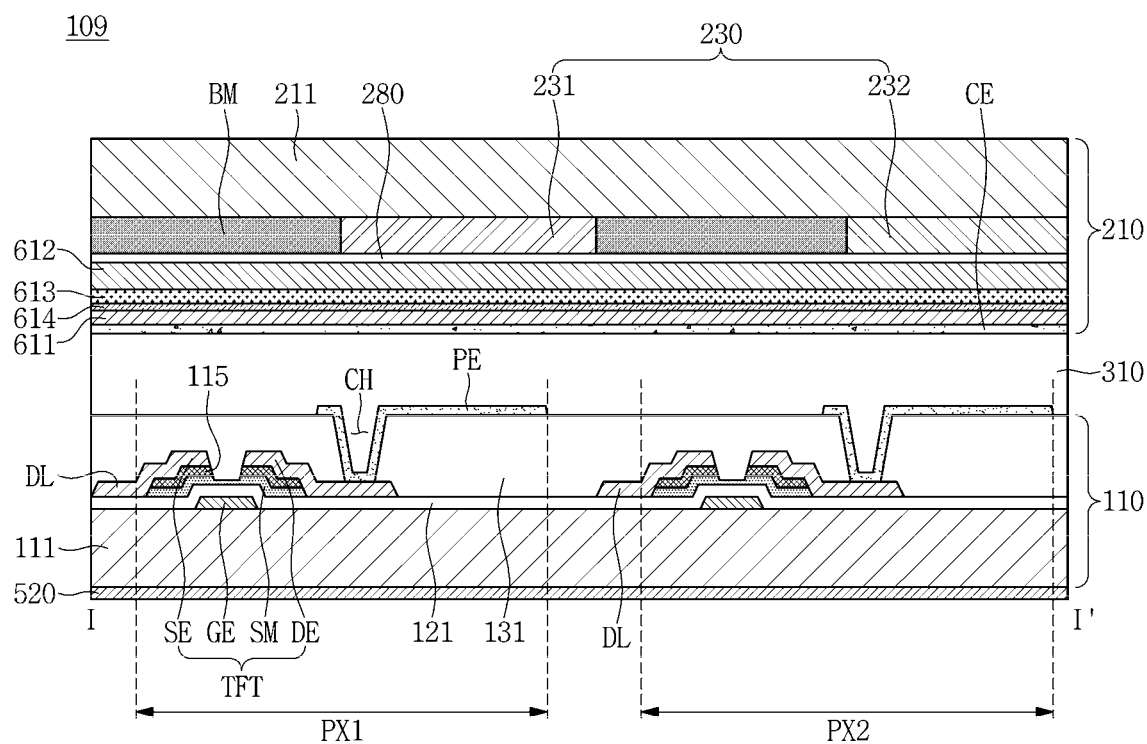
FIG. 16A is a cross-sectional view illustrating a display device according to a ninth exemplary embodiment.
Figure 16B:
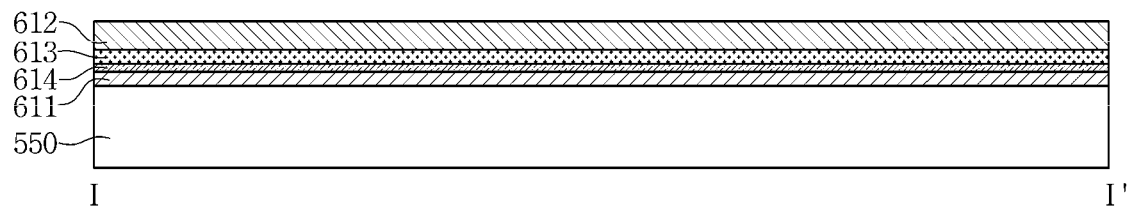
FIG. 16B is a cross-sectional view illustrating a partial process of manufacturing the display device of FIG. 16A.

FIG. 16A is a cross-sectional view illustrating a display device 109 according to the ninth exemplary embodiment, and FIG. 16B is a cross-sectional view illustrating a partial process of manufacturing the display device 109 of FIG. 16A.

The display device 109 according to the ninth exemplary embodiment includes a dichroic reflection layer 614 and a third compensation film 613 disposed between a base substrate 611 and a linear polarizer 612. The third compensation film 613 may be a viewing angle compensation film or a retardation film, for example.

Referring to FIG. 16B, in the process (refer to FIG. 15C) of disposing the base substrate 611, the dichroic reflection layer 614, and the linear polarizer 612 on a carrier substrate 550, the dichroic reflection layer 614 may be disposed on the base substrate 611, the third compensation film 613 may be disposed on the dichroic reflection layer 614, and then the linear polarizer 612 may be disposed on the third compensation film 613. Accordingly, the base substrate 611, the dichroic reflection layer 614, the third compensation film 613, and the linear polarizer 612 may be sequentially stacked.

Figure 17:
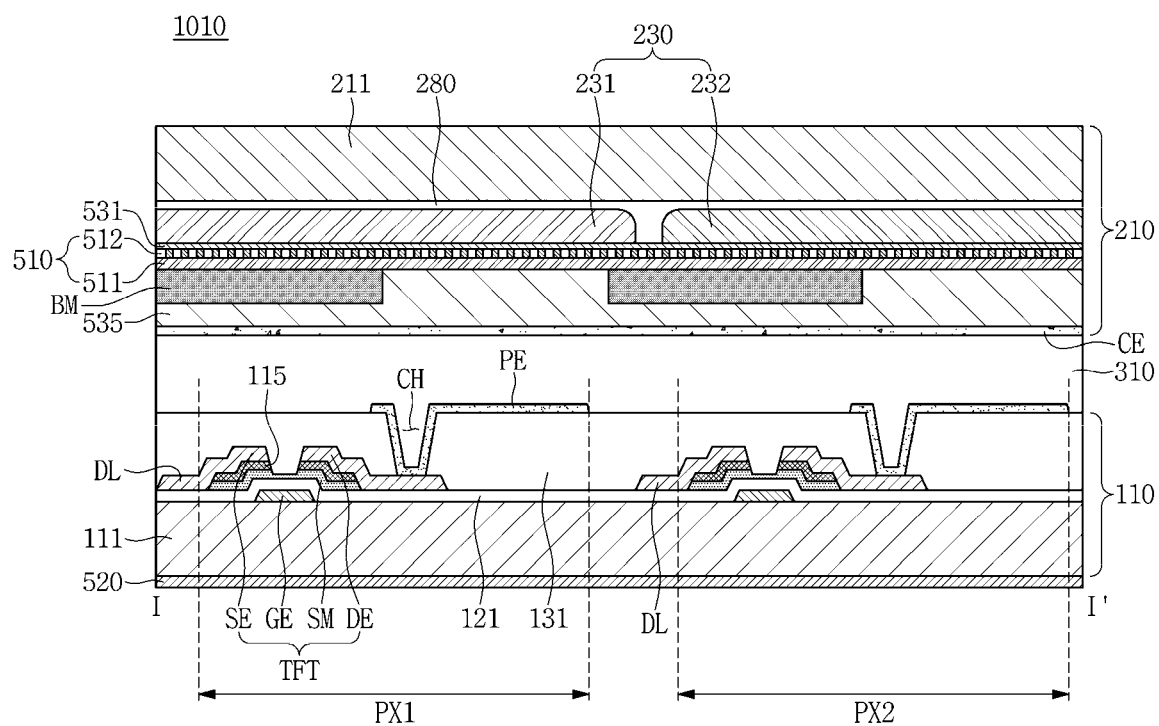
FIG. 17 is a cross-sectional view illustrating a display device according to a tenth exemplary embodiment.

FIG. 17 is a cross-sectional view illustrating a display device 1010 according to a tenth exemplary embodiment.

The display device 1010 according to the tenth exemplary embodiment includes a light blocking layer BM opposite to a color conversion layer 230 with respect to a first polarizer 510.

According to the tenth exemplary embodiment, the light blocking layer BM is disposed on a base substrate 511 of the first polarizer 510, an insulating planarization layer 535 is disposed on the light blocking layer BM, and a common electrode CE is disposed on the insulating planarization layer 535. Accordingly, the color conversion layer 230 and the light blocking layer BM may be disposed on different layers.

Figure 18:
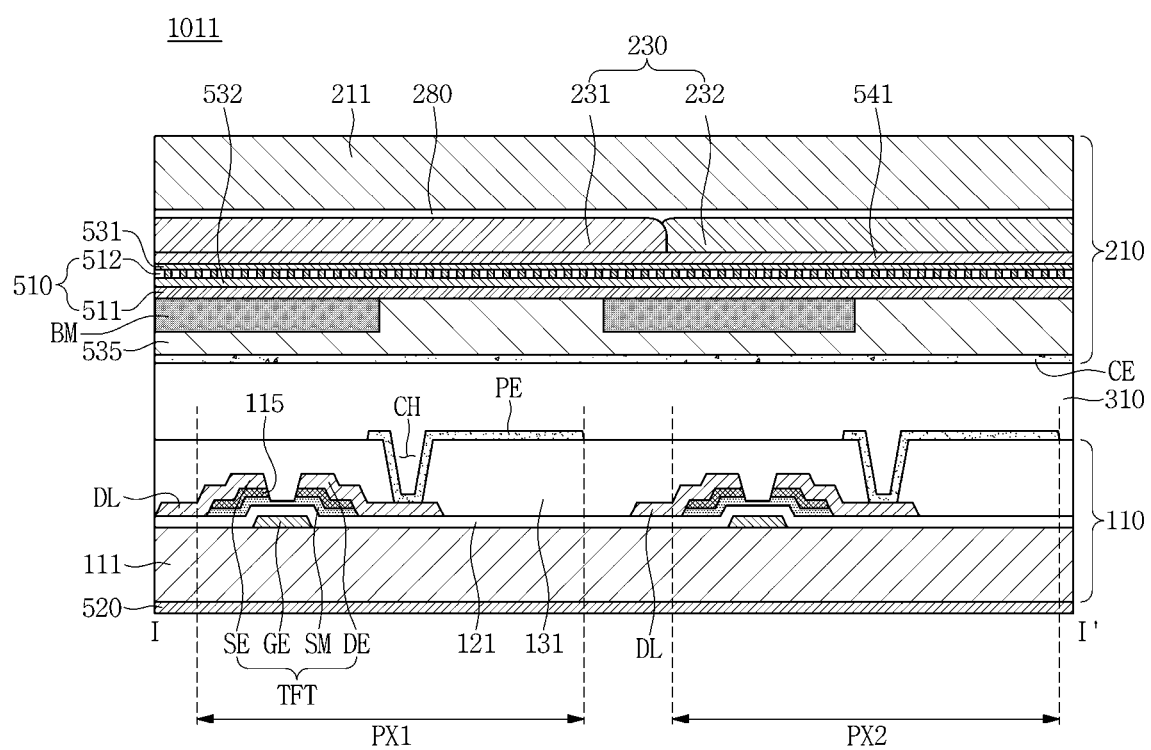
FIG. 18 is a cross-sectional view illustrating a display device according to an eleventh exemplary embodiment.

FIG. 18 is a cross-sectional view illustrating a display device 1011 according to an eleventh exemplary embodiment.

The display device 1011 according to the eleventh exemplary embodiment further includes a dichroic reflection layer 541 and a second passivation layer 532, as compared to the display device 1010 according to the tenth exemplary embodiment.

The dichroic reflection layer 541 transmits light having a predetermined wavelength among incident light and reflects light having another wavelength. According to the eleventh exemplary embodiment, the dichroic reflection layer 541 is disposed below the color conversion layer 230. Light incident from a backlight unit 410 is transmitted through the dichroic reflection layer 541, but red light and green light that have wavelengths converted by the color conversion layer 230 are reflected at the dichroic reflection layer 541.

The second passivation layer 532 is disposed between a base substrate 511 and a linear polarizer 512. The second passivation layer 532 prevents permeation of undesirable materials or unnecessary substances into the linear polarizer 512 and to planarize a surface of the base substrate 511.

In addition, referring to FIG. 18, a first color conversion portion 231 and a second color conversion portion 232 may overlap each other.

Figure 19:
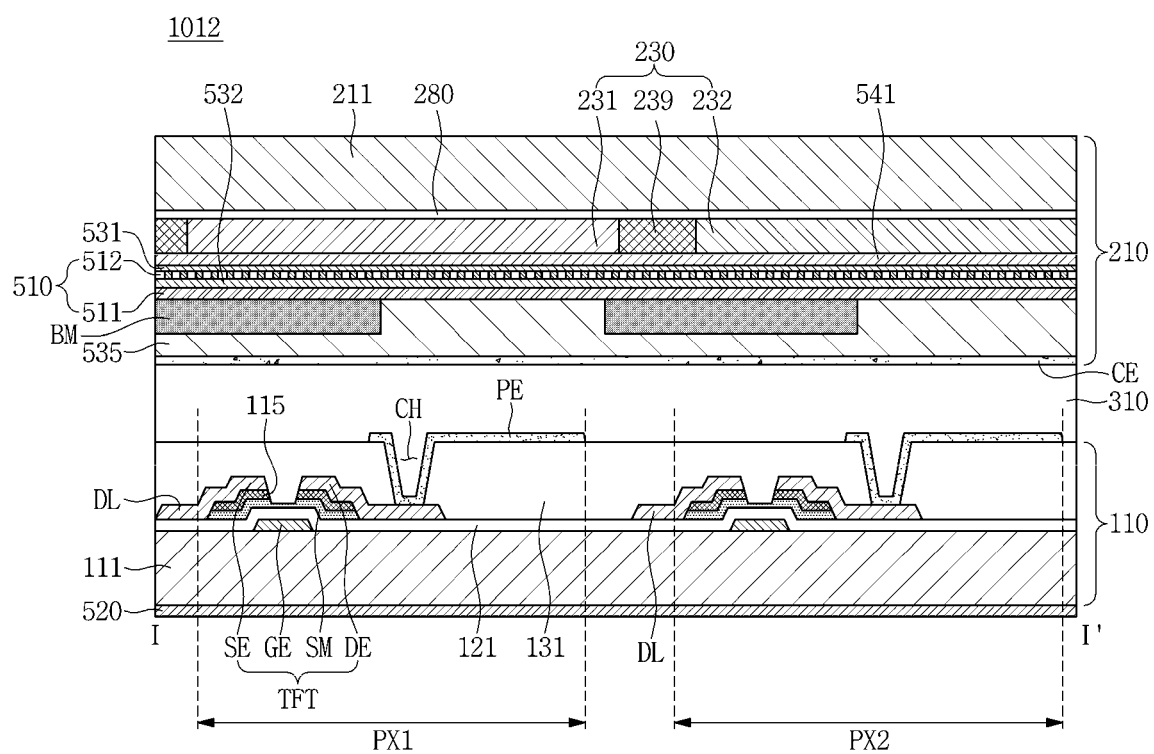
FIG. 19 is a cross-sectional view illustrating a display device according to a twelfth exemplary embodiment.

FIG. 19 is a cross-sectional view illustrating a display device 1012 according to a twelfth exemplary embodiment.

The display device 1012 according to the twelfth exemplary embodiment includes a bank 239 between a first color conversion portion 231 and a second color conversion portion 232. The bank 239 serves to separate the first color conversion portion 231 and the second color conversion portion 232, and to block light.

Light blocking is largely performed by a light blocking layer BM, and thus the bank 239 may have a less width than a width of the light blocking layer BM. In addition, color mixture between the first color conversion portion 231 and the second color conversion portion 232 may be prevented by the bank 239.

Referring to FIG. 19, the bank 239 is disposed to overlap the light blocking layer BM. For example, the bank 239 may be disposed to overlap a data line DL. Although not illustrated, the bank 239 may be disposed between a third color conversion portion (not illustrated) and the first color conversion portion 231 and between a third color conversion portion (not illustrated) and the second color conversion portion 232.

FIGS. 20A, 20B, 20C, 20D, 20E, 20F, 20G, 20H, and 20I are cross-sectional views illustrating a process of manufacturing the display device 1012 according to the twelfth exemplary embodiment.

Figure 20A:
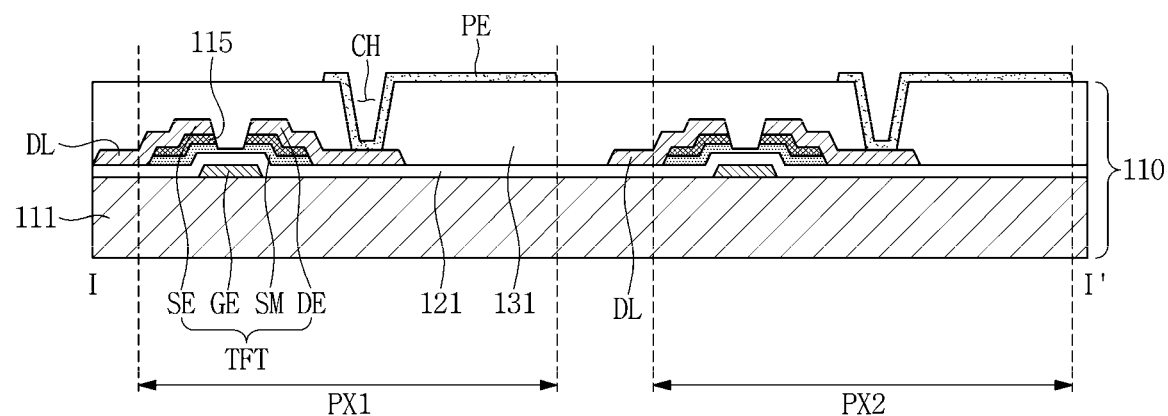
FIGS. 20A, 20B, 20C, 20D, 20E, 20F, 20G, 20H, and 20I are cross-sectional views illustrating a process of manufacturing the display device according to the twelfth exemplary embodiment.

First, as illustrated in FIG. 20A, a display substrate 110 is manufactured.

Figure 20B:
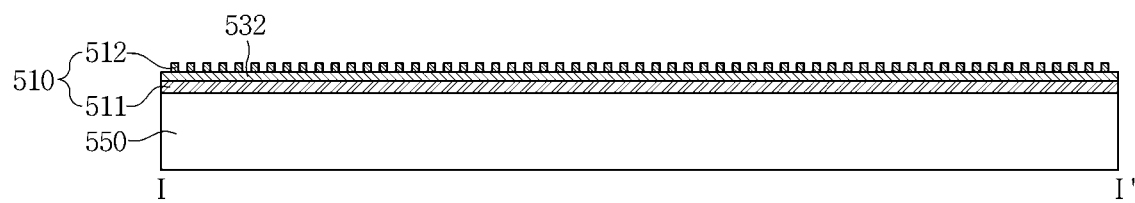

Referring to FIG. 20B, a first polarizer 510 is formed on a carrier substrate 550.

In order to form the first polarizer 510, a base substrate 511 is disposed on the carrier substrate 550. Subsequently, a second passivation layer 532 is disposed on the base substrate 511, and a linear polarizer 512 is disposed on the second passivation layer 532.

Figure 20C:
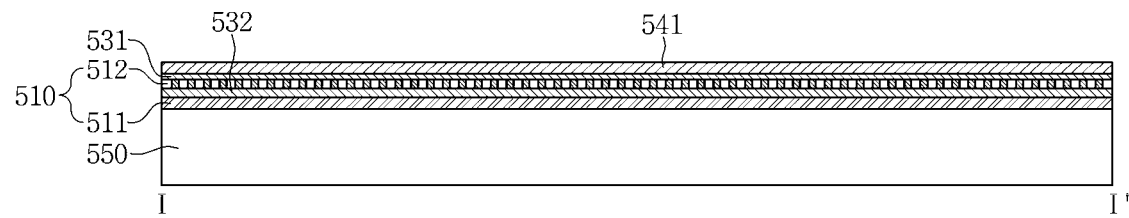

Referring to FIG. 20C, a first passivation layer 531 is disposed on the linear polarizer 512, and a dichroic reflection layer 541 is disposed on the first passivation layer 531.

Figure 20D:
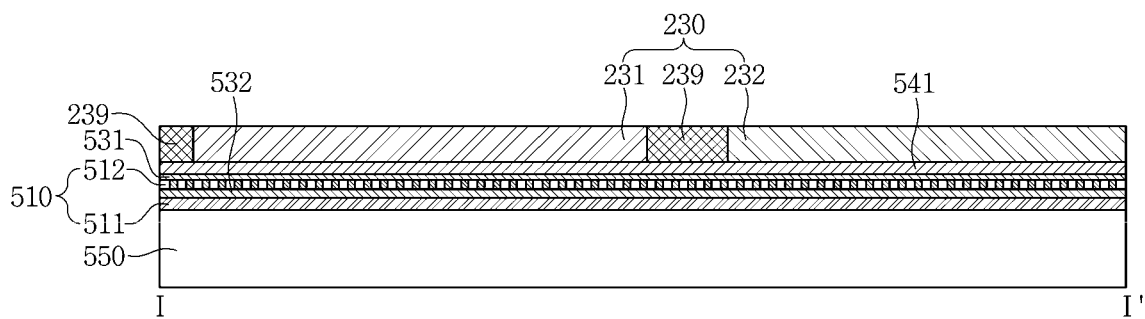

Referring to FIG. 20D, a color conversion layer 230 is disposed on the dichroic reflection layer 541.

The color conversion layer 230 includes the first color conversion portion 231 and the second color conversion portion 232. Each of the first color conversion portion 231 and the second color conversion portion 232 may be one of a red color conversion portion, a green color conversion portion, and a blue color conversion portion. Although not illustrated, the color conversion layer 230 may include a third color conversion portion and may include a transmissive portion.

In addition, the color conversion layer 230 includes the bank 239. The bank 239 defines a boundary among the color conversion portions 231 and 232, and each of the first color conversion portion 231 and the second color conversion portion 232 is disposed in an area defined by the bank 239.

Figure 20E:
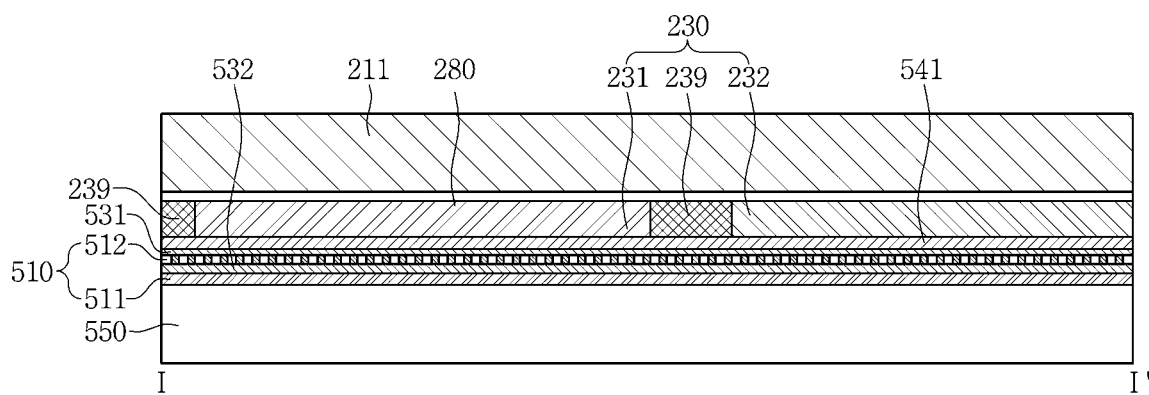

Referring to FIG. 20E, a second substrate 211 is disposed on the color conversion layer 230. In order to attach the second substrate 211 to the color conversion layer 230, an adhesion layer 280 is disposed between the second substrate 211 and the color conversion layer 230. The adhesion layer 280 has light transmittance.

Figure 20F:
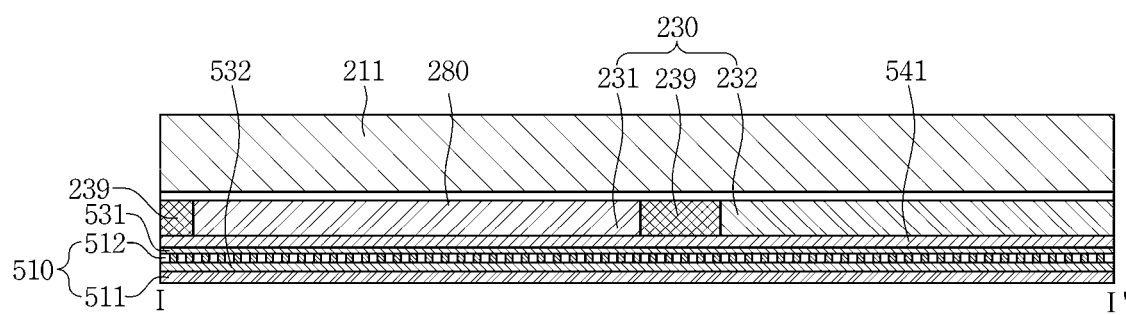

Referring to FIG. 20F, the carrier substrate 550 is removed. The carrier 550 to be removed is detached from the base substrate 511.

Figure 20G:
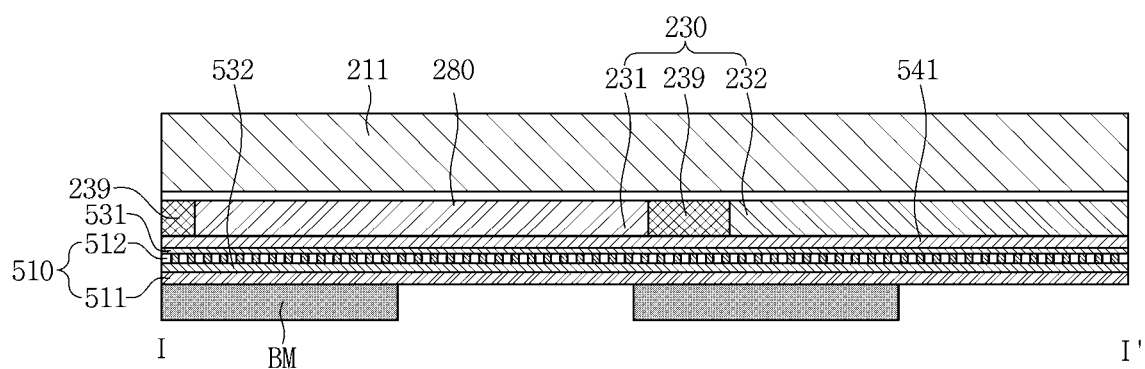

Referring to FIG. 20G, the light blocking layer BM is disposed on the base substrate 511. The light blocking layer BM is disposed opposite to the linear polarizer 512 with respect to the base substrate 511. Hereinafter, one of surfaces of the base substrate 511 opposite to the first polarizer 510 is referred to as a rear surface of the base substrate 511.

Figure 20H:
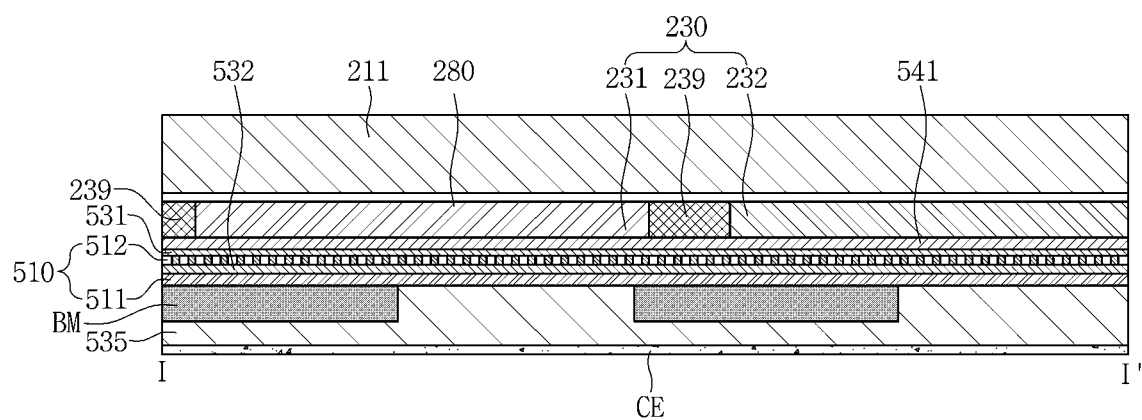

Referring to FIG. 20H, an insulating planarization layer 535 is disposed on the light blocking layer BM, and a common electrode CE is disposed on the insulating planarization layer 535.

The insulating planarization layer 535 may improve flatness of the rear surface of the base substrate 511. The insulating planarization layer 535 may include, for example, an organic layer, and may have a thickness of about 50 µm or less. The insulating planarization layer 535 may be disposed over an entire surface of the base substrate 511.

The common electrode CE may be provided in methods known in the pertinent art. Accordingly, the opposing substrate 210 may be provided.

Figure 20I:
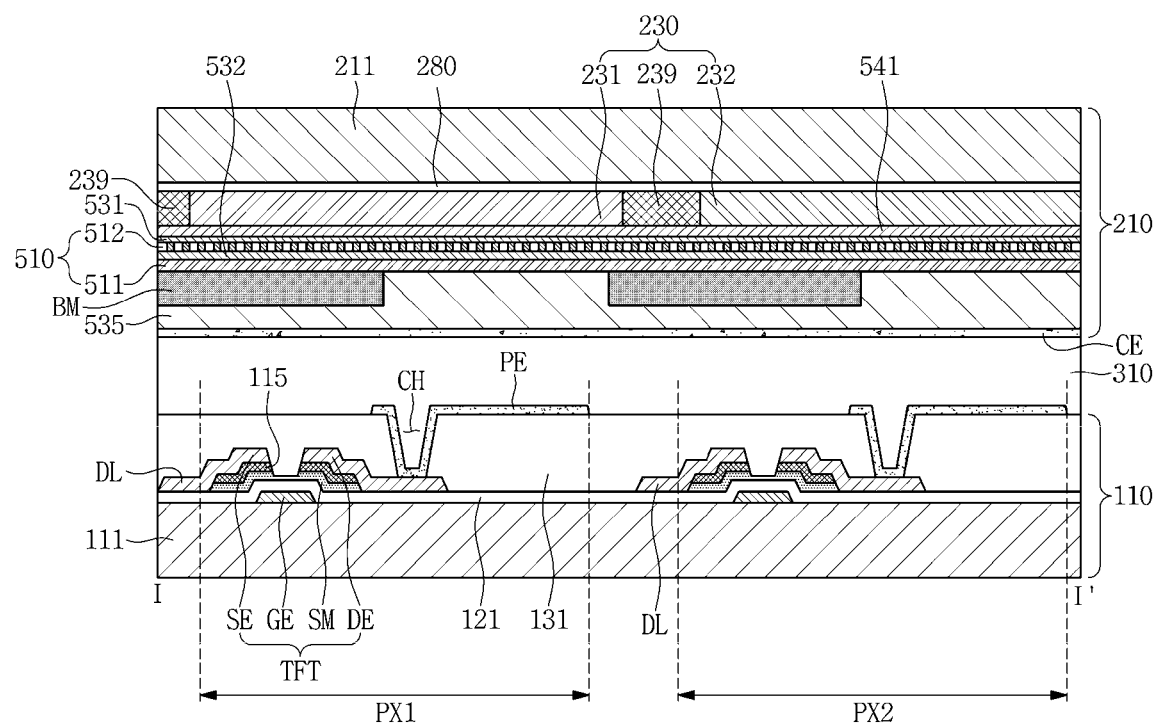

Referring to FIG. 20I, an opposing substrate 210 manufactured in the process of FIG. 20H is disposed to oppose the display substrate 110, and a liquid crystal layer which is a light amount control layer 310 is disposed between the opposing substrate 210 and the display substrate 110.

Subsequently, a second polarizer 520 is disposed on the display substrate 110. For example, the second polarizer 520 may be disposed on a rear surface of the first substrate 111. The second polarizer 520 may be a linear polarizer including polyvinyl alcohol (PVA), for example. In addition, although not illustrated, a compensation film may be disposed on the second polarizer 520.

Figure 21:
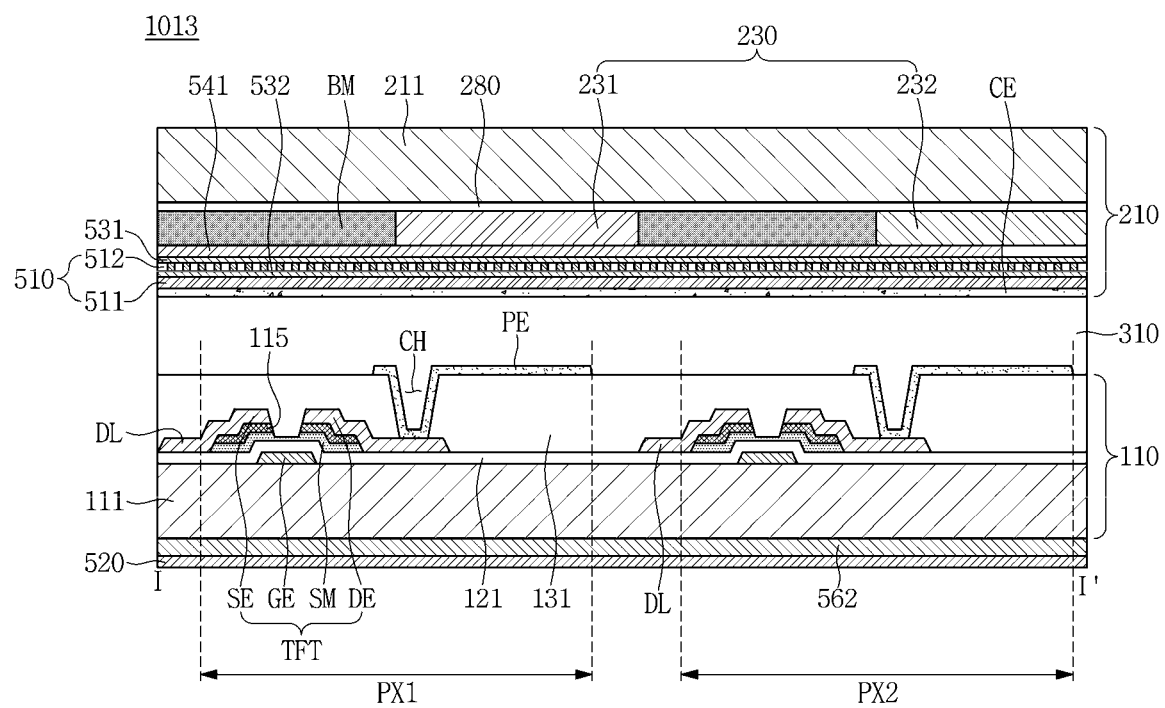
FIG. 21 is a cross-sectional view illustrating a display device according to a thirteenth exemplary embodiment.

FIG. 21 is a cross-sectional view illustrating a display device 1013 according to a thirteenth exemplary embodiment.

The display device 1013 according to the thirteenth exemplary embodiment further includes a second compensation film 562 between a second polarizer 520 and a first substrate 111, as compared to the display device 102 according to the second exemplary embodiment.

The second compensation film 562 may be a viewing angle compensation film or a retardation film, for example. The retardation film may be at least one of a quarter-wave plate or a half-wave plate.

Figure 22:
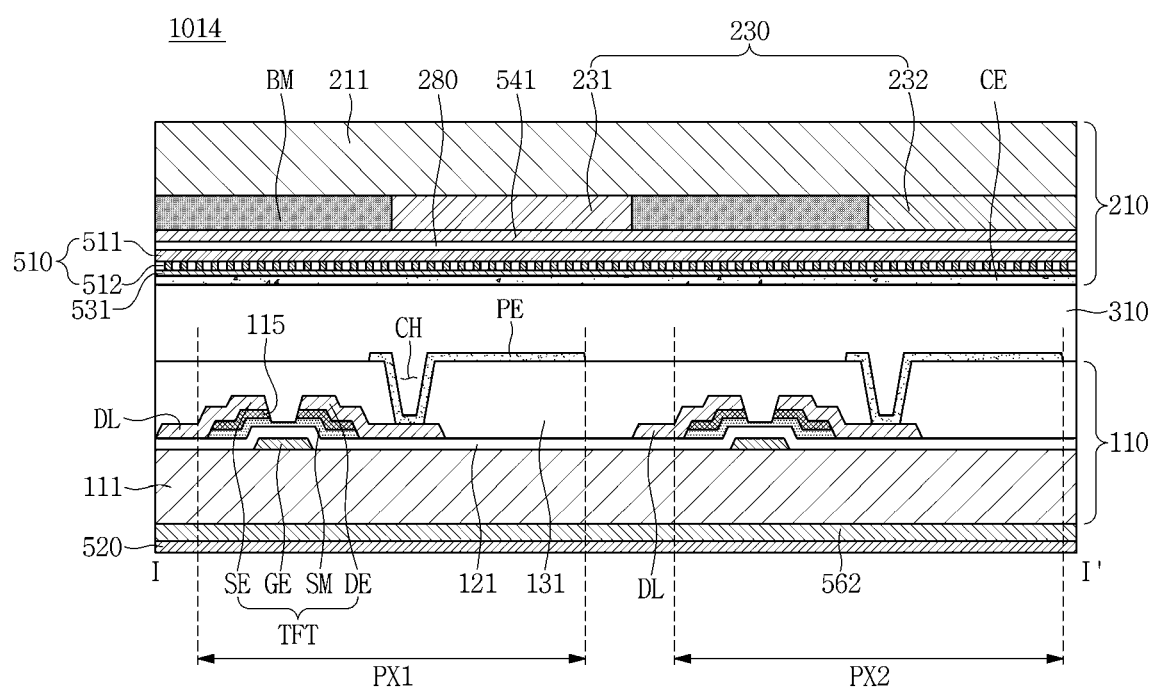
FIG. 22 is a cross-sectional view illustrating a display device according to a fourteenth exemplary embodiment.

FIG. 22 is a cross-sectional view illustrating a display device 1014 according to a fourteenth exemplary embodiment.

The display device 1014 according to the fourteenth exemplary embodiment further includes a dichroic reflection layer 541 and a second compensation film 562, as compared to the display device 104 according to the fourth exemplary embodiment.

The dichroic reflection layer 541 is disposed below a color conversion layer 230. Referring to FIG. 22, the dichroic reflection layer 541 is disposed between the color conversion layer 230 and an adhesion layer 280 having light transmittance.

The second compensation film 562 is disposed between a second polarizer 520 and a first substrate 111. The second compensation film 562 may be a viewing angle compensation film or a retardation film, for example.

Figure 23:
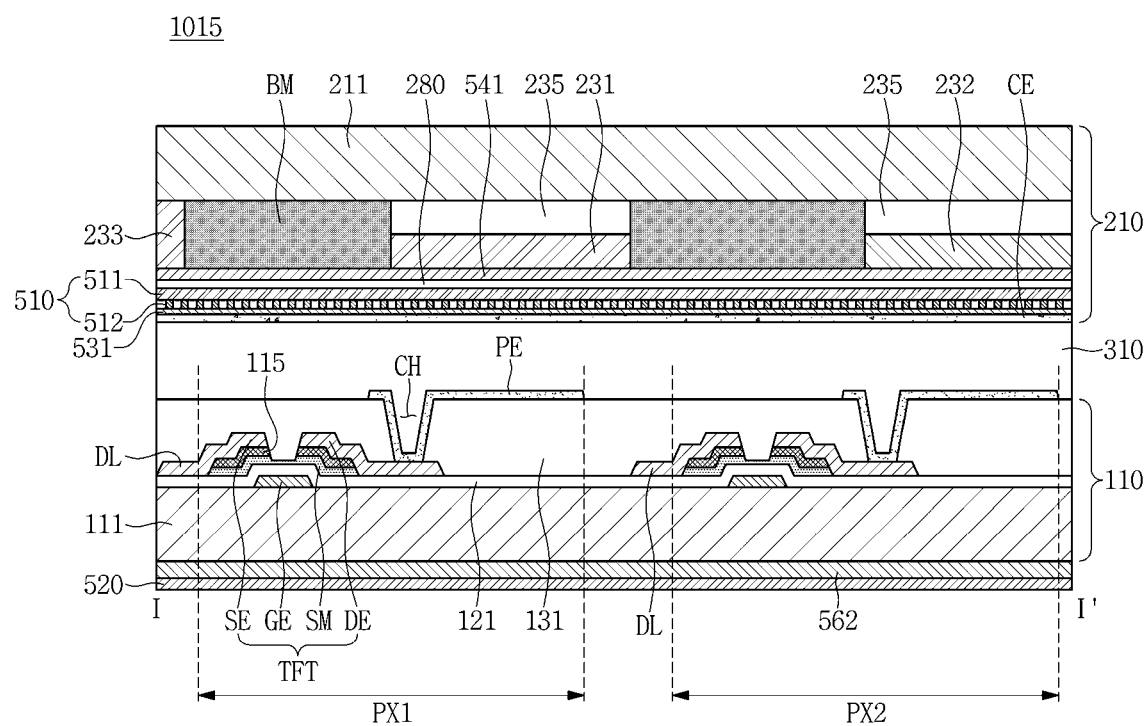
FIG. 23 is a cross-sectional view illustrating a display device according to a fifteenth exemplary embodiment.

FIG. 23 is a cross-sectional view illustrating a display device 1015 according to a fifteenth exemplary embodiment.

The display device 1015 according to the fifteenth exemplary embodiment includes a yellow color filter 235.

For example, the display device 1015 according to the fifteenth exemplary embodiment includes a first color conversion portion 231 which is a red color conversion portion, a second color conversion portion 232 which is a green color conversion portion, a transmissive portion 233 which transmits blue light, and the yellow color filter 235 on the first color conversion portion 231 and the second color conversion portion 232. The yellow color filter 235 absorbs blue light and transmits red light and green light.

According to the fifteenth exemplary embodiment, blue light is emitted from a backlight unit 410. Among blue light incident to the first color conversion portion 231, light that has been converted into red light is transmitted through the yellow color filter 235, and blue light that is not converted into red light is absorbed by the yellow color filter 235. In addition, among blue light incident to the second color conversion portion 232, light that has been converted into green light is transmitted through the yellow color filter 235, and blue light that is not converted into green light is absorbed by the yellow color filter 235. Accordingly, distinct colors of red and green may be realized in a red pixel and a green pixel, respectively, such that display quality of the display device 1015 may be improved.

In an exemplary embodiment, blue light incident to the transmissive portion 233 is transmitted through the transmissive portion to display a blue color.

Figure 24:
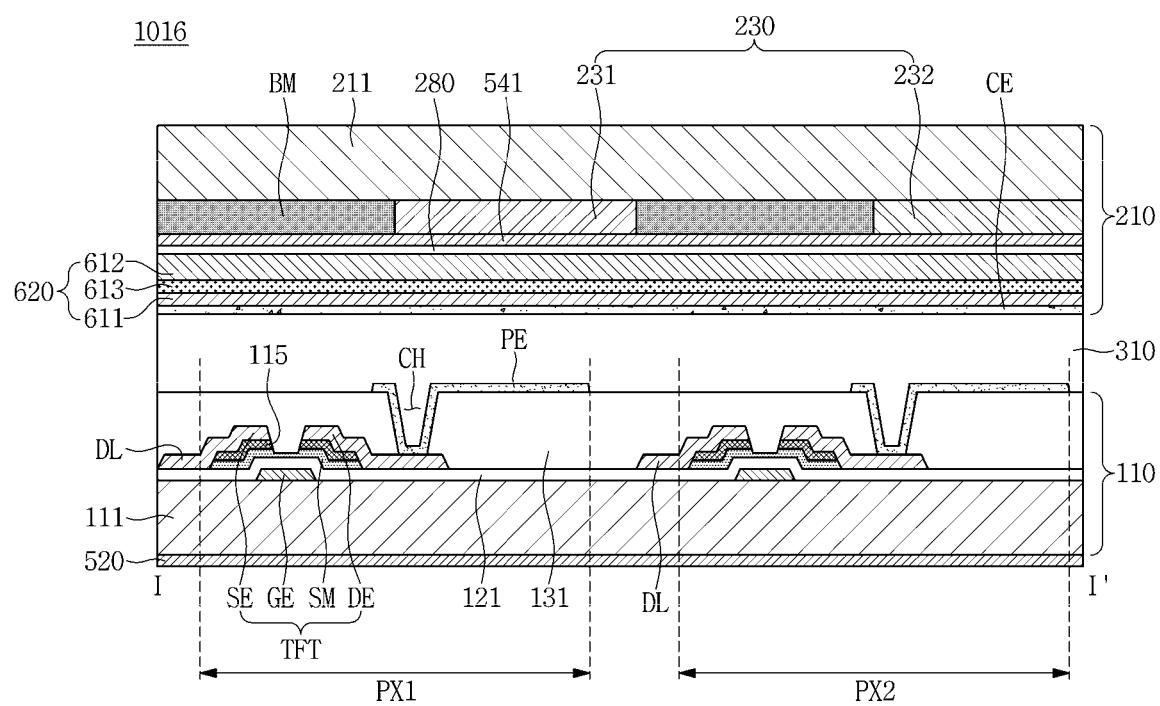
FIG. 24 is a cross-sectional view illustrating a display device according to a sixteenth exemplary embodiment.

FIG. 24 is a cross-sectional view illustrating a display device 1016 according to a sixteenth exemplary embodiment.

The display device 1016 according to the sixteenth exemplary embodiment further includes a dichroic reflection layer 541, as compared to the display device 107 according to the seventh exemplary embodiment.

Referring to FIG. 24, the dichroic reflection layer 541 is disposed between a color conversion layer 230 and an adhesion layer 280 having light transmittance.

Figure 25:
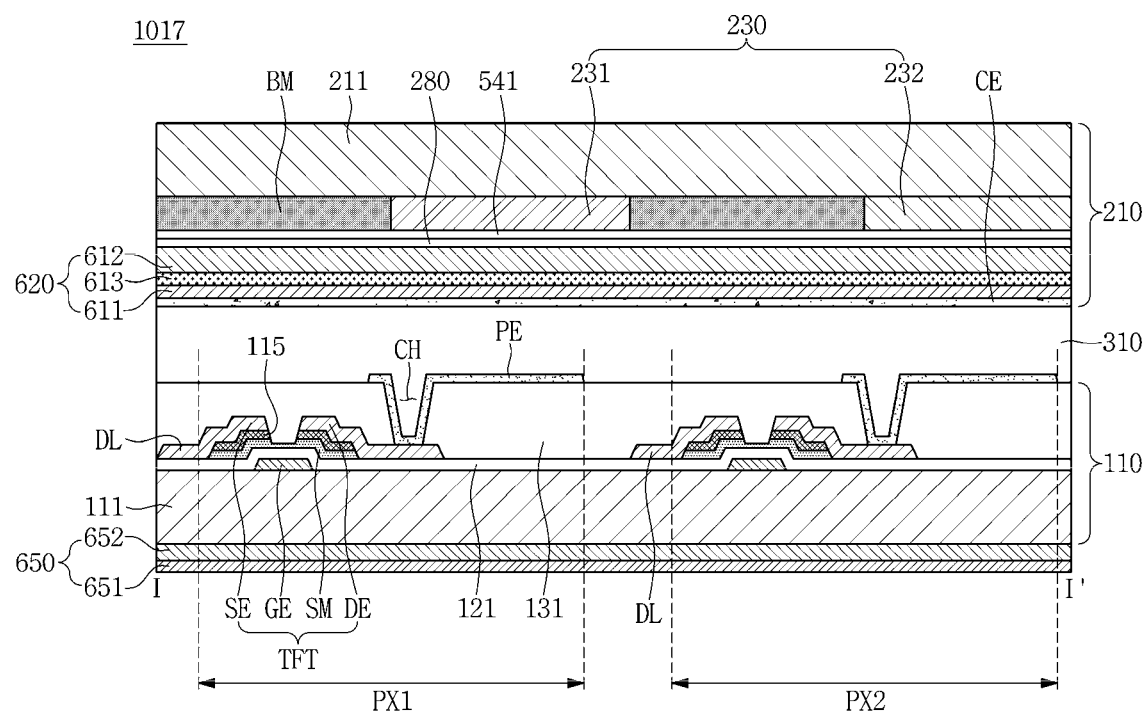
FIG. 25 is a cross-sectional view illustrating a display device according to a seventeenth exemplary embodiment.

FIG. 25 is a cross-sectional view illustrating a display device 1017 according to a seventeenth exemplary embodiment.

The display device 1017 according to the seventeenth exemplary embodiment includes a second polarizer 650. The second polarizer 650 includes a PVA layer 651 which serves as a linear polarizer and an optical compensation film 652 on the PVA layer 651. The optical compensation film 652 may be a viewing angle compensation film or a retardation film, for example.

Figure 26:
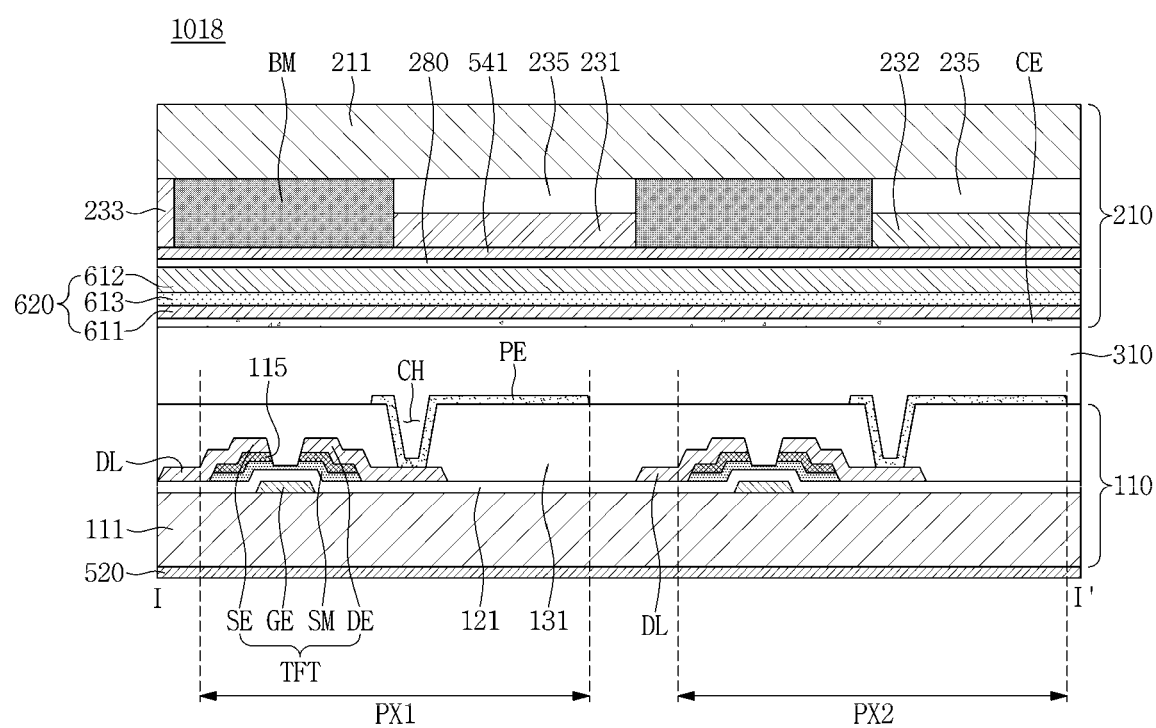
FIG. 26 is a cross-sectional view illustrating a display device according to an eighteenth exemplary embodiment.

FIG. 26 is a cross-sectional view illustrating a display device 1018 according to an eighteenth exemplary embodiment.

The display device 1018 according to the eighteenth exemplary embodiment includes a yellow color filter 235, as compared to the display device 1016 according to the sixteenth exemplary embodiment.

For example, the display device 1018 according to the eighteenth exemplary embodiment includes a first color conversion portion 231 which is a red color conversion portion, a second color conversion portion 232 which is a green color conversion portion, and a transmissive portion 233 which transmits blue light, and further includes the yellow color filter 235 on the first color conversion portion 231 and the second color conversion portion 232. The yellow color filter 235 absorbs blue light and transmits red light and green light. Accordingly, distinct colors of red and green may be realized in a red pixel and a green pixel, respectively, such that display quality of the display device 1018 may be improved.

Figure 27:
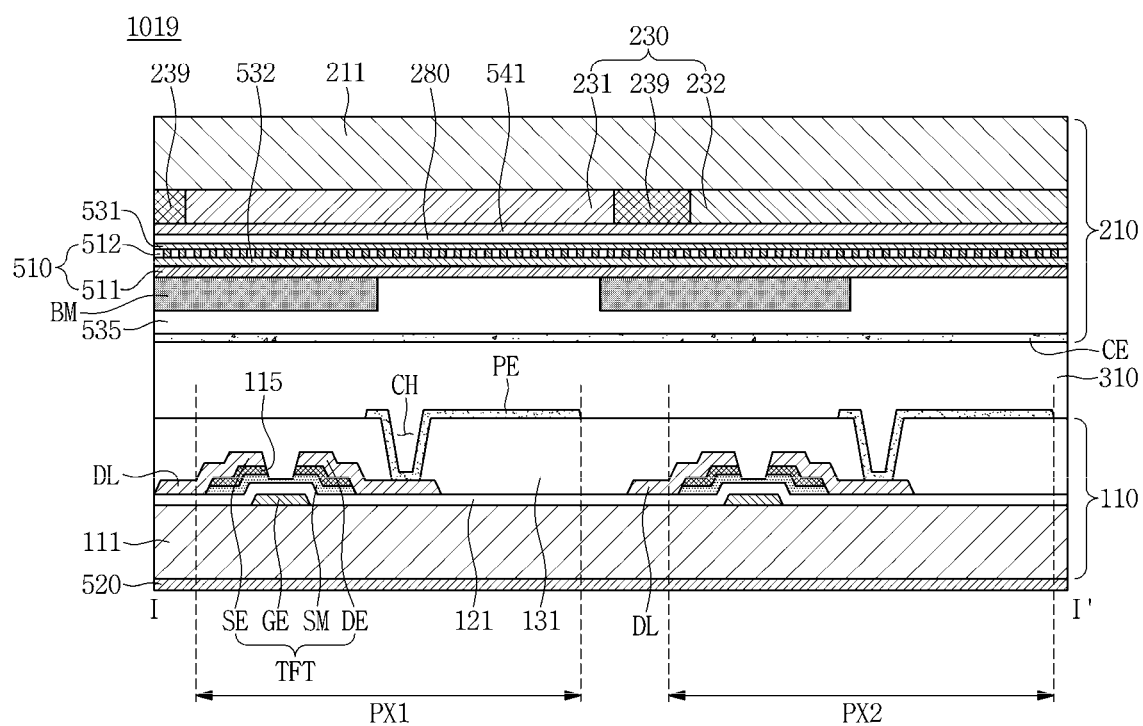
FIG. 27 is a cross-sectional view illustrating a display device according to a nineteenth exemplary embodiment.

FIG. 27 is a cross-sectional view illustrating a display device 1019 according to a nineteenth exemplary embodiment.

The display device 1019 according to the nineteenth exemplary embodiment includes a color conversion layer 230 and a light blocking layer BM that are disposed opposite sides of a first polarizer 510.

According to the nineteenth exemplary embodiment, an adhesion layer 280, a dichroic reflection layer 541, and the color conversion layer 230 are sequentially disposed on one surface of the first polarizer 510, and the light blocking layer BM, an insulating planarization layer 535, and a common electrode CE are disposed on another surface of the first polarizer 510.

In addition, the display device 1019 according to the nineteenth exemplary embodiment includes a first passivation layer 531 and a second passivation layer 532.

Referring to FIG. 27, a bank 239 is disposed between a first color conversion portion 231 and a second color conversion portion 232. Light blocking is largely performed by the light blocking layer BM, and thus the bank 239 may have a less width than a width of the light blocking layer BM. In addition, color mixture between the first color conversion portion 231 and the second color conversion portion 232 may be prevented by the bank 239.

The bank 239 is disposed to overlap the light blocking layer BM, and in particular, may overlap a data line DL.

FIGS. 28A, 28B, 28C, 28D, 28E, 28F, 28G, and 28H are cross-sectional views illustrating a process of manufacturing the display device 1019 according to the nineteenth exemplary embodiment.

Figure 28A:
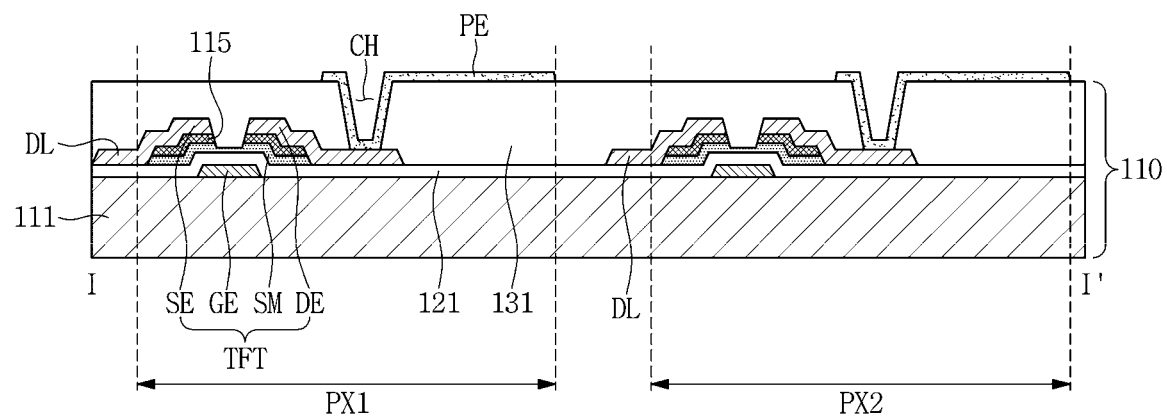
FIGS. 28A, 28B, 28C, 28D, 28E, 28F, 28G, and 28H are cross-sectional views illustrating a process of manufacturing the display device according to the nineteenth exemplary embodiment.

First, as illustrated in FIG. 28A, a display substrate 110 is manufactured.

Figure 28B:
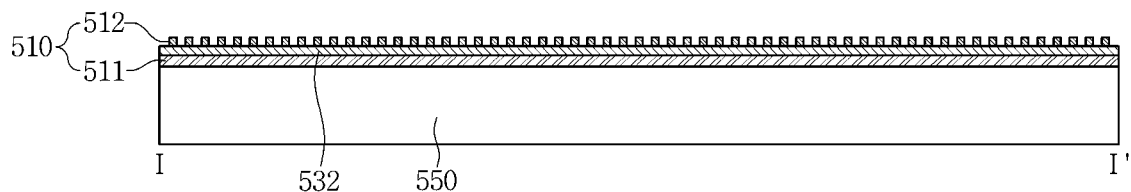

Referring to FIG. 28B, the first polarizer 510 is formed on a carrier substrate 550.

In order to form the first polarizer 510, a base substrate 511 is disposed on the carrier substrate 550. Subsequently, the second passivation layer 532 is disposed on the base substrate 511, and a linear polarizer 512 is disposed on the second passivation layer 532.

Figure 28C:
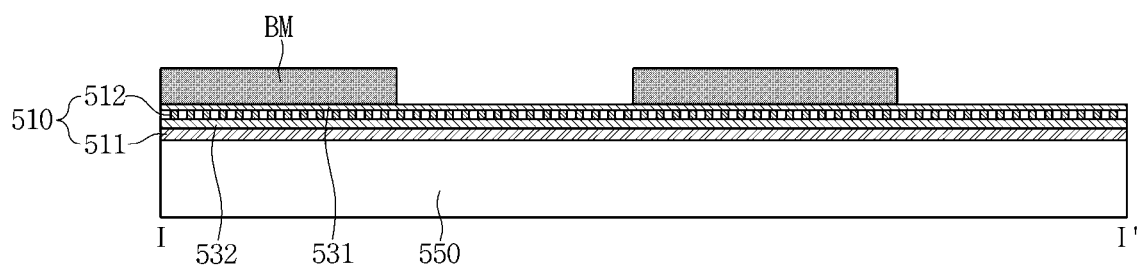

Referring to FIG. 28C, the first passivation layer 531 is disposed on the linear polarizer 512, and the light blocking layer BM is disposed on the first passivation layer 531.

Figure 28D:
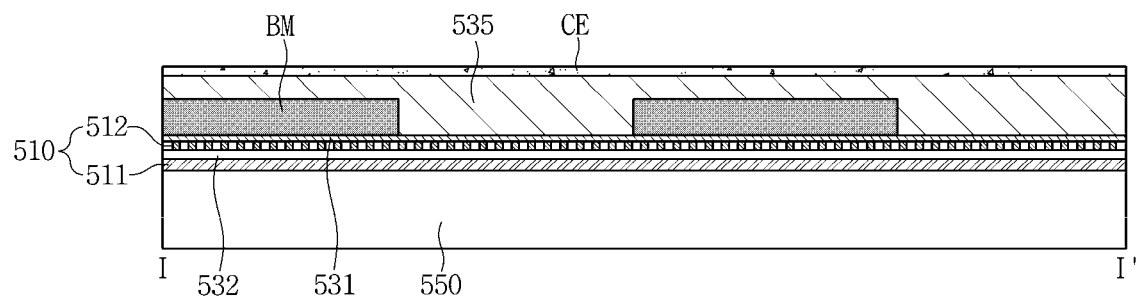

Referring to FIG. 28D, the insulating planarization layer 535 is disposed on the light blocking layer BM, and the common electrode CE is disposed on the insulating planarization layer 535. The insulating planarization layer 535 may include an organic layer, for example, and may have a thickness of about 50 μm or less. The insulating planarization layer 535 is disposed over an entire surface of the base substrate 511. The common electrode CE may be provided in methods known in the pertinent art. Accordingly, an opposing substrate 210 may be provided.

Figure 28E:
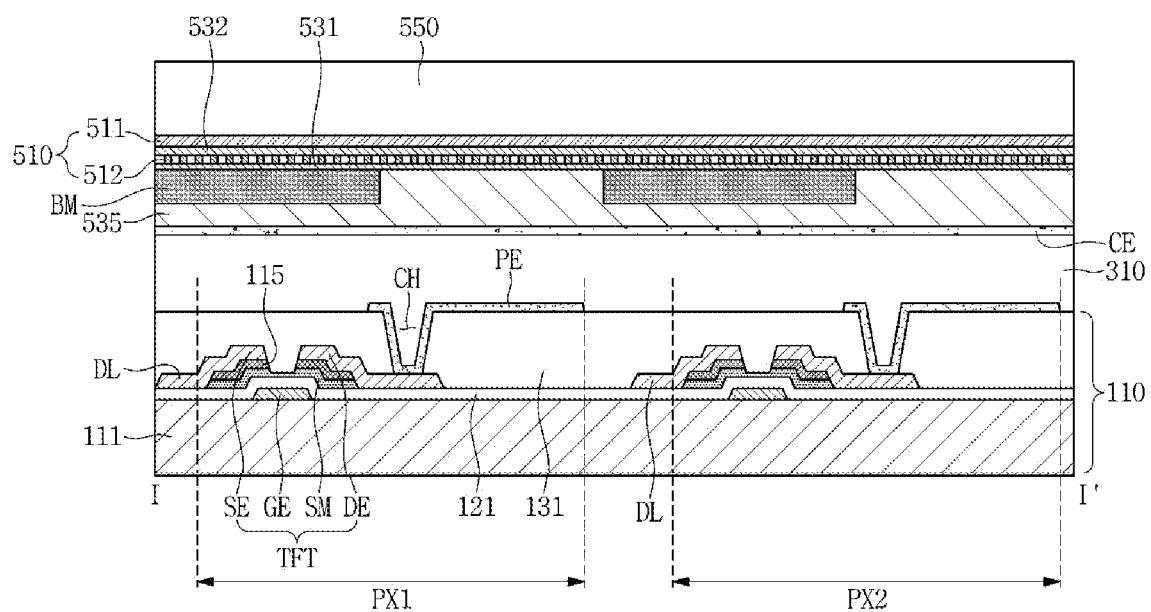

Referring to FIG. 28E, the common electrode CE disposed on the first polarizer 510 is disposed to oppose the display substrate 110, and a liquid crystal layer which is a light amount control layer 310 is disposed between the common electrode CE and the display substrate 110.

Figure 28F:
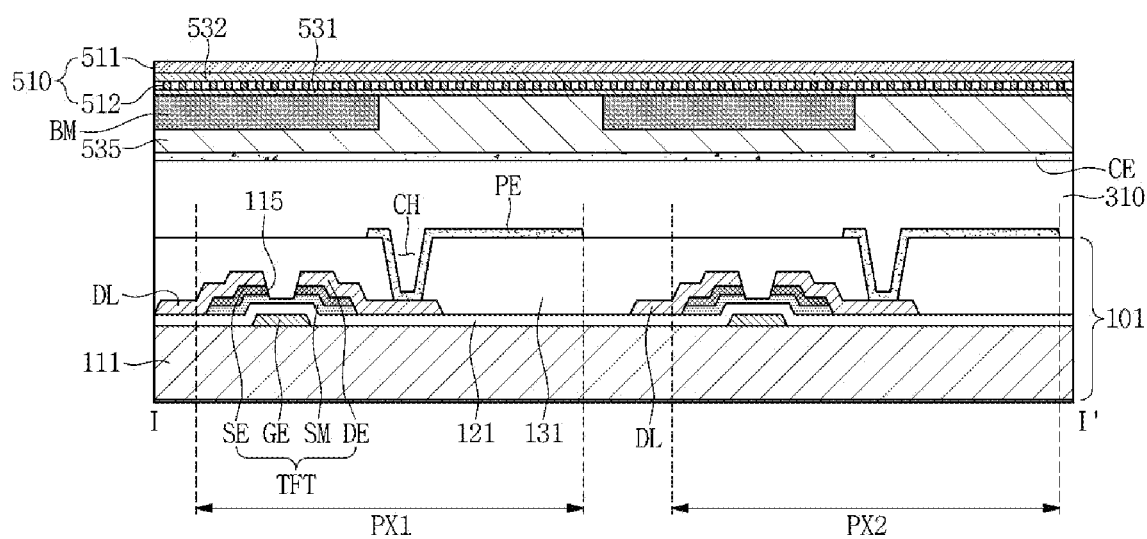

Referring to FIG. 28F, the carrier substrate 550 is removed. The carrier substrate 550 to be removed is detached from the base substrate 511 of the first polarizer 510.

Figure 28G:
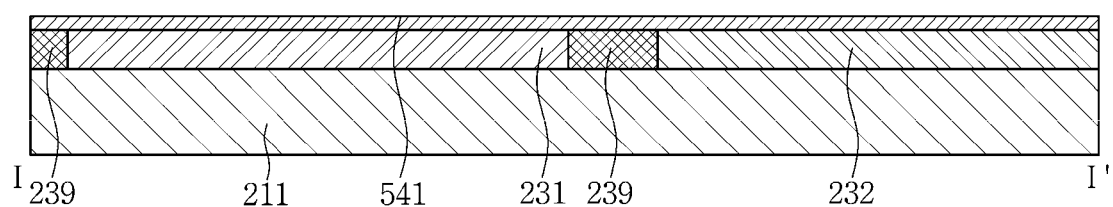

Referring to FIG. 28G, the first color conversion portion 231, the second color conversion portion 232, and the bank 239 are disposed on a second substrate 211. The bank 239 is disposed between the first color conversion portion 231 and the second color conversion portion 232. The dichroic reflection layer 541 is disposed on the first color conversion portion 231, the second color conversion portion 232, and the bank 239. Accordingly, a color conversion substrate may be provided.

Figure 28H:
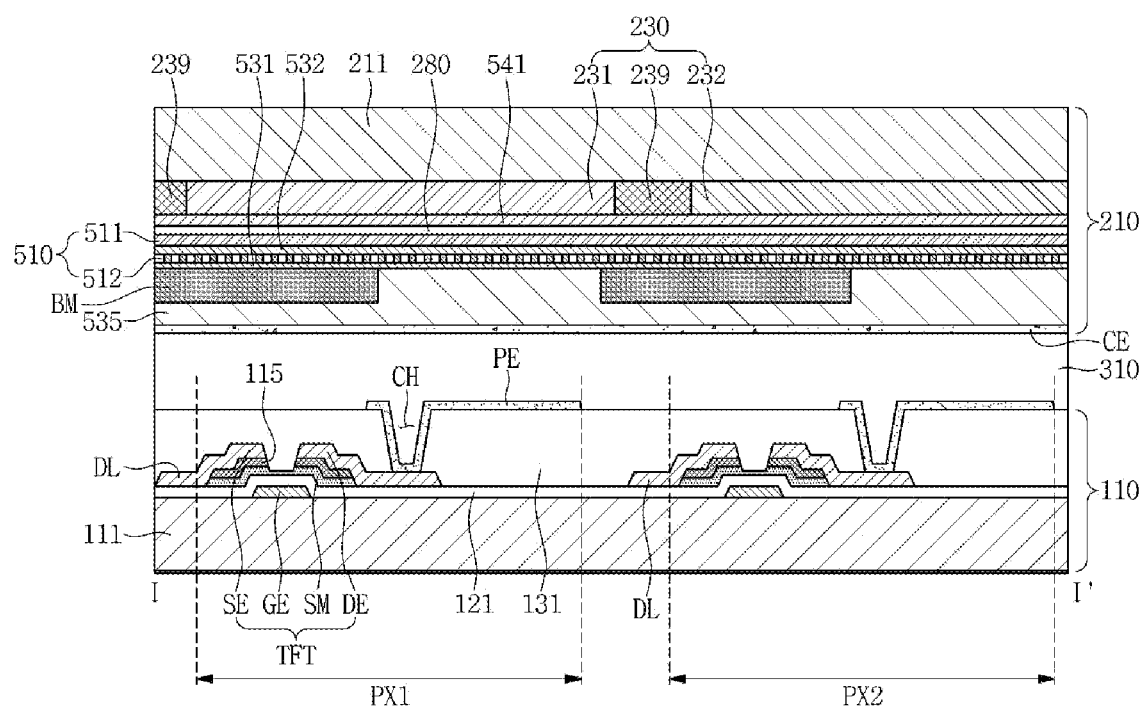

Referring to FIG. 28H, the second substrate 211, the color conversion layer 230, and the dichroic reflection layer 541 are disposed on the first polarizer 510. In such an exemplary embodiment, the dichroic reflection layer 541 is attached to the base substrate 511 of the first polarizer 510. In order to attach the dichroic reflection layer 541 to the base substrate 511, the adhesion layer 280 is disposed between the dichroic reflection layer 541 and the base substrate 511. The adhesion layer 280 has light transmittance.

Subsequently, a second polarizer 520 is disposed on the display substrate 110 such that the display device 1019 illustrated in FIG. 27 is provided.

Figure 29:
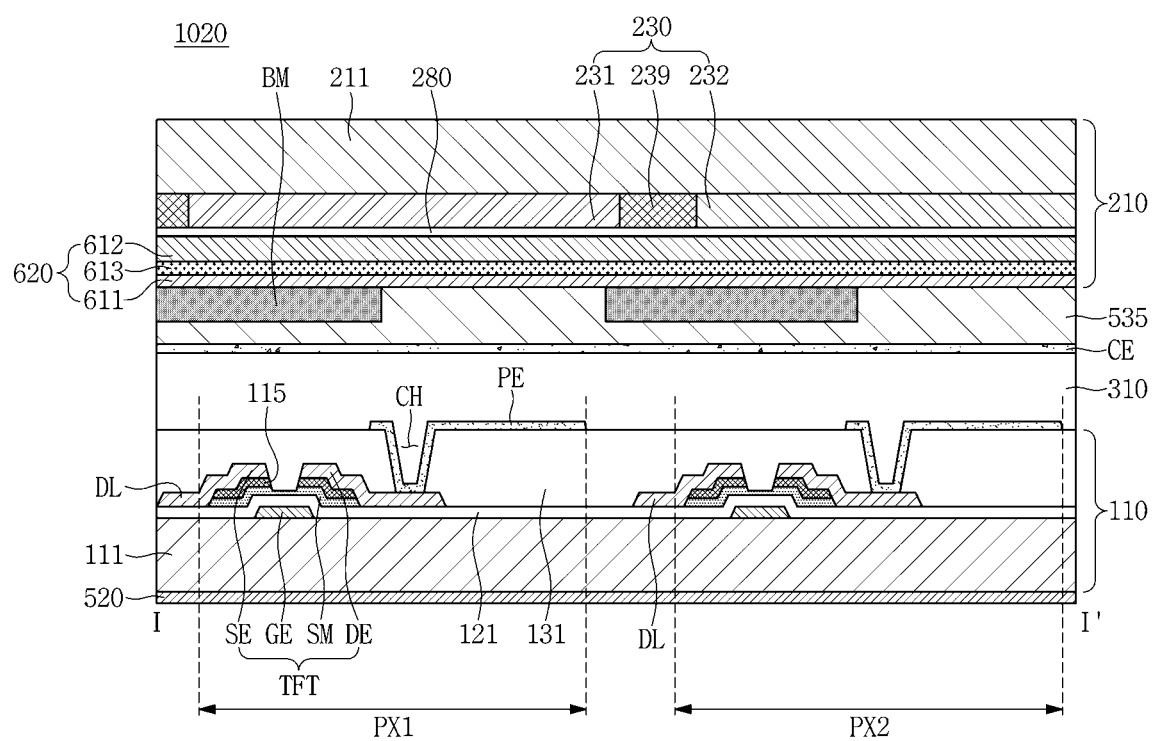
FIG. 29 is a cross-sectional view illustrating a display device according to a twentieth exemplary embodiment.

FIG. 29 is a cross-sectional view illustrating a display device 1020 according to a twentieth exemplary embodiment.

The display device 1020 according to the twentieth exemplary embodiment includes a color conversion layer 230 and a light blocking layer BM disposed on opposite sides of a first polarizer 620, respectively. The first polarizer 620 includes a base substrate 611, a third compensation film 613, and a linear polarizer 612 which are sequentially stacked. The third compensation film 613 may be a viewing angle compensation film or a retardation film, for example.

According to the twentieth exemplary embodiment, an adhesion layer 280 and the color conversion layer 230 are sequentially disposed on one surface of the first polarizer 620, and the light blocking layer BM, an insulating planarization layer 535, and a common electrode CE are disposed on another surface of the first polarizer 620.

In addition, referring to FIG. 29, a bank 239 is disposed between a first color conversion portion 231 and a second color conversion portion 232. The bank 239 is disposed to overlap the light blocking layer BM and in particular, may overlap a data line DL.

FIGS. 30A, 30B, 30C, 30D, 30E, 30F, and 30G are cross-sectional views illustrating a process of manufacturing the display device 1020 according to the twentieth exemplary embodiment.

Figure 30A:
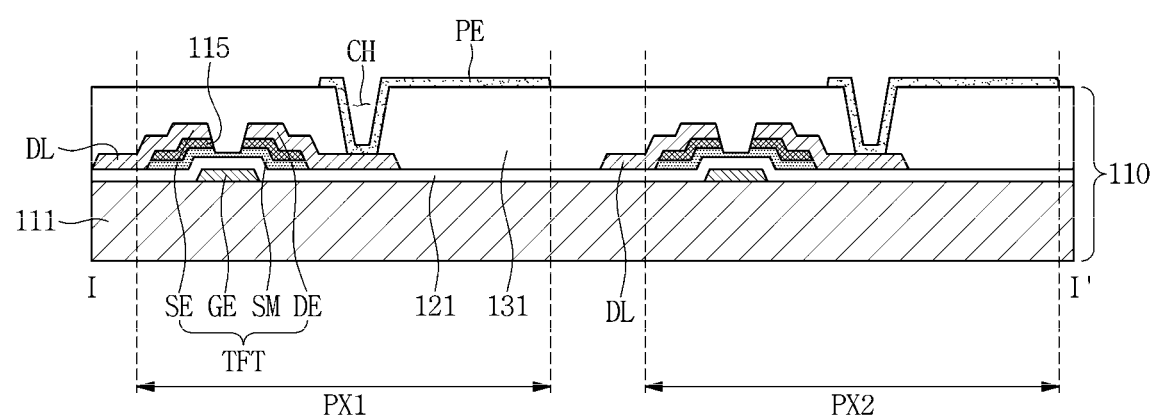
FIGS. 30A, 30B, 30C, 30D, 30E, 30F, and 30G are cross-sectional views illustrating a process of manufacturing the display device according to the twentieth exemplary embodiment.

First, as illustrated in FIG. 30A, a display substrate 110 is manufactured.

Figure 30B:
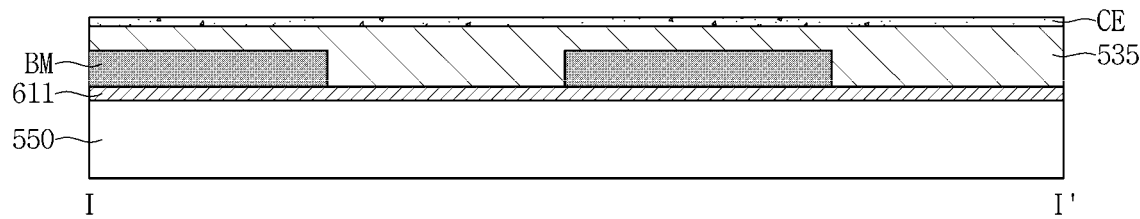

Subsequently, referring to FIG. 30B, the base substrate 611 of the first polarizer 620 is disposed on a carrier substrate 550, and the light blocking member BM is disposed on the base substrate 611. In addition, the insulating planarization layer 535 is disposed on the light blocking layer BM, and the common electrode CE is disposed on the insulating planarization layer 535.

Figure 30C:
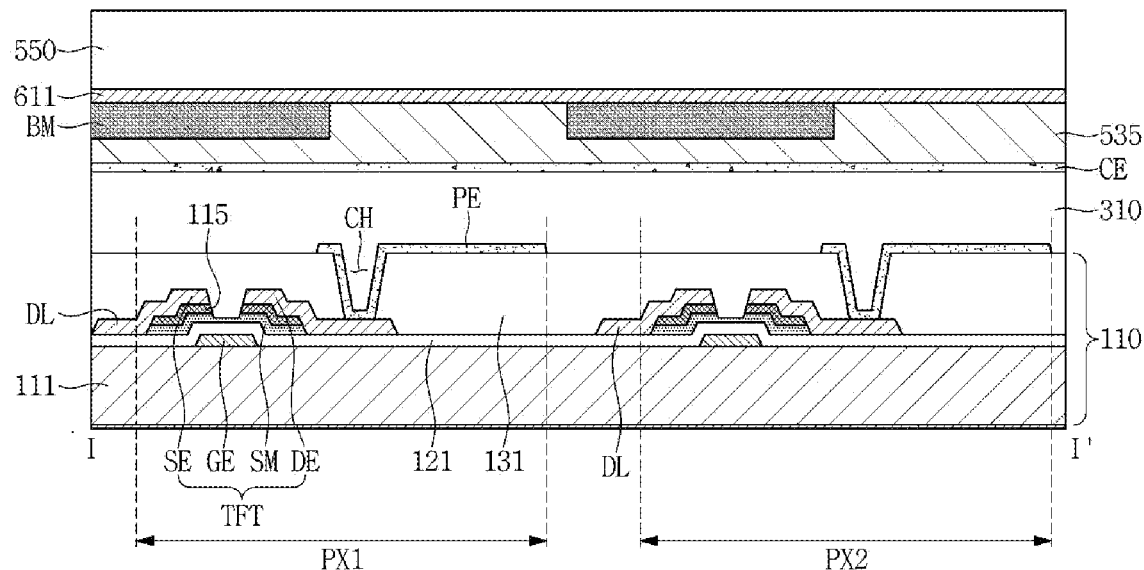

Referring to FIG. 30C, the common electrode CE is disposed to oppose the display substrate 110, and a liquid crystal layer which is a light amount control layer 310 is disposed between the common electrode CE and the display substrate 110.

Figure 30D:
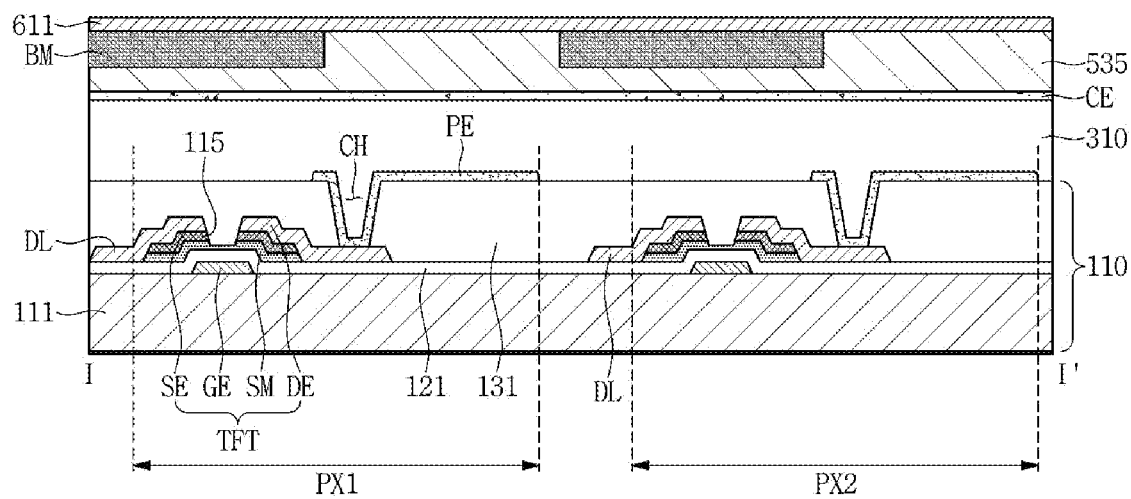

Referring to FIG. 30D, the carrier substrate 550 is removed. The carrier substrate 550 to be removed is detached from the base substrate 611.

Figure 30E:
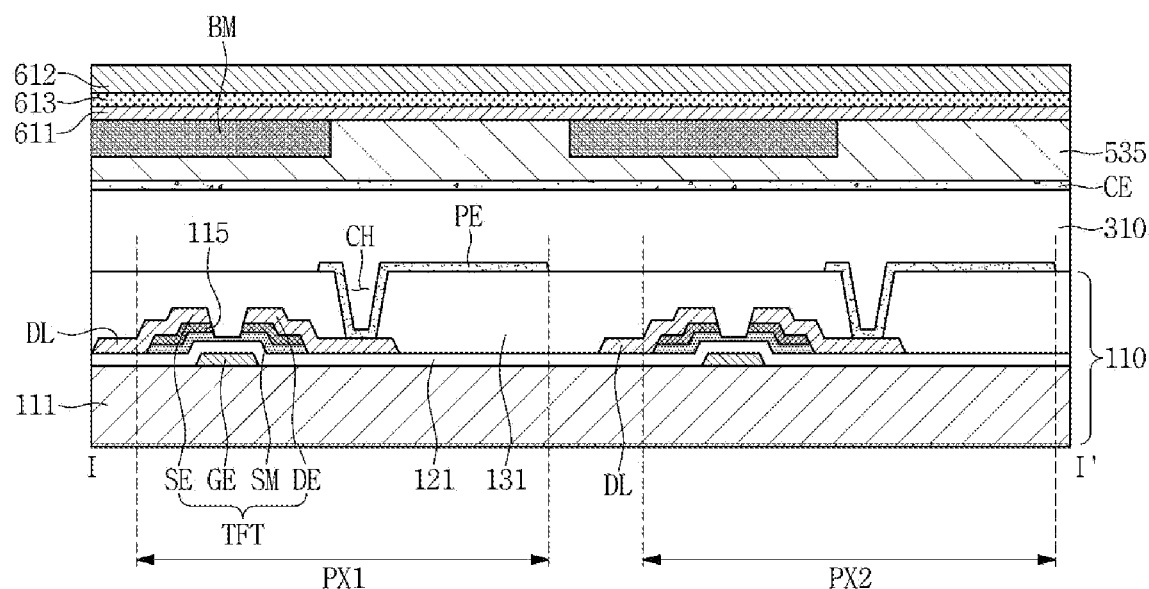

Referring to FIG. 30E, the third compensation film 613 is disposed on the base substrate 611 and the linear polarizer 612 is disposed on the third compensation film 613. In such an exemplary embodiment, the third compensation film 613 may be a viewing angle compensation film or a retardation film, for example. The linear polarizer 612 may be a linear polarizer, having a film shape, which includes polyvinyl alcohol (PVA).

Figure 30F:
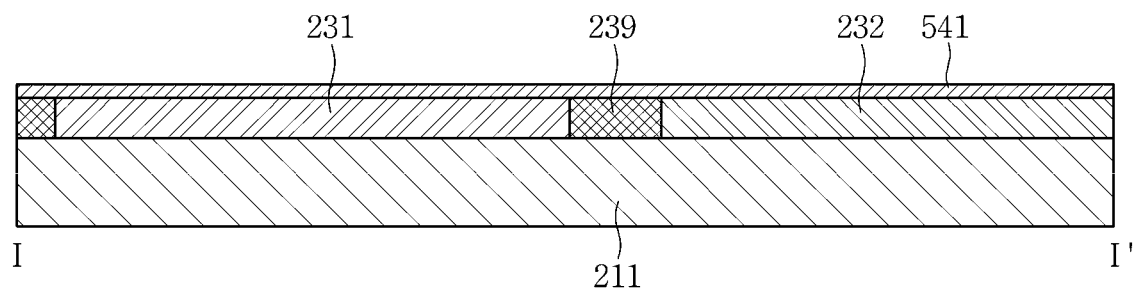

Referring to FIG. 30F, the bank 239 is disposed on a second substrate 211, and the first color conversion portion 231 and the second color conversion portion 232 are disposed in areas defined by the bank 239. In addition, a dichroic reflection layer 541 is disposed on the bank 239, the first color conversion portion 231, and the second color conversion portion 232.

Figure 30G:
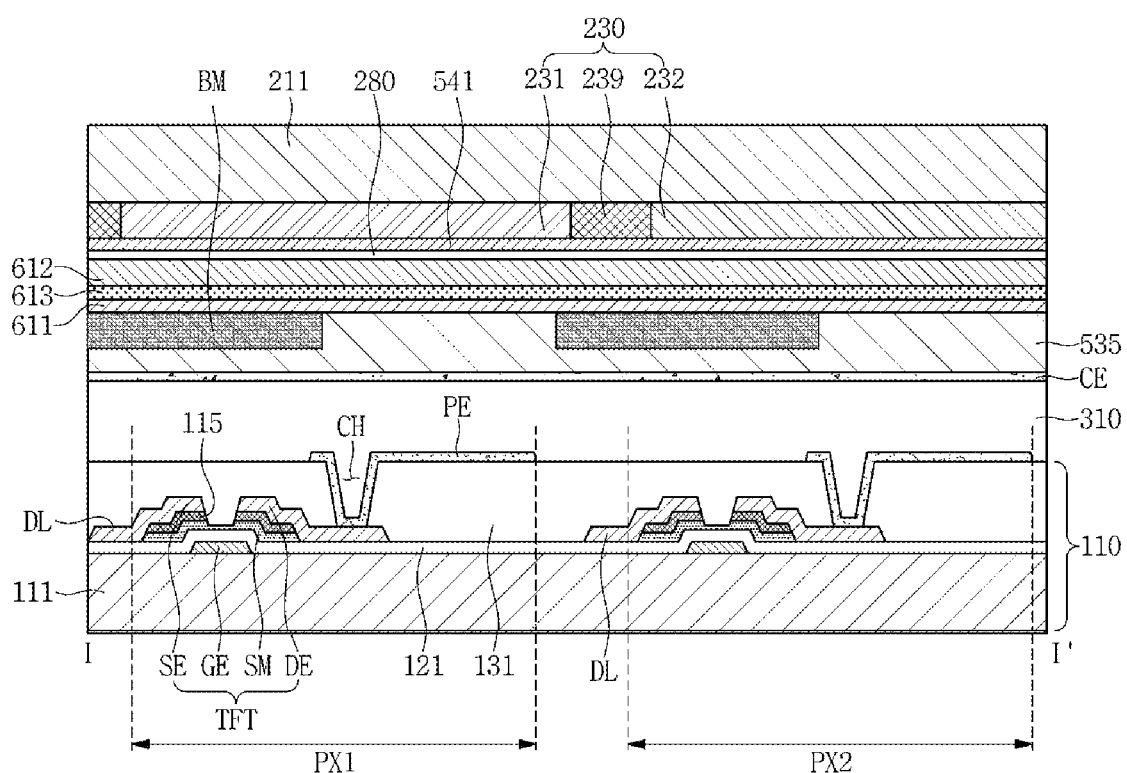

Referring to FIG. 30G, the second substrate 211 including the color conversion layer 230 and the dichroic reflection layer 541 is disposed on the linear polarizer 612. In such an exemplary embodiment, the dichroic reflection layer 541 is attached to the linear polarizer 612. In order to attach the dichroic reflection layer 541 to the linear polarizer 612, the adhesion layer 280 is disposed between the dichroic reflection layer 541 and the linear polarizer 612. The adhesion layer 280 may be an optically clear adhesive (OCA) having light transmittance.

Subsequently, a second polarizer 520 is disposed on the display substrate 110, such that the display device 1020 of FIG. 29 is provided.

FIGS. 31A, 31B, 31C, 31D, 31E, 31F, 31G, and 31H are cross-sectional views illustrating an alternative process of manufacturing the display device 1020 according to the twentieth exemplary embodiment.

Figure 31A:
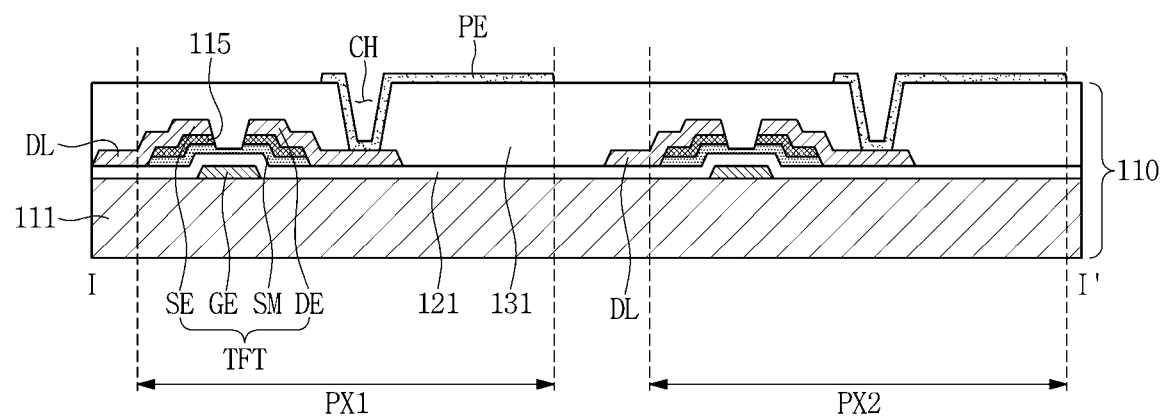
FIGS. 31A, 31B, 31C, 31D, 31E, 31F, 31G, and 31H are cross-sectional views illustrating an alternative process of manufacturing the display device according to the twentieth exemplary embodiment.

First, as illustrated in FIG. 31A, the display substrate 110 is manufactured.

Figure 31B:
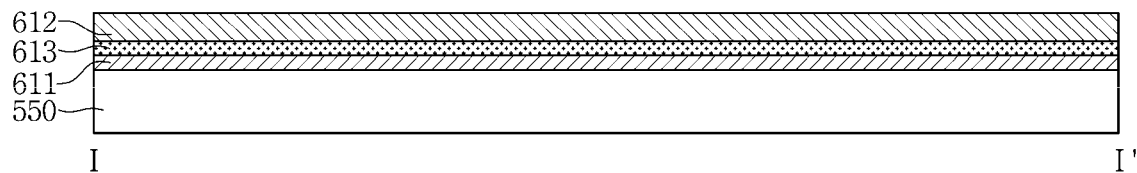

Subsequently, referring to FIG. 31B, the base substrate 611, the third compensation film 613, and the linear polarizer 612 are sequentially stacked on the carrier substrate 550 such that the first polarizer 620 is provided (refer to FIG. 29).

Figure 31C:
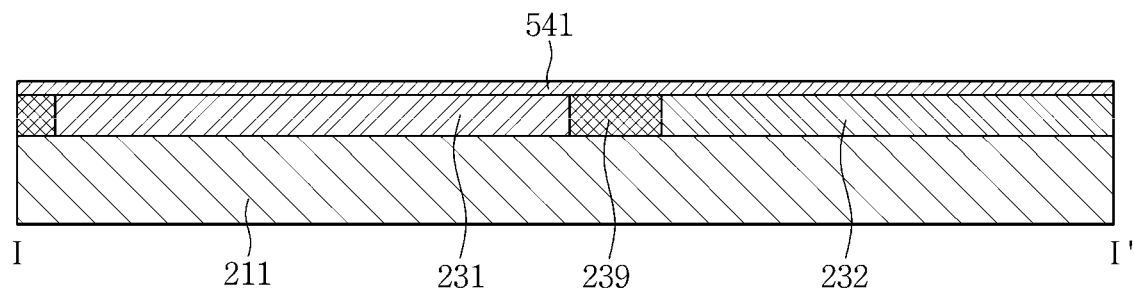

Referring to FIG. 31C, the bank 239 is disposed on the second substrate 211, and the first color conversion portion 231 and the second color conversion portion 232 are disposed in areas defined by the bank 239. In addition, the dichroic reflection layer 541 is disposed on the bank 239, the first color conversion portion 231, and the second color conversion portion 232.

Figure 31D:
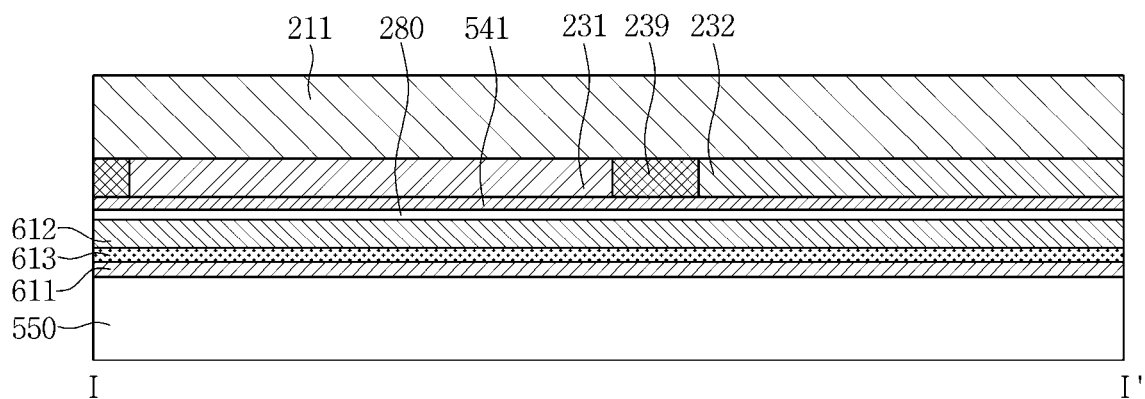

Referring to FIG. 31D, the linear polarizer 612 formed on the carrier substrate 550 and the dichroic reflection layer 541 formed on the second substrate 211 are attached to each other. In order to attach the linear polarizer 612 to the dichroic reflection layer 541, the adhesion layer 280 is disposed between the linear polarizer 612 and the dichroic reflection layer 541.

Figure 31E:
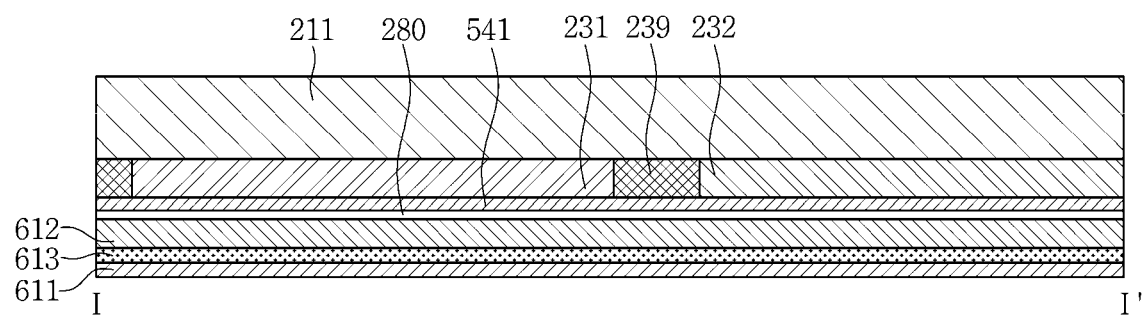

Referring to FIG. 31E, the carrier substrate 550 is removed. The carrier substrate 550 to be removed is detached from the base substrate 611.

Figure 31F:
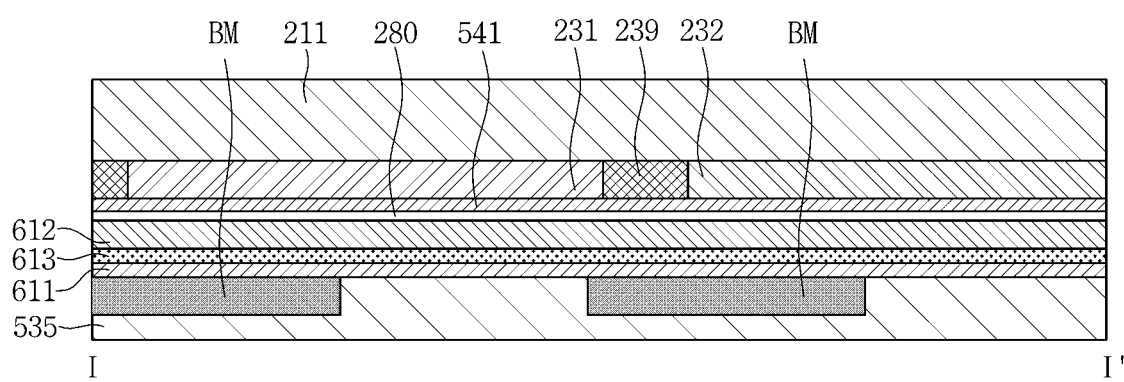

Referring to FIG. 31F, the light blocking layer BM is disposed on the base substrate 611. The light blocking layer BM is disposed opposite to the linear polarizer 612. In addition, the insulating planarization layer 535 is disposed on the light blocking layer BM. The insulating planarization layer 535 may include, for example, an organic layer, and may have a thickness of about 50 μm or less. The insulating planarization layer 535 is disposed over an entire surface of the base substrate 511.

Figure 31G:
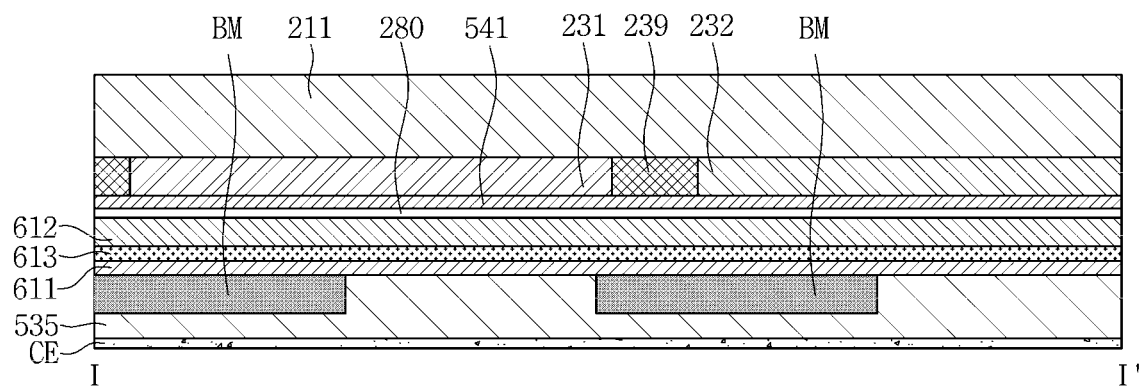

Referring to FIG. 31G, the common electrode CE is disposed on the insulating planarization layer 535. Accordingly, the opposing substrate 210 is provided.

Figure 31H:
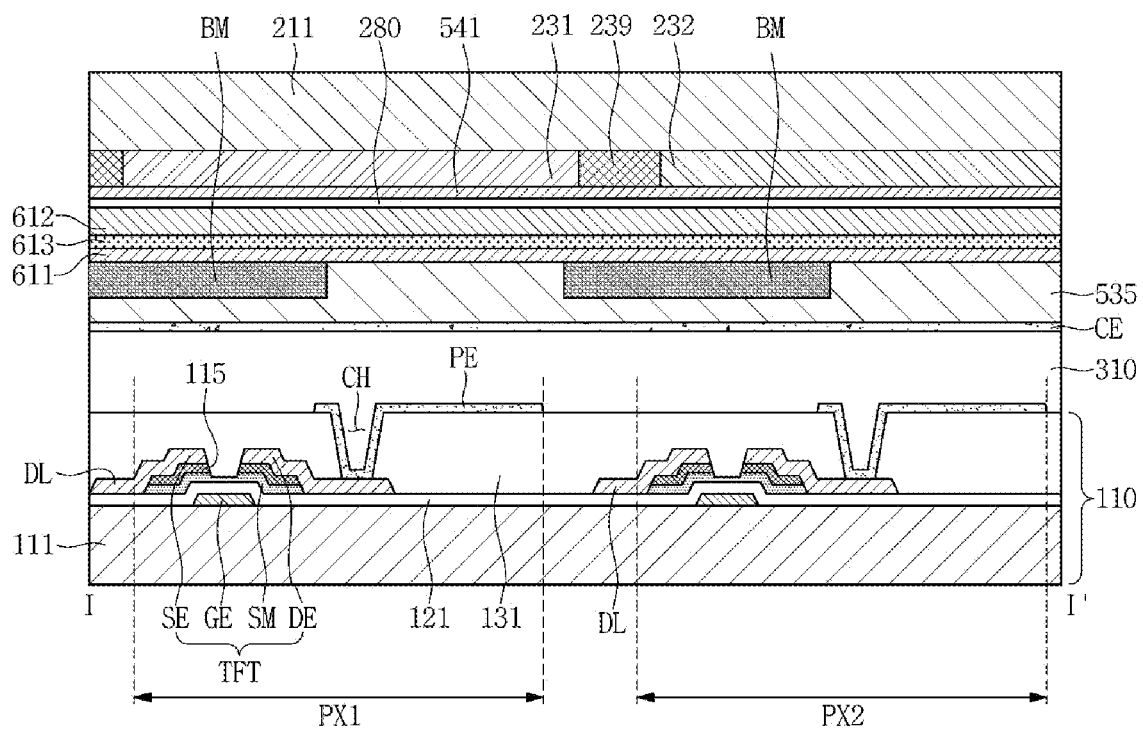

Referring to FIG. 31H, the opposing substrate 210 manufactured in the process of FIG. 31G is disposed to oppose the display substrate 110, and a liquid crystal layer which is the light amount control layer 310 is disposed between the opposing substrate 210 and the display substrate 110.

Subsequently, the second polarizer 520 is disposed on the display substrate 110 such that the display device 1020 illustrated in FIG. 29 is provided.

Figure 32:
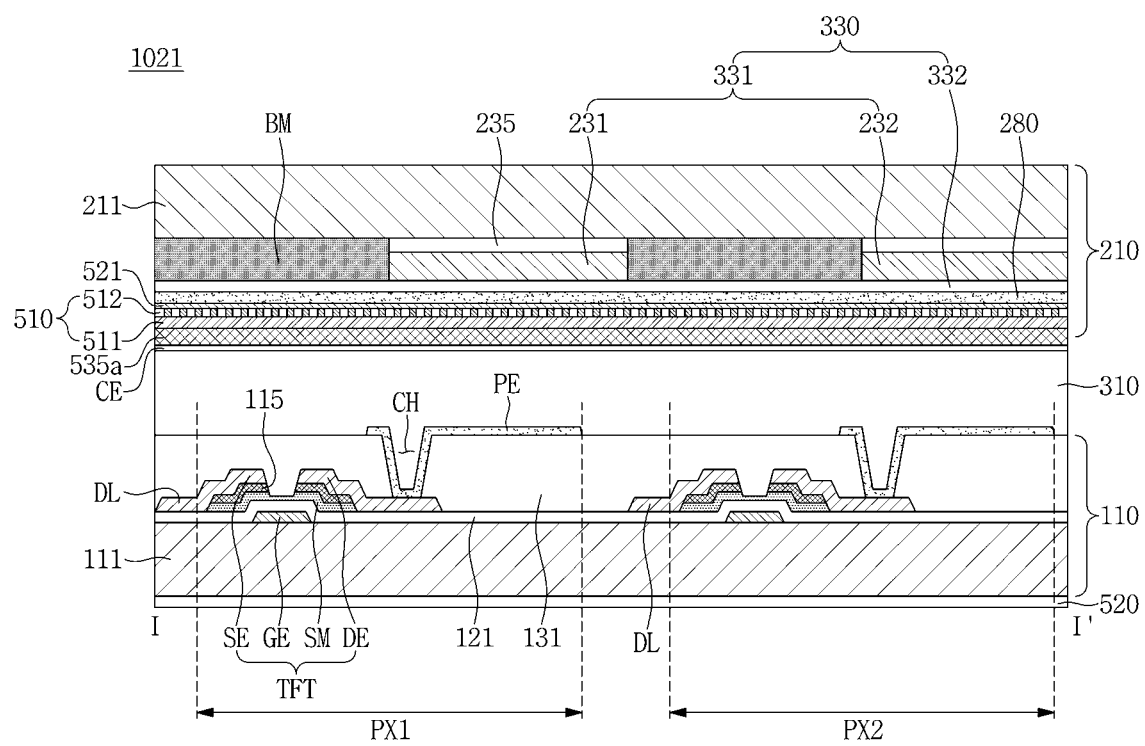
FIG. 32 is a cross-sectional view illustrating a display device according to a twenty-first exemplary embodiment.

FIG. 32 is a cross-sectional view illustrating a display device 1021 according to a twenty-first exemplary embodiment.

The display device 1021 according to the twenty-first exemplary embodiment includes a planarization layer 535a between a first polarizer 510 and a common electrode CE. The planarization layer 535a planarizes a bottom portion of the first polarizer 510. The planarization layer 535a may include an organic material such as acryl, polyimide, benzocyclobutene (BCB), or the like. Accordingly, with respect to a second substrate 211, the common electrode CE is disposed on the first polarizer 510. For example, the common electrode CE may be disposed on the planarization layer 535a.

An opposing substrate 210 may further include a yellow color filter 235. As illustrated in FIG. 32, the yellow color filter 235 is disposed between the second substrate 211 and a buffer layer 332. For example, the yellow color filter 235 may be disposed between the second substrate 211 and a color conversion portion 331 which includes a first color conversion portion 231 and a second color conversion portion 232. That is, the yellow color filter 235 may overlap the first color conversion portion 231 and the second color conversion portion 232. The yellow color filter 235 absorbs blue light and transmits red light and green light.

An adhesion layer 280 may be disposed between the buffer layer 332 and the first polarizer 510. For example, the adhesion layer 280 may be disposed between the buffer layer 332 and a first passivation layer 521 on the first polarizer 510. The adhesion layer 280 attaches the first polarizer 510 to the second substrate 211 on which the buffer layer 332 is disposed.

FIGS. 33A, 33B, 33C, 33D, 33E, and 33F are cross-sectional views illustrating a process of manufacturing the display device 1021 according to the twenty-first exemplary embodiment.

Figure 33A:
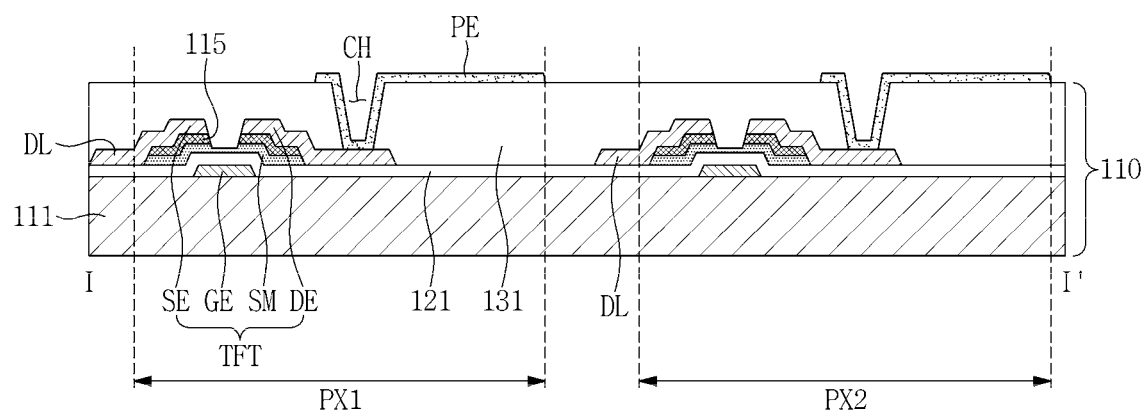
FIGS. 33A, 33B, 33C, 33D, 33E, and 33F are cross-sectional views illustrating a process of manufacturing the display device according to the twenty-first exemplary embodiment.

First, as illustrated in FIG. 33A, a display substrate 110 is manufactured.

In order to form the display substrate 110, a gate electrode GE and a gate line GL are formed on a first substrate 111 and a gate insulating layer 121 is disposed thereon.

Subsequently, a semiconductor layer SM is disposed on the gate insulating layer 121, and an ohmic contact layer 115 is disposed on the semiconductor layer SM.

In addition, a data line DL, a source electrode SE, and a drain electrode DE are disposed on the gate insulating layer 121.

A protection layer 131 is disposed over an entire surface of the first substrate 111 including the data line DL, the source electrode SE, and the drain electrode DE. A pixel electrode PE is disposed on the protection layer 131. The pixel electrode PE is connected to the drain electrode DE through a contact hole CH of the protection layer 131.

Figure 33B:
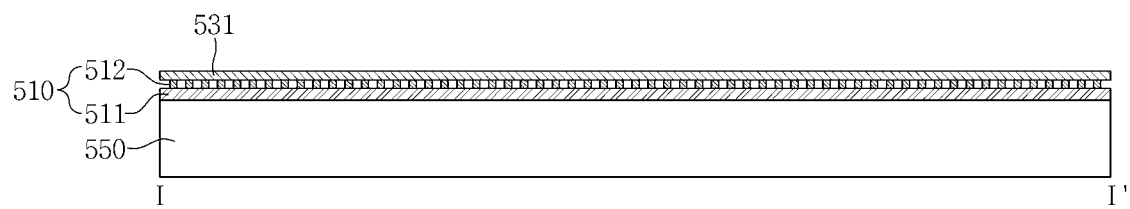

Referring to FIG. 33B, the first polarizer 510 is formed on a carrier substrate 550.

In order to form the first polarizer 510, a base substrate 511 is disposed on the carrier substrate 550. The base substrate 511 is a plastic substrate. For example, a high molecular weight resin is coated over the carrier substrate 550 and then cured such that the base substrate 511 may be formed. In an alternative exemplary embodiment, a base substrate 511 including a plastic substrate may be disposed on the carrier substrate 550. The plastic substrate may be a transparent substrate including one of polyamide, polyimide, polyethylene naphthalate, polyethylene terephthalate, and polyacryl, for example. In such an exemplary embodiment, an adhesive may be used to fix the base substrate 511 to the carrier substrate 550.

According to the twenty-first exemplary embodiment, as the base substrate is supported by the carrier substrate 550, the base substrate 511 may have excellent flatness.

As supported by the carrier substrate 550, the base substrate 511 having a small thickness may have a sufficient strength. Accordingly, a base substrate having a small thickness ranging from about 5 μm to about 50 μm may be used.

A linear polarizer 512 is formed on the base substrate 511 having a small thickness. The linear polarizer 512 may include aluminum (Al), gold (Au), silver (Ag), copper (Cu), chromium (Cr), iron (Fe), and/or nickel (Ni), for example. In order to form the linear polarizer 512, methods such as imprinting and photolithography may be employed.

The first passivation layer 531 is formed on the linear polarizer 512. The first passivation layer 531 protects the linear polarizer 512 and prevents permeation of undesirable materials into the linear polarizer 512.

Figure 33C:
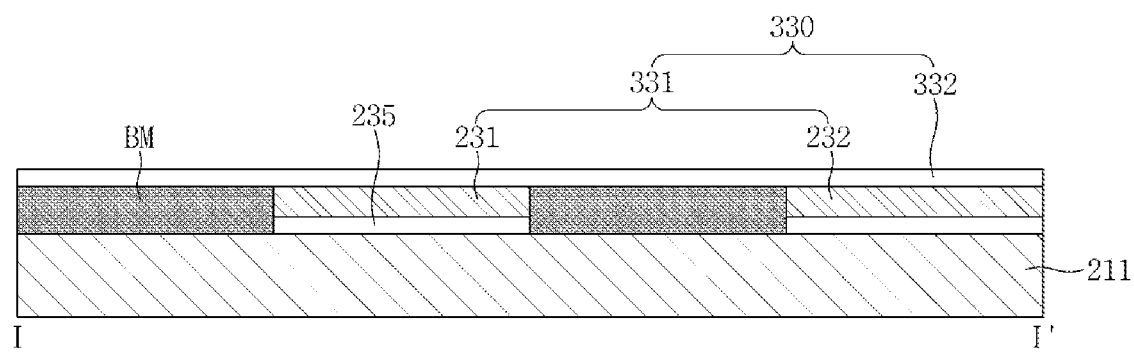

Referring to FIG. 33C, in a process of disposing a light blocking layer BM and a color conversion layer 330 on the second substrate 211, the yellow color filter 235 and the light blocking layer BM may be disposed on the second substrate 211, and then the color conversion portion 331 may be disposed on the yellow color filter 235. That is, the yellow color filter 235 is disposed to overlap the first color conversion portion 231 and the second color conversion portion 232. Subsequently, the buffer layer 332 is disposed on the light blocking layer BM and the color conversion portion 331.

The buffer layer 332 planarizes a step difference occurring by the color conversion portion 331 and the light blocking layer BM. The buffer layer 332 may include a light transmissive organic material.

The color conversion portion 331 includes the first color conversion portion 231 and the second color conversion portion 232. Each of the first color conversion portion 231 and the second color conversion portion 232 may be one of a red color conversion portion, a green color conversion portion, and a blue color conversion portion.

Although not illustrated, the color conversion layer 330 may include a third color conversion portion and may include a transmissive portion.

Figure 33D:
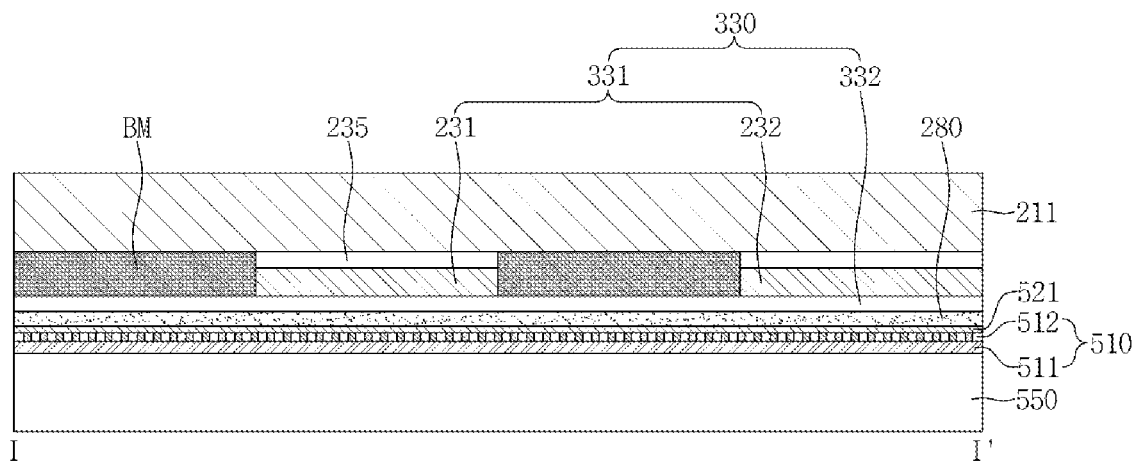

Referring to FIG. 33D, the second substrate 211 on which the buffer layer 332 is disposed is disposed on the first polarizer 510 and the first passivation layer 531. In order to attach the second substrate 211 including the buffer layer 332 to the first passivation layer 531, the adhesion layer 280 is disposed between the buffer layer 332 and the first passivation layer 531. The adhesion layer 280 may be an optically clear adhesive (OCA) having light transmittance.

Figure 33E:
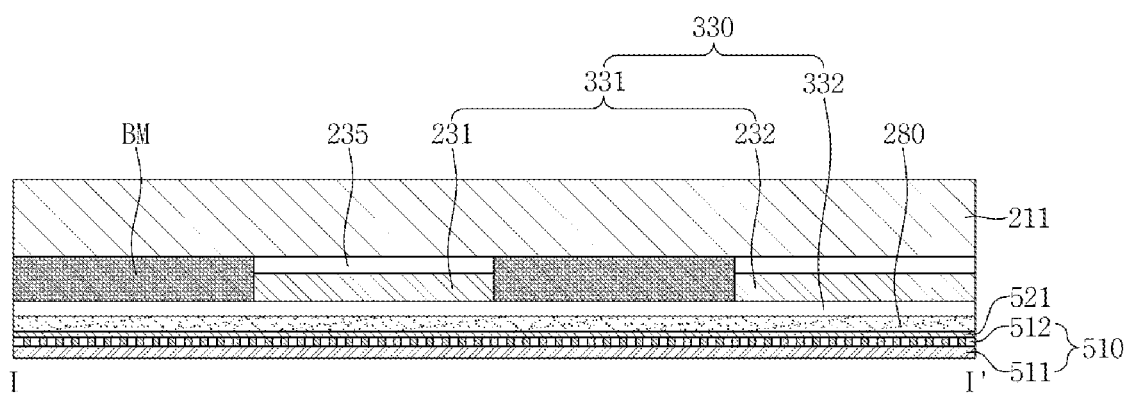

Referring to FIG. 33E, the carrier substrate 550 is removed. The carrier substrate 550 to be removed is detached from the base substrate 511 of the first polarizer 510.

In order to detach the carrier substrate 550 from the base substrate 511, laser may be irradiated thereto. Through laser irradiation, adhesion between the base substrate 511 and the carrier substrate 550 is degraded such that the carrier substrate 550 may be detached from the base substrate 511. In such an exemplary embodiment, a step difference may occur at a bottom portion of the base substrate 511.

Figure 33F:
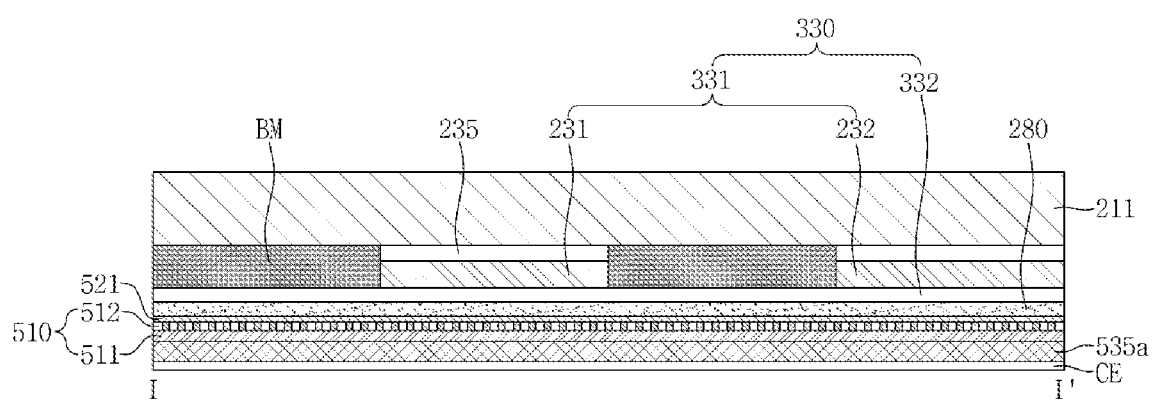

Referring to FIG. 33F, the planarization layer 535a may be disposed on the base substrate 511 of the first polarizer 510. The planarization layer 535a planarizes the step difference at the bottom portion of the base substrate 511. The planarization layer 535a may include an organic material such as acryl, polyimide, benzocyclobutene (BCB), or the like.

The common electrode CE is disposed on the planarization layer 535a. The common electrode CE may be formed through methods known in the pertinent art. Accordingly, the opposing substrate 210 may be provided.

Referring back to FIG. 32, the opposing substrate 210 manufactured in the process illustrated in FIG. 33F is disposed to oppose the display substrate 110, and a liquid crystal layer which is a light amount control layer 310 is disposed between the opposing substrate 210 and the display substrate 110. In an exemplary embodiment, the liquid crystal layer 310 may be disposed on the display substrate 110, and then the opposing substrate 210 may be disposed thereon.

Subsequently, a second polarizer 520 is disposed on the display substrate 110. For example, the second polarizer 520 may be disposed on a rear surface of the first substrate 111. The second polarizer 520 may be a linear polarizer such as polyvinyl alcohol (PVA).

Figure 34:
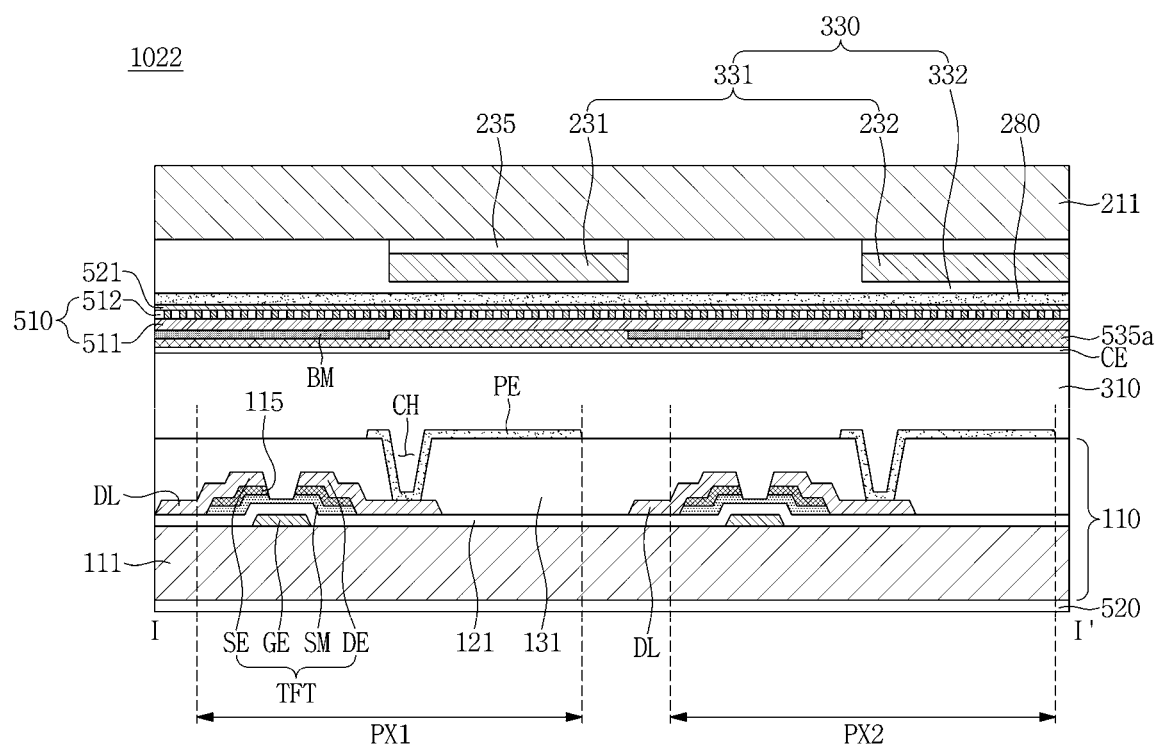
FIG. 34 is a cross-sectional view illustrating a display device according to a twenty-second exemplary embodiment.

FIG. 34 is a cross-sectional view illustrating a display device according to a twenty-second exemplary embodiment.

The display device according to the twenty-second exemplary embodiment includes a light blocking layer BM disposed between a first polarizer 510 and a planarization layer 535*a*.

The light blocking layer BM has a plurality of apertures, and the aperture is defined corresponding to each of pixel electrodes PE in first and second pixels PX1 and PX2. A color conversion portion 331 may be disposed corresponding to each pixel electrode PE. In other words, the light blocking layer BM may be disposed between adjacent color conversion portions 331 in a plan view. For example, the light blocking layer BM may be disposed between a first color conversion portion 231 and a second color conversion portion 232 in a plan view. The light blocking layer BM blocks light at an area other than the apertures. For example, the light blocking layer BM is disposed on thin film transistors TFT, a gate line GL, and a data line DL, thus blocking light transmitted through the thin film transistors TFT, the gate line GL, and the data line DL from being emitted outwards.

Figure 35:
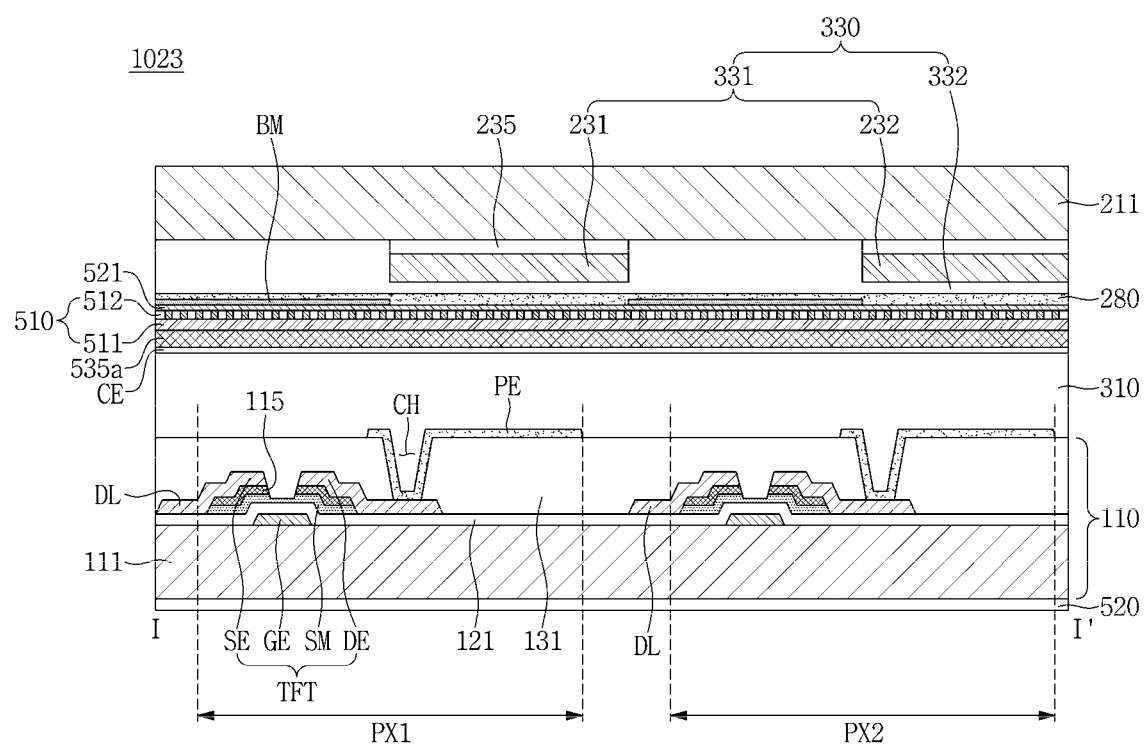
FIG. 35 is a cross-sectional view illustrating a display device according to a twenty-third exemplary embodiment.

FIG. 35 is a cross-sectional view illustrating a display device according to a twenty-third exemplary embodiment.

The display device according to the twenty-third exemplary embodiment includes a light blocking layer BM disposed between a buffer layer 332 and a first polarizer 510. For example, as illustrated in FIG. 35, the light blocking layer BM is disposed between an adhesion layer 280 and a first passivation layer 531. The light blocking layer BM has a plurality of apertures, and the aperture is defined corresponding to each of pixel electrodes PE in first and second pixels PX1 and PX2. A color conversion portion 331 may be disposed corresponding to each pixel electrode PE. In other words, the light blocking layer BM may be disposed between adjacent color conversion portions 331 in a plan view. For example, the light blocking layer BM may be disposed between a first color conversion portion 231 and a second color conversion portion 232 in a plan view. The light blocking layer BM blocks light at an area other than the apertures. For example, the light blocking layer BM is disposed on thin film transistors TFT, a gate line GL, and a data line DL, thus blocking light transmitted through the thin film transistors TFT, the gate line GL, and the data line DL from being emitted outwards.

Figure 36:
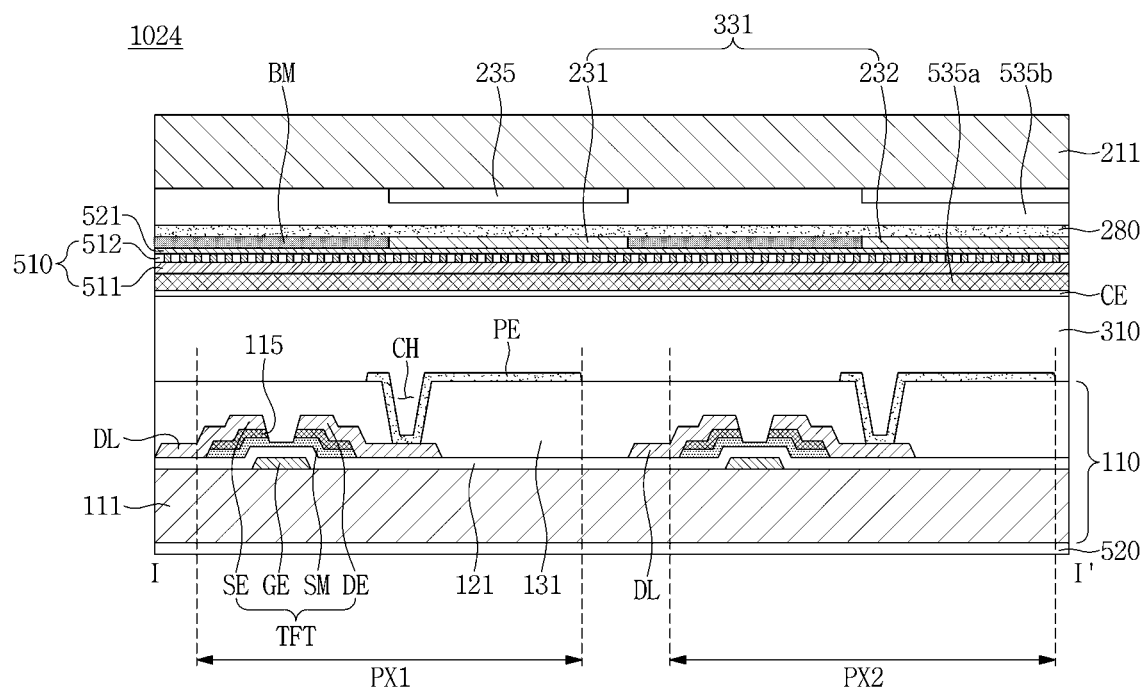
FIG. 36 is a cross-sectional view illustrating a display device according to a twenty-fourth exemplary embodiment.

FIG. 36 is a cross-sectional view illustrating a display device according to a twenty-fourth exemplary embodiment.

The display device according to the twenty-fourth exemplary embodiment may include a planarization layer 535, including a first planarization layer 535*a* and a second planarization layer 535*b*, and a color conversion portion 331, including a first color conversion portion 231, a second color conversion portion 232, and a transmissive portion (not illustrated).

As illustrated in FIG. 36, the first planarization layer 535*a* is disposed between a first polarizer 510 and a common electrode CE. The first planarization layer 535*a* disposed on a base substrate 511 planarizes a step difference at a bottom portion of the base substrate 511. The first planarization layer 535*a* may include an organic material such as acryl, polyimide, benzocyclobutene (BCB), or the like.

The second planarization layer 535*b* is disposed between a second substrate 211 and a color conversion portion 331. The second planarization layer 535*b* planarizes a step difference that occurs due to a yellow color filter 235. The second planarization layer 535*b* may include a light transmissive organic material.

The light blocking layer BM has a plurality of apertures, and the aperture is defined corresponding to each of pixel electrodes PE in first and second pixels PX1 and PX2. The color conversion portion 331 may be disposed corresponding to each pixel electrode PE. In other words, the light blocking layer BM may be disposed between adjacent color conversion portions 331 in a plan view. For example, the light blocking layer BM may be disposed between the first color conversion portion 231 and the second color conversion portion 232 in a plan view. The light blocking layer BM blocks light at an area other than the apertures. For example, the light blocking layer BM is disposed on thin film transistors TFT, a gate line GL, and a data line DL, thus blocking light transmitted through the thin film transistors TFT, the gate line GL, and the data line DL from being emitted outwards.

According to the twenty-fourth exemplary embodiment, the color conversion portion 331 is disposed between the second planarization layer 535*b* and the first polarizer 510. For example, as illustrated in FIG. 36, the first color conversion portion 231 and the second color conversion portion 232 may be disposed between the second planarization layer 535*b* and the first polarizer 510. However, exemplary embodiments are not limited thereto, and at least one of the first color conversion portion 231, the second color conversion portion 232, and the transmissive portion may be disposed between the second substrate 211 and the second planarization layer 535*b*.

As set forth above, according to one or more exemplary embodiments, a display device includes a polarizer having a small thickness and thus may display images without color mixture.

Further, according to one or more exemplary embodiments, a polarizer is formed on a carrier substrate and thus a polarizer having a small thickness may be formed.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:
1. A display device comprising:
 a display substrate;
 an opposing substrate opposing the display substrate; and
 a light amount control layer disposed between the display substrate and the opposing substrate,
 wherein the display substrate comprises:
  a first substrate;
  a thin film transistor disposed on the first substrate; and
  a pixel electrode connected to the thin film transistor,
 wherein the opposing substrate comprises:
  a second substrate;
  a color conversion layer disposed on the second substrate; and
  a first polarizer disposed on the color conversion layer,
 wherein the first polarizer comprises:
  a base substrate; and
  a linear polarizer disposed on one surface of the base substrate,
 wherein the first polarizer opposes the pixel electrode,
 wherein a first edge of the color conversion layer overlaps the linear polarizer, and
 wherein a second edge of the color conversion layer does not overlap the linear polarizer.
2. The display device as claimed in claim 1, wherein the thickness of the base substrate is in a range from about 0.8 μm to 35 μm, and wherein the one surface of the base substrate on which the linear polarizer is disposed has a flatness of about 60 nm or less.

3. The display device as claimed in claim 1, wherein the base substrate is a plastic substrate.

4. The display device as claimed in claim 1, further comprising a dichroic reflection layer disposed between the color conversion layer and the base substrate.

5. The display device as claimed in claim 1, further comprising an adhesion layer disposed between the second substrate and the color conversion layer.

6. The display device as claimed in claim 1, further comprising an adhesion layer disposed between the color conversion layer and the first polarizer.

7. The display device as claimed in claim 1, wherein the linear polarizer is a wire grid polarizer (WGP).

8. The display device as claimed in claim 1, wherein the linear polarizer comprises polyvinyl alcohol (PVA).

9. The display device as claimed in claim 1, wherein the color conversion layer comprises a fluorescent element.

10. The display device as claimed in claim 1, wherein the color conversion layer comprises quantum dots.

11. The display device as claimed in claim 1, wherein the color conversion layer comprises:
    a red color conversion portion comprising a red fluorescent element; and
    a green color conversion portion comprising a green fluorescent element.

12. The display device as claimed in claim 11, further comprising a yellow color filter on the red color conversion portion and the green color conversion portion.

13. The display device as claimed in claim 1, further comprising a passivation layer disposed between the base substrate and the linear polarizer.

14. The display device as claimed in claim 1, further comprising a second polarizer disposed on the display substrate.

15. The display device as claimed in claim 1, wherein the light amount control layer is a liquid crystal layer.

16. The display device as claimed in claim 1, wherein the opposing substrate further comprises a light blocking layer.

17. The display device as claimed in claim 16, wherein the light blocking layer is disposed between the base substrate and the second substrate.

18. The display device as claimed in claim 16, wherein the light blocking layer is disposed between the base substrate and the light amount control layer.

19. A method of manufacturing a display device, the method comprising:
    forming a display substrate;
    forming a first polarizer; and
    disposing the first polarizer and the display substrate to oppose each other,
    wherein the forming a display substrate comprises:
    forming a thin film transistor on a first substrate; and
    forming a pixel electrode on the first substrate, the pixel electrode connected to the thin film transistor,
    wherein the forming a first polarizer comprises:
    forming a base substrate on a carrier substrate; and
    forming a first linear polarizer on the base substrate, and
    disposing a color conversion layer on the first polarizer,
    wherein the disposing the first polarizer and the display substrate to oppose each other includes removing the carrier substrate from the base substrate,
    wherein a first edge of the color conversion layer overlaps one of the first linear polarizer, and
    wherein a second edge of the color conversion layer does not overlap the first linear polarizer.

20. The method as claimed in claim 19, wherein the base substrate is a plastic substrate.

21. The method as claimed in claim 19, wherein the removing the carrier substrate from the base substrate includes detaching the carrier substrate from the base substrate, and wherein the base substrate has a thickness in a range from about 0.8 μm to about 50 μm.

22. The method as claimed in claim 19,
    wherein the disposing the color conversion layer on the first polarizer is accomplished before disposing the first polarizer and the display substrate to oppose each other.

23. The method as claimed in claim 19, wherein the disposing the color conversion layer on the first polarizer is accomplished after removing the carrier substrate.

24. The method as claimed in claim 19, wherein the removing the carrier substrate from the base substrate is performed after the first linear polarizer has been positioned between the carrier substrate and a light blocking layer.

25. The method as claimed in claim 19, wherein a thickness of the carrier substrate is greater than a thickness of the base substrate.

26. A method of manufacturing a display device, the method comprising:
    forming a display substrate;
    forming a first polarizer on a carrier substrate;
    forming a color conversion layer on the first polarizer;
    disposing a second substrate on the color conversion layer;
    removing the carrier substrate from the first polarizer;
    forming a common electrode on the first polarizer to form an opposing substrate; and
    disposing the opposing substrate to oppose the display substrate,
    wherein the forming a first polarizer comprises:
    forming a base substrate on the carrier substrate; and
    forming a linear polarizer on the base substrate,
    wherein a first edge of the color conversion layer overlaps the linear polarizer, and
    wherein a second edge of the color conversion layer does not overlap the linear polarizer.

27. The method as claimed in claim 26, wherein the base substrate is a plastic substrate.

28. The method as claimed in claim 26, wherein the removing the carrier substrate from the first polarizer includes detaching the carrier substrate from the first polarizer, and wherein the base substrate has a thickness in a range from about 0.8 μm to about 50 μm.

29. The method as claimed in claim 26, wherein the forming a display substrate comprises:
    disposing a thin film transistor on a first substrate; and
    forming a pixel electrode on the first substrate, the pixel electrode connected to the thin film transistor.

30. The method as claimed in claim 26, further comprising:
    disposing a dichroic reflection layer on the first polarizer before forming the color conversion layer on the first polarizer.

31. The method as claimed in claim 30, further comprising:
    forming a first passivation layer on the first polarizer before disposing the dichroic reflection layer on the first polarizer.

32. The method as claimed in claim 26, further comprising:
    disposing a dichroic reflection layer on the base substrate before disposing the linear polarizer on the base substrate.

33. The method as claimed in claim 26, wherein the disposing a second substrate on the color conversion layer further comprises:
   disposing an adhesion layer between the color conversion layer and the second substrate.

34. The method as claimed in claim 26, wherein the forming a color conversion layer comprises:
   forming a red color conversion portion comprising a red fluorescent element and a green color conversion portion comprising a green fluorescent element on the first polarizer.

35. The method as claimed in claim 26, further comprising forming a yellow color filter on the red color conversion portion and the green color conversion portion.

36. The method as claimed in claim 26, wherein the forming a color conversion layer further comprises forming a light blocking layer.

37. The method as claimed in claim 26, wherein removing the carrier substrate from the first polarizer is performed after the first polarizer has been positioned between the carrier substrate and the color conversion layer.

* * * * *